(12) United States Patent
Al-Turki et al.

(10) Patent No.: US 10,184,320 B2
(45) Date of Patent: Jan. 22, 2019

(54) SYSTEMS, METHODS, AND COMPUTER MEDIUM TO ENHANCE HYDROCARBON RESERVOIR SIMULATION

(71) Applicant: Saudi Arabian Oil Company, Dhahran (SA)

(72) Inventors: Ali Al-Turki, Dhahran (SA); Majdi Baddourah, Dhahran (SA); M. Ehtesham Hayder, Dhahran (SA); Ahmed Al-Zawawi, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 768 days.

(21) Appl. No.: 14/474,963

(22) Filed: Sep. 2, 2014

(65) Prior Publication Data

US 2016/0061008 A1    Mar. 3, 2016

(51) Int. Cl.
*G06G 7/48* (2006.01)
*G06G 7/50* (2006.01)
(Continued)

(52) U.S. Cl.
CPC .............. *E21B 43/00* (2013.01); *G06F 9/485* (2013.01); *G06F 17/5009* (2013.01); *G06F 2209/482* (2013.01)

(58) Field of Classification Search
CPC ....... E21B 43/00; G06F 9/485; G06F 17/5009
(Continued)

(56) References Cited

U.S. PATENT DOCUMENTS 5,757,678 A    5/1998  Leeke
5,801,958 A    9/1998  Dangelo et al.
(Continued)

FOREIGN PATENT DOCUMENTS

WO    2011100002 A1    8/2011

OTHER PUBLICATIONS

Cao et al., "Direct execution simulation of load balancing algorithms with real workload distribution", Journal of Systems and Software, Elsevier Science Inc., vol. 54, No. 3, Oct. 19, 2000, pp. 227-237, XP002527460.
(Continued)

*Primary Examiner* — Andre Pierre Louis
(74) *Attorney, Agent, or Firm* — Bracewell LLP; Constance G. Rhebergen; Brian H. Tompkins

(57) ABSTRACT

Embodiments of systems, non-transitory computer-readable medium having one or more computer programs stored therein, and computer-implemented methods are provided to enhance hydrocarbon reservoir simulation for a plurality of hydrocarbon reservoirs. According to embodiments, a plurality of fluid flow simulation runs in each of a plurality of hydrocarbon reservoirs are initiated. Then, each of a first set of one or more of the plurality of simulation runs are terminated while each of a second set of one or more of the plurality of simulation runs continue. Terminating each of the first set of simulation runs can increase processing availability within a collective limited and predetermined combined computing capacity of one or more processors to another one or more of the plurality of simulation runs being run. Consequently, terminating each of the first set of simulation runs can thereby reduce total hydrocarbon reservoir simulation run time.

48 Claims, 13 Drawing Sheets

(51) Int. Cl.
*E21B 43/00* (2006.01)
*G06F 17/50* (2006.01)
*G06F 9/48* (2006.01)

(58) Field of Classification Search
USPC ...................................................... 703/9, 10
See application file for complete search history.

(56) References Cited

U.S. PATENT DOCUMENTS

| | | | |
|---|---|---|---|
| 5,905,657 | A | 5/1999 | Celniker |
| 6,425,762 | B1 | 7/2002 | Ernst |
| 6,820,074 | B1 | 11/2004 | Simpson |
| 6,907,392 | B2 | 6/2005 | Bennis et al. |
| 7,451,066 | B2 | 11/2008 | Edwards et al. |
| 7,640,149 | B2 | 12/2009 | Rowan et al. |
| 7,657,406 | B2 | 2/2010 | Tolone et al. |
| 8,224,636 | B2 | 7/2012 | Kundert |
| 8,335,677 | B2 | 12/2012 | Yeten et al. |
| 8,401,832 | B2 | 3/2013 | Ghorayeb et al. |
| 2002/0120429 | A1 | 8/2002 | Ortoleva |
| 2006/0179438 | A1 | 8/2006 | Jackson |
| 2012/0191433 | A1* | 7/2012 | Heidari ................. G01V 99/00 703/10 |
| 2013/0046524 | A1* | 2/2013 | Gathogo ................. G01V 1/282 703/6 |
| 2014/0257706 | A1* | 9/2014 | Biterge ................. G01V 3/38 702/13 |
| 2015/0204174 | A1* | 7/2015 | Kresse ................. E21B 43/26 166/250.01 |

OTHER PUBLICATIONS

Holden, M.J.. "A Load Balancing Strategy for Oil Reservoir Modelling", The University of Edinburgh, Sep. 10, 2004, 109 pages, XP055239777.

International Search Report and Written Opinion for related International Application No. PCT/US2015/048074 dated Jan. 21, 2016.

* cited by examiner

| Simulation Run Termination Error Tolerance | Number of Runs Stopped |
|---|---|
| 10 | 21 |
| 20 | 1 |
| 25 | 1 |
| 30 | 1 |

FIG. 8b

| Simulation Run Termination Error Tolerance | Number of Runs Stopped |
|---|---|
| 10 | 45 |
| 20 | 32 |
| 25 | 27 |
| 30 | 21 |

FIG. 8a

SYSTEMS, METHODS, AND COMPUTER MEDIUM TO ENHANCE HYDROCARBON RESERVOIR SIMULATION

BACKGROUND OF THE INVENTION

Field of the Invention

Embodiments of the invention relate to hydrocarbon reservoir production and, more specifically, to methods, systems, and non-transitory computer-readable medium having computer program stored therein to enhance hydrocarbon reservoir simulation for a plurality of hydrocarbon reservoirs.

Background of the Invention

Hydrocarbon reservoir simulation models may be constructed to provide information related to fluid flow and other features within real hydrocarbon reservoirs. Simulations of fluid flow, for example, may then be performed on the models. In some circumstances, multiple simulation runs may be performed on a single hydrocarbon reservoir simulation model. Among other advantages, performing multiple simulation runs may, for example, increase confidence in the results of the simulation runs and thereby increase the value of the results during analysis of the hydrocarbon reservoir. A simulation run is typically scheduled to run for one or more time steps—defined periods of time—as understood by those of skill in the art. Multiple simulation runs performed as part of the same project may sometimes be described collectively as a simulation study.

Hydrocarbon reservoir simulation may include both user interaction 51 and simulator action 52, as illustrated in FIG. 2a, for example. User interaction 51, for example, may include loading and investigating historical data related to the subject hydrocarbon reservoir 53. Historical data may include, for example, actual measured data related to the hydrocarbon reservoir, i.e., measurements and observations collected during exploration of and production from the hydrocarbon reservoir. Simulator action 52 may then take control of the hydrocarbon reservoir simulation process. For example, simulator action 52 may include starting a simulation run 54, outputting time step data 55 for a time step of the simulation run to produce time step data 56, and determining whether the time step was the last time step to be performed 57. If the time step was not the last time step to be performed 57, simulator action 52 may then include continuing the simulation run 58 for another time step and subsequently outputting time step data 55. If the time step was the last time step to be performed 57, however, simulator action 52 may then include wrapping up the simulation run 59 to produce output data 60. Simulator action may then include determining whether the simulator has more simulation runs (sometimes called "simulation cases" or "simulation jobs") to perform 61. If so, simulator action 52 may then include picking the next simulation run 62 then starting that simulation run 54. If the simulator does not have any more simulation runs to perform 61, it may complete the simulation process 63.

Hydrocarbon reservoir simulation may include at least two important types of simulations of fluid flow in a hydrocarbon reservoir: (1) history-matching simulations and (2) prediction (or predictive) simulations. History-matching simulations may serve to validate a model of the subject hydrocarbon reservoir by producing a variety of simulated hydrocarbon fluid flow data. That simulated hydrocarbon fluid flow data may then be compared to historical, observed data from the real hydrocarbon reservoir. That is, history-matching simulations may calibrate a hydrocarbon reservoir model to minimize any mismatch between the model and the reservoir and to build confidence in the model. Prediction simulations, on the other hand, may produce data related to predicted future hydrocarbon fluid flow. That is, engineers may use prediction simulations to answer questions of what will happen under different possible development scenarios. In some circumstances, prediction simulations may be part of an optimization problem, and a simulation engineer may perform multiple simulation runs with outcomes in a valid solution space to select the simulation run most closely aligned with a development goal. Multiple prediction simulation runs may therefore be used to fine tune development strategies to achieve objectives related to development of a hydrocarbon reservoir, for example. Higher quality hydrocarbon reservoir simulation models may be desirable because they may produce more accurate predictions. Notably, history-matching simulations may affect prediction simulations, though, because history-matching simulations may be used to improve the quality of a hydrocarbon reservoir simulation model later used for prediction simulations. Consequently, history matching may be an important part of hydrocarbon reservoir simulation.

Further, history matching is an optimization problem. One of the main objectives of history matching, for example, may be to validate a numerical hydrocarbon reservoir simulation model by minimizing the differences between the numerical solution—the simulator output—and field historical pressure, production, and injection data. This validation process may lead to better management and quantification of uncertainties in a simulation model. Ultimately, the history-matched numerical model may be used for prediction studies and hydrocarbon field development evaluations. FIG. 2b illustrates an example history-matching method according to the prior art. As illustrated in FIG. 2b, for example, a geological model 71 may be upscaled 72 to a simulation model 73. A fluid flow simulation 74 may then be performed. Using production data 75, whether an objective function has been met may be determined 76. An objective function of a simulation study may be the objective, i.e., the goal, of the study in terms of output. An objective function of a prediction study, for instance, may be to maximize oil production, in some circumstances. As another example, an objective function of a history-matching study may be to develop a hydrocarbon reservoir simulation model that closely approximates the characteristics of the real hydrocarbon reservoir it models. Consequently, an objective function may relate to the difference between simulation output data—output of a fluid flow simulation 74, i.e., fluid flow simulation results—and production data 75, for example. More specifically, an objective function may be used to determine whether an acceptable match has been reached between fluid flow simulation results and historical, observed data, i.e., actual measured data. Furthermore, a match may be determined based on some predefined acceptance criteria. An objective function determination may be "yes" when an acceptable match has been reached, e.g., when the difference between the output of a fluid flow simulation 74 and production data 75 is below a preselected level. Conversely, an objective function determination may be "no" when the difference between the output of a fluid flow simulation 74 and production data 75 is above a preselected level, for example. As depicted in FIG. 2b, for instance, if the objective function has been met 76, the method may stop 78. If the objective function has not been met 76, manual optimization 77 may occur and feed back into the simulation model 73.

In contrast to manual history-matching processes, Assisted History Matching (AHM) automates the optimization process using state-of-the-art, proven optimization algorithms. AHM is a class of simulation problems that allows reservoir simulation engineers to change many parameters simultaneously, automate processes, and be able to better document different history-matching scenarios. A history-matching process using AHM is illustrated, for example, in FIG. 2c. As illustrated in FIG. 2c, for example, a geological model 81 may be upscaled 82 to produce a simulation model 83. A fluid flow simulation 84 may then be performed on the simulation model 83. Then, using production data 85 as input, whether an objective function has been met may be determined 86. If the objective function has been met 86, the process may stop 88. If the objective function has not been met 86, an assisted optimization process 87 may begin and feed back into the geological model 81.

SUMMARY OF THE INVENTION

History matching—even assisted history matching—still has several significant disadvantages, however. For example, assisted history matching can be very time intensive. In some circumstances, for instance, assisted history matching can occupy more than half of hydrocarbon reservoir simulation engineers' time and efforts. In addition, continued use of conventional practices, such as manual or assisted history matching, is increasingly impractical because hydrocarbon reservoir simulation models are ever-growing in size and complexity. Furthermore, hydrocarbon reservoir simulation projects continue to run on increasingly shorter timelines. At least one significant problem associated with history matching, moreover, is that it can require many simulation runs to produce meaningful results. In fact, hundreds of simulation runs can be submitted in some cases for a single assisted history-matching process. Performing many simulation runs can therefore require a great deal of time and computing resources. Consequently, the benefits and advantages of history matching are often counteracted by its demands for large quantities of time and resources.

Likewise, prediction simulation can have a variety of disadvantages. Prediction simulations can also be very time intensive, for example, while nevertheless being part of projects with short timelines. Further, prediction simulations can also use a significant amount of an entity's resources. For example, an entity in some cases can use prediction simulations to investigate potential courses of action to develop a hydrocarbon reservoir. To aid in its investigation, the entity can perform one or more prediction simulation runs for each option of the potential courses of action. Consequently, when the entity is considering many options, many prediction simulation runs can be performed. Similarly to history matching, prediction simulations can thus require large quantities of time and resources.

Having recognized problems and sources of the problems associated with, for example, history matching and prediction simulations, and further having recognized solutions to those problems, Applicants disclose herein embodiments of systems, non-transitory computer-readable medium having one or more computer programs stored therein, and computer-implemented methods to enhance hydrocarbon reservoir simulation for a plurality of hydrocarbon reservoirs.

For example, an embodiment of the invention can include a system to enhance hydrocarbon reservoir simulation for a plurality of hydrocarbon reservoirs. A system according to an embodiment of the invention can include one or more processors collectively having a limited and predetermined combined computing capacity. The limited and predetermined combined computing capacity, for example, can be available responsive to simulation run usage. A system can also include one or more input and output units in communication with the one or more processors and non-transitory memory medium in communication with one or more of the one or more processors. The memory medium, for example, can have computer-readable instructions stored therein. Further, when the computer-readable instructions are executed, they can cause the system to perform a series of steps.

The steps, according to some embodiments, can include initiating, for each of the plurality of hydrocarbon reservoirs, each of a plurality of fluid flow simulation runs, for example. The plurality of fluid flow simulation runs can be configured to calibrate one or more hydrocarbon reservoir simulation models associated with the respective each of the plurality of hydrocarbon reservoirs. Consequently, the plurality of fluid flow simulation runs can thereby define a plurality of history-matching simulation runs. Each of the plurality of history-matching simulation runs can be configured to operate for a respective preselected time period, and each respective preselected time period can include one or more time steps. Further, each of the plurality of history-matching simulation runs also can be configured to output a simulation data set responsive to operation of the respective history-matching simulation run after each of the one or more time steps. Each simulation data set can include one or more simulation data values. The respective each of the plurality of hydrocarbon reservoirs can have a plurality of hydrocarbon wells, and the plurality of hydrocarbon wells can collectively define a hydrocarbon field within the respective each of the plurality of hydrocarbon reservoirs. Each of the one or more simulation data values can be configured to be associated with one of the plurality of hydrocarbon wells.

The steps that the system performs when the computer-readable instructions are executed can further include terminating, for each of the plurality of hydrocarbon reservoirs, each of a first set of one or more of the plurality of history-matching simulation runs earlier than the completion of the respective preselected time period. Termination of the first set of history-matching simulation runs can be responsive to output after a time step when each of the first set of history-matching simulation runs has a simulation error measurement for the hydrocarbon field exceeding a predetermined simulation run termination error tolerance. Further, termination of the first set of history-matching simulation runs can be while continuing a second set of another one or more of the plurality of history-matching simulation runs. Each of the second set of history-matching simulation runs can lack a simulation error measurement for the hydrocarbon field that exceeds the predetermined simulation run termination error tolerance. Further, the predetermined simulation run termination error tolerance can be related to preselected values of one or more threshold variables.

In addition, according to another embodiment, for example, each of the first set of history-matching simulation runs can be terminated when more than a predetermined number of hydrocarbon wells in each of the first set of history-matching simulation runs each has a simulation error measurement for the hydrocarbon well exceeding a predetermined well termination error tolerance. In that example, each of the second set of history-matching simulation runs—which the system continues—has fewer than the predetermined number of hydrocarbon wells that each has a simulation error measurement for the hydrocarbon well exceeding the predetermined well termination error tolerance. The predetermined number of hydrocarbon wells and the predetermined well termination error tolerance can be related, for example, to preselected values of one or more threshold variables.

In both exemplary embodiments, the limited and predetermined combined computing capacity can be configured to have increased processing availability when the first set of history-matching simulation runs are terminated. Consequently, termination of the first set of history-matching simulation runs can thereby increase processing availability for fluid flow simulation runs within the limited and predetermined combined computing capacity to another one or more fluid flow simulation runs being run and reduce total hydrocarbon reservoir simulation run time.

For example, each of the second set of history-matching simulation runs can operate simultaneously with another one or more of the second set of history-matching simulation runs after termination of each of the first set of history-matching simulation runs. Further, the plurality of history-matching simulation runs for each of the plurality of hydrocarbon reservoirs can include a predetermined number of history-matching simulation runs, and a sum of the predetermined numbers of history-matching simulation runs of the plurality of hydrocarbon reservoirs can define a predetermined total number of history-matching simulation runs. Additionally, completion of the predetermined total number of history-matching simulation runs can be scheduled to require a predetermined amount of time to thereby define a total expected completion time. Termination of the first set of history-matching simulation runs for each of the plurality of hydrocarbon reservoirs can advantageously cause operation of the predetermined total number of history-matching simulation runs to conclude earlier than the end of the total expected completion time.

In some systems according to an embodiment of the invention, the instructions in the non-transitory memory medium, when executed, can further cause the system to perform additional steps. For example, additional steps can include initiating, responsive to termination of a history-matching simulation run, another different history-matching simulation run by use of one or more of the one or more processors having increased processing availability responsive to the termination of the history-matching simulation run to thereby enable earlier initiation of the other history-matching simulation run. Further, the plurality of history-matching simulation runs can be configured to calibrate the one or more hydrocarbon reservoir simulation models associated with the respective each of the plurality of hydrocarbon reservoirs by comparison to a plurality of actual measured reservoir characteristic values for the respective each of the plurality of hydrocarbon reservoirs. In addition, a simulation error measurement for the hydrocarbon field for a history-matching simulation run after a time step can be determined responsive to a comparison of the one or more simulation data values of the simulation data set associated with the history-matching simulation run after the time step and one or more of the plurality of actual measured reservoir characteristic values for the respective each of the plurality of hydrocarbon reservoirs. Likewise, a simulation error measurement for the hydrocarbon well for a history-matching simulation run after a time step can be determined responsive to a comparison of the one or more simulation data values of the simulation data set associated with the history-matching simulation run after the time step and one or more of the plurality of actual measured reservoir characteristic values for the respective each of the plurality of hydrocarbon reservoirs.

A system to enhance hydrocarbon reservoir simulation for a plurality of hydrocarbon reservoirs according to yet another embodiment, for example, can include one or more processors collectively having a limited and predetermined combined computing capacity. The limited and predetermined combined computing capacity can be available responsive to simulation run usage. A system can also include one or more input and output units in communication with the one or more processors, as well as non-transitory memory medium in communication with one or more of the one or more processors. The memory medium can have computer-readable instructions stored therein that when executed cause the system to perform a series of steps. The steps can include, for example, initiating, for each of the plurality of hydrocarbon reservoirs, each of a plurality of fluid flow simulation runs. The plurality of fluid flow simulation runs can be configured to predict future behavior of the respective each of the plurality of hydrocarbon reservoirs. Consequently, the plurality of fluid flow simulation runs can thereby define a plurality of prediction simulation runs. Each of the plurality of prediction simulation runs can be configured to operate for a respective preselected time period, and each respective preselected time period can include one or more time steps. Each of the plurality of prediction simulation runs also can be configured to output a simulation data set responsive to operation of the respective prediction simulation run after each of the one or more time steps. Each simulation data set can include one or more simulation data values. The respective each of the plurality of hydrocarbon reservoirs can have a plurality of hydrocarbon wells, and each of the one or more simulation data values can be configured to be associated with one of the plurality of hydrocarbon wells.

The steps can also include terminating, for each of the plurality of hydrocarbon reservoirs, each of a first set of one or more of the plurality of prediction simulation runs earlier than the completion of the respective preselected time period, for example. Termination of the first set of prediction simulation runs can be responsive to output after a time step when one or more of the one or more simulation data values of the simulation data set associated with each of the first set of prediction simulation runs after the time step are outside of a simulation data values termination tolerance. Further, termination of the first set of prediction simulation runs can be while continuing a second set of another one or more of the plurality of prediction simulation runs. Each of the one or more simulation data values of the simulation data set associated with each of the second set of prediction simulation runs after the time step can be included within the simulation data values termination tolerance. Further, the simulation data values termination tolerance can be related to preselected values of one or more threshold variables. Additionally, the limited and predetermined combined computing capacity can be configured to have increased processing availability when the first set of prediction simulation runs are terminated. Termination of the first set of prediction simulation runs can thereby increase processing availability for fluid flow simulation runs within the limited and predetermined combined computing capacity to another one or more fluid flow simulation runs being run and reduce total hydrocarbon reservoir simulation run time.

In some circumstances, each of the second set of prediction simulation runs can operate simultaneously with another one or more of the second set of prediction simulation runs after termination of each of the first set of prediction simulation runs. Additionally, the plurality of prediction simulation runs for each of the plurality of hydrocarbon reservoirs can include a predetermined number of prediction simulation runs. A sum of the predetermined numbers of prediction simulation runs of the plurality of hydrocarbon reservoirs can define a predetermined total number of prediction simulation runs. Further, completion of the predetermined total number of prediction simulation runs can be scheduled to require a predetermined amount of time to thereby define a total expected completion time. Termination of the first set of prediction simulation runs for each of the plurality of hydrocarbon reservoirs can advantageously cause operation of the predetermined total number of prediction simulation runs to conclude earlier than the end of the total expected completion time.

In addition, the plurality of prediction simulation runs can be configured to predict future behavior of the respective each of the plurality of hydrocarbon reservoirs by use of one or more hydrocarbon reservoir simulation models associated with the respective each of the plurality of hydrocarbon reservoirs. The one or more hydrocarbon reservoir models can be calibrated by use of a plurality of actual measured reservoir characteristic values to thereby define one or more calibrated hydrocarbon reservoir simulation models. Further, each of the plurality of prediction simulation runs can be associated with a future course of action to develop the respective each of the plurality of hydrocarbon reservoirs associated with the respective prediction simulation run to thereby define a development strategy. The preselected values of one or more threshold variables and the simulation data values termination tolerance can also be associated with one or more preselected strategic outcome values of one or more development strategies.

An embodiment of the invention can also include, for example, non-transitory computer-readable medium having one or more computer programs stored therein operable by one or more processors to enhance hydrocarbon reservoir simulation for a plurality of hydrocarbon reservoirs. Further, the one or more computer programs can include a set of instructions that, when executed by the one or more processors, cause the one or more processors to perform a series of operations. Operations can include, for example, initiating, for each of the plurality of hydrocarbon reservoirs, each of a plurality of fluid flow simulation runs. The plurality of fluid flow simulation runs can be configured to calibrate one or more hydrocarbon reservoir simulation models associated with the respective each of the plurality of hydrocarbon reservoirs. Consequently, the plurality of fluid flow simulation runs can thereby define a plurality of history-matching simulation runs. Further, each of the plurality of history-matching simulation runs can be configured to operate for a respective preselected time period, and each respective preselected time period can include one or more time steps. Each of the plurality of history-matching simulation runs also can be configured to output a simulation data set responsive to operation of the respective history-matching simulation run after each of the one or more time steps. Each simulation data set can include one or more simulation data values. The respective each of the plurality of hydrocarbon reservoirs can have a plurality of hydrocarbon wells, and the plurality of hydrocarbon wells can collectively define a hydrocarbon field within the respective each of the plurality of hydrocarbon reservoirs. Each of the one or more simulation data values can be configured to be associated with one of the plurality of hydrocarbon wells.

Operations can further include terminating, for each of the plurality of hydrocarbon reservoirs, each of a first set of one or more of the plurality of history-matching simulation runs earlier than the completion of the respective preselected time period. Termination of the first set of history-matching simulation runs can be responsive to output after a time step when each of the first set of history-matching simulation runs has a simulation error measurement for the hydrocarbon field exceeding a predetermined simulation run termination error tolerance. Termination of the first set of history-matching simulation runs can also be while continuing a second set of another one or more of the plurality of history-matching simulation runs. Each history-matching simulation run of the second set can lack a simulation error measurement for the hydrocarbon field that exceeds the predetermined simulation run termination error tolerance. Further, the predetermined simulation run termination error tolerance can be related to preselected values of one or more threshold variables.

In an example according to another embodiment, more than a predetermined number of hydrocarbon wells in each of the first set of history-matching simulation runs each can have a simulation error measurement for the hydrocarbon well that exceeds a predetermined well termination error tolerance. On the other hand, each of the second set of history-matching simulation runs can have fewer than the predetermined number of hydrocarbon wells that each has a simulation error measurement for the hydrocarbon well that exceeds the predetermined well termination error tolerance. The predetermined number of hydrocarbon wells and the predetermined well termination error tolerance can be related to preselected values of one or more threshold variables.

A collective limited and predetermined combined computing capacity of the one or more processors can be configured to have increased processing availability when the first set of history-matching simulation runs are terminated, for example. The limited and predetermined combined computing capacity can be available responsive to simulation run usage. As a result, termination of the first set of history-matching simulation runs can thereby increase processing availability for fluid flow simulation runs within the limited and predetermined combined computing capacity to another one or more fluid flow simulation runs being run. Further, termination of the first set of history-matching simulation runs can reduce total hydrocarbon reservoir simulation run time.

Additionally, in some circumstances, each of the second set of history-matching simulation runs can operate simultaneously with another one or more of the second set of history-matching simulation runs after termination of each of the first set of history-matching simulation runs. Further, the plurality of history-matching simulation runs for each of the plurality of hydrocarbon reservoirs can include a predetermined number of history-matching simulation runs. A sum of the predetermined numbers of history-matching simulation runs of the plurality of hydrocarbon reservoirs can define a predetermined total number of history-matching simulation runs. Completion of the predetermined total number of history-matching simulation runs can be scheduled to require a predetermined amount of time to thereby define a total expected completion time. Termination of the first set of history-matching simulation runs for each of the plurality of hydrocarbon reservoirs can thus advantageously cause operation of the predetermined total number of history-matching simulation runs to conclude earlier than the end of the total expected completion time.

In some non-transitory computer-readable medium having one or more computer programs stored therein according to an embodiment of the invention, the set of instructions, when executed by the one or more processors, can further cause the one or more processors to perform additional operations. Operations can further include, for example, initiating, responsive to termination of a history-matching simulation run, another different history-matching simulation run by use of one or more of the one or more processors having increased processing availability responsive to the termination of the history-matching simulation run, to thereby enable earlier initiation of the other history-matching simulation run. Additionally, the plurality of history-matching simulation runs can be configured to calibrate the one or more hydrocarbon reservoir simulation models associated with the respective each of the plurality of hydrocarbon reservoirs by comparison to a plurality of actual measured reservoir characteristic values for the respective each of the plurality of hydrocarbon reservoirs. A simulation error measurement for the hydrocarbon well for a history-matching simulation run after a time step can be determined, for example, responsive to a comparison of the one or more simulation data values of the simulation data set associated with the history-matching simulation run after the time step and one or more of the plurality of actual measured reservoir characteristic values for the respective each of the plurality of hydrocarbon reservoirs.

In some non-transitory computer-readable medium having one or more computer programs stored therein to enhance hydrocarbon reservoir simulation for a plurality of hydrocarbon reservoirs according to yet another embodiment, the one or more computer programs can include a set of instructions that, when executed by the one or more processors, cause the one or more processors to perform a series of operations. The operations can include, for example, initiating, for each of the plurality of hydrocarbon reservoirs, each of a plurality of fluid flow simulation runs. The plurality of fluid flow simulation runs can be configured to predict future behavior of the respective each of the plurality of hydrocarbon reservoirs. The plurality of fluid flow simulation runs can thereby define a plurality of prediction simulation runs. Each of the plurality of prediction simulation runs can be configured to operate for a respective preselected time period, and each respective preselected time period can include one or more time steps. Each of the plurality of prediction simulation runs also can be configured to output a simulation data set responsive to operation of the respective prediction simulation run after each of the one or more time steps. Each simulation data set can include one or more simulation data values. The respective each of the plurality of hydrocarbon reservoirs can have a plurality of hydrocarbon wells, and each of the one or more simulation data values can be configured to be associated with one of the plurality of hydrocarbon wells. The operations can also include, for example, terminating, for each of the plurality of hydrocarbon reservoirs, each of a first set of one or more of the plurality of prediction simulation runs earlier than the completion of the respective preselected time period. Termination of the first set of prediction simulation runs can be responsive to output after a time step when one or more of the one or more simulation data values of the simulation data set associated with each of the first set of prediction simulation runs after the time step are outside of a simulation data values termination tolerance. Termination of the first set of prediction simulation runs can also be while continuing a second set of another one or more of the plurality of prediction simulation runs. Each of the one or more simulation data values of the simulation data set associated with each of the second set of prediction simulation runs after the time step can be included within the simulation data values termination tolerance. The simulation data values termination tolerance can be related to preselected values of one or more threshold variables. A limited and predetermined combined computing capacity of the one or more processors can be configured to have increased processing availability when the first set of prediction simulation runs are terminated. The limited and predetermined combined computing capacity can be available responsive to simulation run usage. Consequently, termination of the first set of prediction simulation runs can thereby increase processing availability for fluid flow simulation runs within the collective limited and predetermined combined computing capacity to another one or more fluid flow simulation runs being run. Further, termination of the first set of prediction simulation runs can reduce total hydrocarbon reservoir simulation run time.

In some circumstances, each of the second set of prediction simulation runs can operate simultaneously with another one or more of the second set of prediction simulation runs after termination of each of the first set of prediction simulation runs. Further, the plurality of prediction simulation runs for each of the plurality of hydrocarbon reservoirs can include a predetermined number of prediction simulation runs. A sum of the predetermined numbers of prediction simulation runs of the plurality of hydrocarbon reservoirs can define a predetermined total number of prediction simulation runs, and completion of the predetermined total number of prediction simulation runs can be scheduled to require a predetermined amount of time to thereby define a total expected completion time. Termination of the first set of prediction simulation runs for each of the plurality of hydrocarbon reservoirs can advantageously cause operation of the predetermined total number of prediction simulation runs to conclude earlier than the end of the total expected completion time.

An embodiment of the invention can also include, for example, a computer-implemented method to enhance hydrocarbon reservoir simulation for a plurality of hydrocarbon reservoirs. For example, a method can include initiating, for each of the plurality of hydrocarbon reservoirs, each of a plurality of fluid flow simulation runs. The plurality of fluid flow simulation runs can be configured to calibrate one or more hydrocarbon reservoir simulation models associated with the respective each of the plurality of hydrocarbon reservoirs, for example. Consequently, the plurality of fluid flow simulation runs can thereby define a plurality of history-matching simulation runs. Each of the plurality of history-matching simulation runs can be configured to operate for a respective preselected time period, and each respective preselected time period can include one or more time steps. Further, each of the plurality of history-matching simulation runs also can be configured to output a simulation data set responsive to operation of the respective history-matching simulation run after each of the one or more time steps. Each simulation data set can include one or more simulation data values. The respective each of the plurality of hydrocarbon reservoirs can have a plurality of hydrocarbon wells, and the plurality of hydrocarbon wells can collectively define a hydrocarbon field within the respective each of the plurality of hydrocarbon reservoirs. Each of the one or more simulation data values can be configured to be associated with one of the plurality of hydrocarbon wells.

A method can further include terminating, for each of the plurality of hydrocarbon reservoirs, each of a first set of one or more of the plurality of history-matching simulation runs earlier than the completion of the respective preselected time period. Termination of the first set of history-matching simulation runs can be while continuing a second set of another one or more of the plurality of history-matching simulation runs. Termination of the first set of history-matching simulation runs can also be responsive to output after a time step when each of the first set of history-matching simulation runs has a simulation error measurement for the hydrocarbon field that exceeds a predetermined simulation run termination error tolerance. The second set of history-matching simulation runs can each lack a simulation error measurement for the hydrocarbon field that exceeds the predetermined simulation run termination error tolerance. The predetermined simulation run termination error tolerance can be related to preselected values of one or more threshold variables.

The first set of history-matching simulation runs can be terminated according to another embodiment when more than a predetermined number of hydrocarbon wells in each of the first set of history-matching simulation runs each has a simulation error measurement for the hydrocarbon well that exceeds a predetermined well termination error tolerance. In contrast, each of the second set of history-matching simulation runs can have fewer than the predetermined number of hydrocarbon wells that each has a simulation error measurement for the hydrocarbon well exceeding the predetermined well termination error tolerance. The predetermined number of hydrocarbon wells and the predetermined well termination error tolerance can be related to preselected values of one or more threshold variables.

Further, a limited and predetermined combined computing capacity of one or more processors can be configured to have increased processing availability when the first set of history-matching simulation runs are terminated. The limited and predetermined combined computing capacity can be available responsive to simulation run usage. Termination of the first set of history-matching simulation runs can thereby increase processing availability for fluid flow simulation runs within the collective limited and predetermined combined computing capacity to another one or more fluid flow simulation runs being run. As a result, termination of the first set of history-matching simulation runs can advantageously reduce total hydrocarbon reservoir simulation run time.

For example, in some circumstances, each of the second set of history-matching simulation runs can operate simultaneously with another one or more of the second set of history-matching simulation runs after termination of each of the first set of history-matching simulation runs. Further, the plurality of history-matching simulation runs for each of the plurality of hydrocarbon reservoirs can include a predetermined number of history-matching simulation runs. A sum of the predetermined numbers of history-matching simulation runs of the plurality of hydrocarbon reservoirs can define a predetermined total number of history-matching simulation runs. Completion of the predetermined total number of history-matching simulation runs can be scheduled to require a predetermined amount of time to thereby define a total expected completion time. Additionally, termination of the first set of history-matching simulation runs for each of the plurality of hydrocarbon reservoirs can cause operation of the predetermined total number of history-matching simulation runs to conclude earlier than the end of the total expected completion time.

In some instances, a method can further include initiating, responsive to termination of a history-matching simulation run, another different history-matching simulation run by use of one or more of the one or more processors having increased processing availability responsive to the termination of the history-matching simulation run, to thereby enable earlier initiation of the other history-matching simulation run. Further, the plurality of history-matching simulation runs can be configured to calibrate the one or more hydrocarbon reservoir simulation models associated with the respective each of the plurality of hydrocarbon reservoirs by comparison to a plurality of actual measured reservoir characteristic values for the respective each of the plurality of hydrocarbon reservoirs. In addition, a simulation error measurement for the hydrocarbon field for a history-matching simulation run after a time step can be determined responsive to a comparison of the one or more simulation data values of the simulation data set associated with the history-matching simulation run after the time step and one or more of the plurality of actual measured reservoir characteristic values for the respective each of the plurality of hydrocarbon reservoirs.

A method to enhance hydrocarbon reservoir simulation for a plurality of hydrocarbon reservoirs according to yet another embodiment can include, for example, initiating, for each of the plurality of hydrocarbon reservoirs, each of a plurality of fluid flow simulation runs. The plurality of fluid flow simulation runs can be configured to predict future behavior of the respective each of the plurality of hydrocarbon reservoirs, and the plurality of fluid flow simulation runs can thereby define a plurality of prediction simulation runs, as a result. Each of the plurality of prediction simulation runs can be configured to operate for a respective preselected time period. Each respective preselected time period can include one or more time steps. Each of the plurality of prediction simulation runs also can be configured to output a simulation data set responsive to operation of the respective prediction simulation run after each of the one or more time steps. Each simulation data set can include one or more simulation data values. The respective each of the plurality of hydrocarbon reservoirs can have a plurality of hydrocarbon wells, and each of the one or more simulation data values can be configured to be associated with one of the plurality of hydrocarbon wells.

A method can then include terminating, for each of the plurality of hydrocarbon reservoirs, each of a first set of one or more of the plurality of prediction simulation runs earlier than the completion of the respective preselected time period while continuing a second set of another one or more of the plurality of prediction simulation runs. Termination of the first set of prediction simulation runs can be responsive to output after a time step when one or more of the one or more simulation data values of the simulation data set associated with each of the first set of prediction simulation runs after the time step are outside of a simulation data values termination tolerance. Each of the one or more simulation data values of the simulation data set associated with each of the second set of prediction simulation runs after the time step, on the other hand, can be included within the simulation data values termination tolerance. The simulation data values termination tolerance can be related to preselected values of one or more threshold variables. A limited and predetermined combined computing capacity of one or more processors can be configured to have increased processing availability when the first set of prediction simulation runs are terminated. The limited and predetermined combined computing capacity can be available responsive to simulation run usage. Termination of the first set of prediction simulation runs can thereby increase processing availability for fluid flow simulation runs within the collective limited and predetermined combined computing capacity to another one or more fluid flow simulation runs being run. Consequently, termination of the first set of prediction simulation runs can thereby advantageously reduce total hydrocarbon reservoir simulation run time.

In addition, each of the second set of prediction simulation runs can operate simultaneously with another one or more of the second set of prediction simulation runs after termination of each of the first set of prediction simulation runs. Further, the plurality of prediction simulation runs for each of the plurality of hydrocarbon reservoirs can include a predetermined number of prediction simulation runs, and a sum of the predetermined numbers of prediction simulation runs of the plurality of hydrocarbon reservoirs can define a predetermined total number of prediction simulation runs. Completion of the predetermined total number of prediction simulation runs can be scheduled to require a predetermined amount of time to thereby define a total expected completion time. Termination of the first set of prediction simulation runs for each of the plurality of hydrocarbon reservoirs can advantageously cause operation of the predetermined total number of prediction simulation runs to conclude earlier than the end of the total expected completion time.

In some circumstances, the plurality of prediction simulation runs can be configured to predict future behavior of the respective each of the plurality of hydrocarbon reservoirs by use of one or more hydrocarbon reservoir simulation models associated with the respective each of the plurality of hydrocarbon reservoirs. The one or more hydrocarbon reservoir models can be calibrated by use of a plurality of actual measured reservoir characteristic values to thereby define one or more calibrated hydrocarbon reservoir simulation models. Further, each of the plurality of prediction simulation runs can be associated with a future course of action to develop the respective each of the plurality of hydrocarbon reservoirs associated with the respective prediction simulation run to thereby define a development strategy. The preselected values of one or more threshold variables and the simulation data values termination tolerance can be associated with one or more preselected strategic outcome values of one or more development strategies.

BRIEF DESCRIPTION OF THE DRAWINGS

These and other features, aspects, and advantages of the present invention will become better understood with regard to the following descriptions, claims, and accompanying drawings. It is to be noted, however, that the drawings illustrate only several embodiments of the invention and are therefore not to be considered limiting of the invention's scope as it can admit to other equally effective embodiments.

FIG. 8a is a table of exemplary results of a study related to an embodiment of the invention.

FIG. 8b is a table of exemplary results of a study related to an embodiment of the invention.

DETAILED DESCRIPTION OF THE INVENTION

So that the manner in which the features and advantages of the embodiments of methods, systems, and non-transitory computer-readable medium having computer program stored therein of the present invention, as well as others, which will become apparent, may be understood in more detail, a more particular description of the embodiments of methods, systems, and non-transitory computer-readable medium having computer program stored therein of the present invention briefly summarized above may be had by reference to the embodiments thereof, which are illustrated in the appended drawings, which form a part of this specification. It is to be noted, however, that the drawings illustrate only various embodiments of the embodiments of methods, systems, and non-transitory computer-readable medium having computer program stored therein of the present invention and are therefore not to be considered limiting of the embodiments of methods, systems, and non-transitory computer-readable medium having computer program stored therein of the present invention's scope as it may include other effective embodiments as well.

Embodiments of the invention can include systems, non-transitory computer-readable medium having one or more computer programs stored therein, and computer-implemented methods to enhance hydrocarbon reservoir simulation for a plurality of hydrocarbon reservoirs. Each of the plurality of hydrocarbon reservoirs can have a plurality of hydrocarbon wells, and the plurality of hydrocarbon wells of each of the plurality of hydrocarbon reservoirs can collectively define a hydrocarbon field within the hydrocarbon reservoir. Further, embodiments can relate to both history-matching and prediction simulations of hydrocarbon reservoir characteristics and behavior and fluid flow within hydrocarbon reservoirs.

Figure 1:
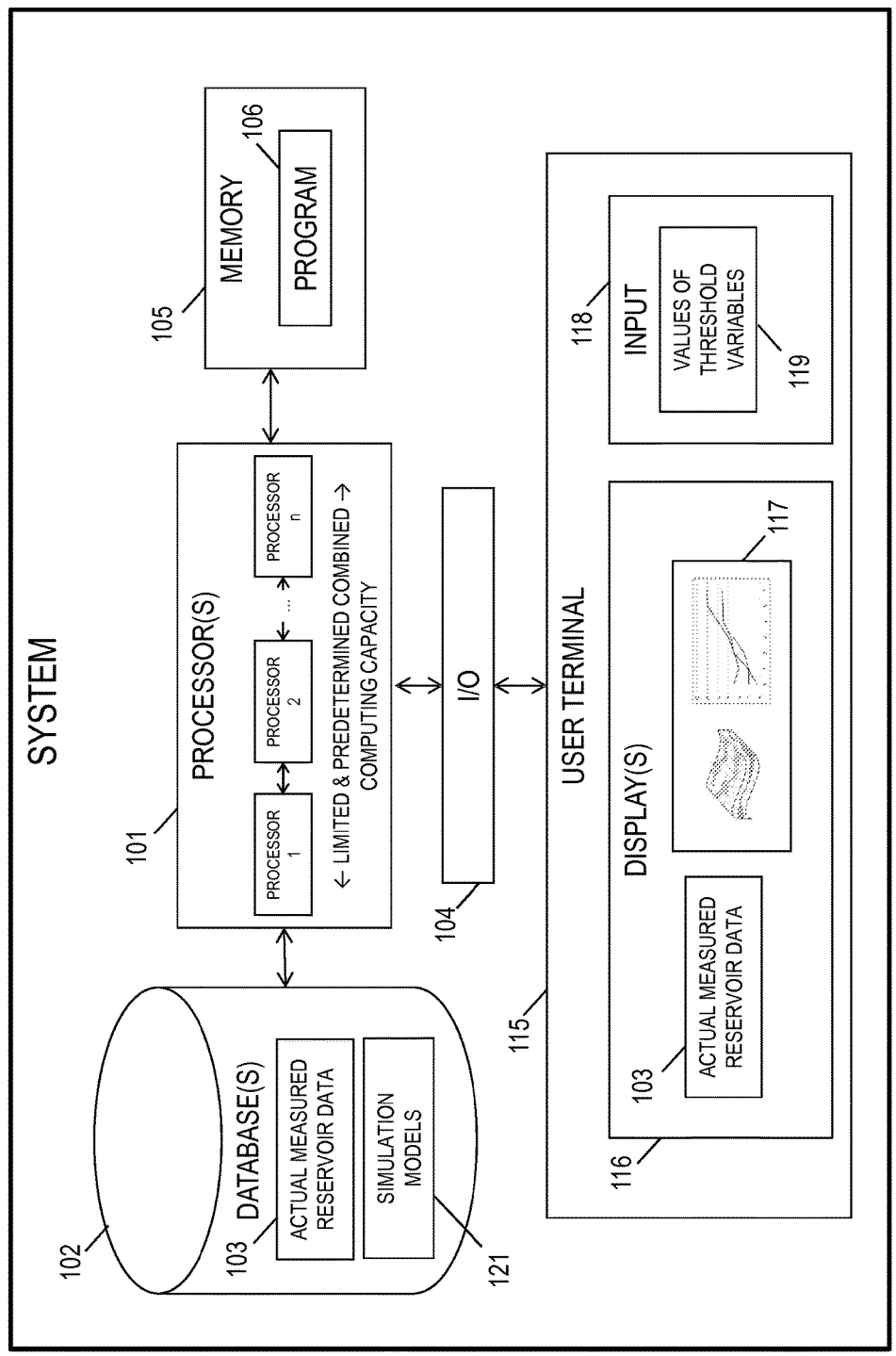
FIG. 1 is a schematic diagram of a system to enhance hydrocarbon reservoir simulation according to an embodiment of the invention.
Figure 2A:
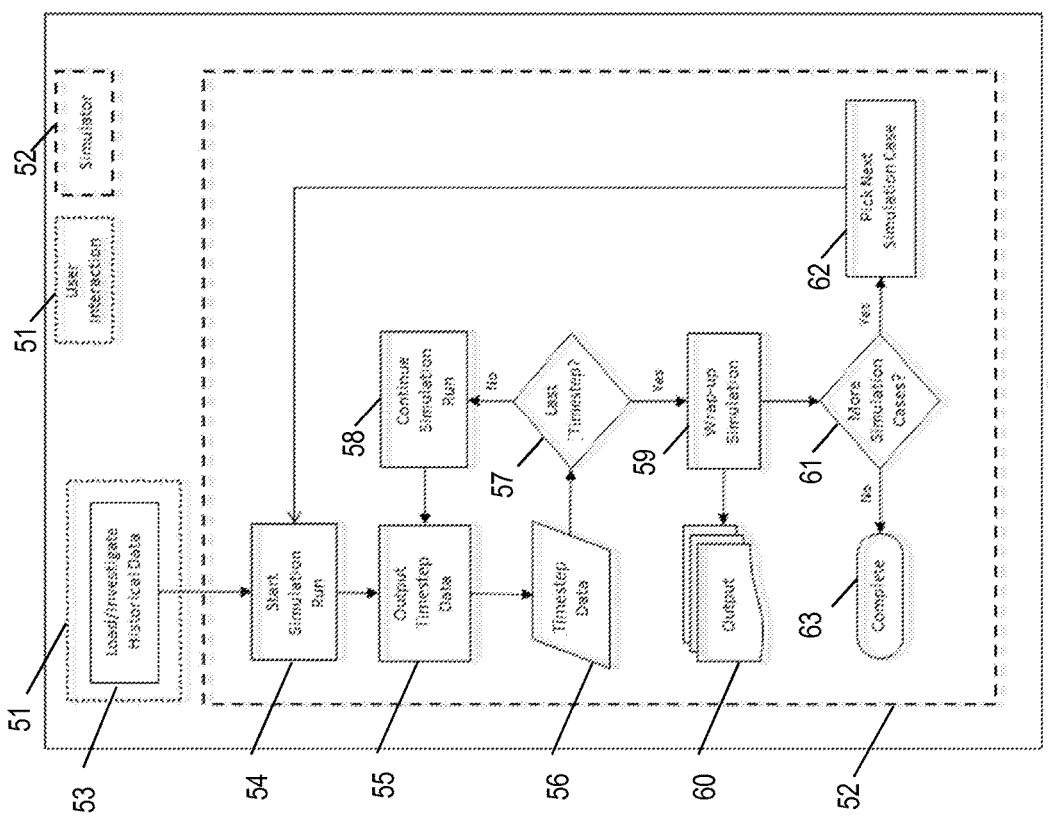
FIG. 2a is a schematic flow diagram of a method according to the prior art.
Figure 2B:
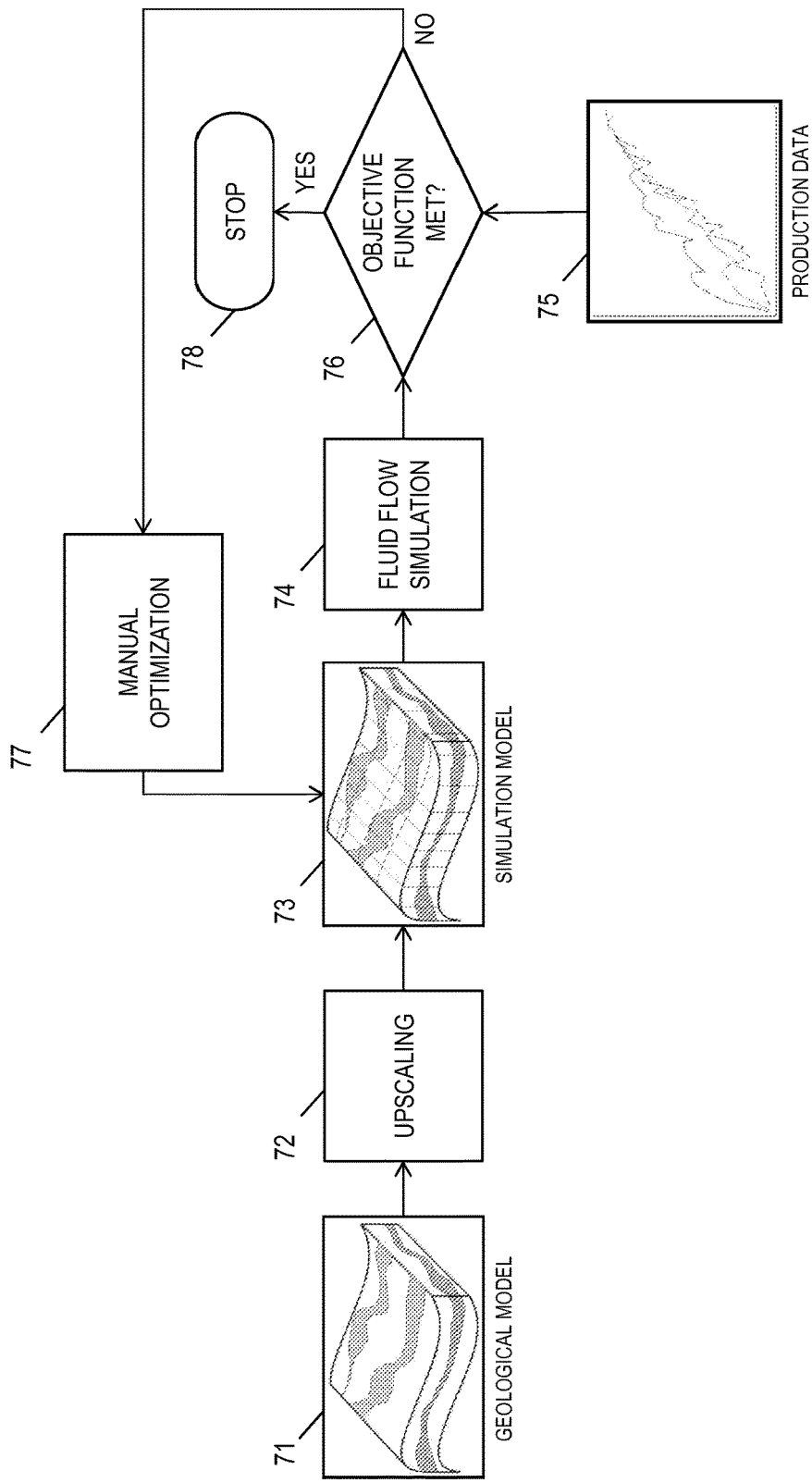
FIG. 2b is a schematic flow diagram of a method according to the prior art.
Figure 2C:
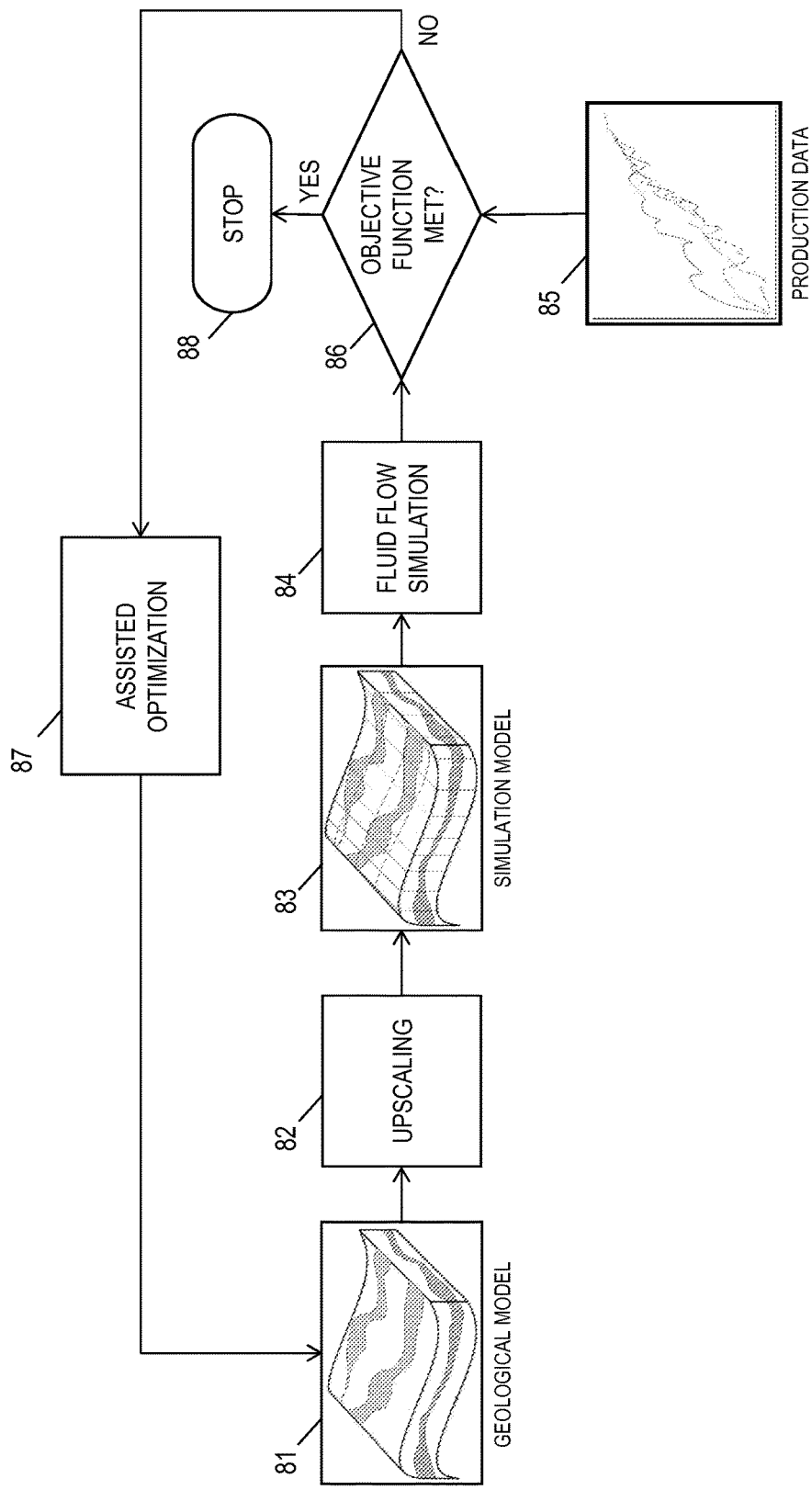
FIG. 2c is a schematic flow diagram of a method according to the prior art.

For example, an embodiment that relates to history-matching simulations can include a system to enhance hydrocarbon reservoir simulation for a plurality of hydrocarbon reservoirs. Each of the plurality of hydrocarbon reservoirs can have a plurality of hydrocarbon wells, and the plurality of hydrocarbon wells of each of the plurality of hydrocarbon reservoirs can also collectively define a hydrocarbon field within the hydrocarbon reservoir. A system according to an embodiment that can be applicable to other embodiments as well can include one or more processors 101 collectively having a limited and predetermined combined computing capacity, as illustrated in FIG. 1, for example. The limited and predetermined combined computing capacity, for example, can be available responsive to simulation run usage. That is, increases in simulation run usage can decrease the computing capacity availability. A system can also include one or more input and output units 104 in communication with the one or more processors 101.

Further, a system can also include non-transitory memory medium 105 in communication with one or more of the one or more processors 101. The memory medium 105, for example, can have computer-readable instructions 106 stored therein. When the computer-readable instructions 106 are executed, they can cause the system to perform a series of steps. The steps, according to an embodiment, can include initiating—for each of the plurality of hydrocarbon reservoirs—each of a plurality of fluid flow simulation runs. The plurality of fluid flow simulation runs can be configured to calibrate one or more hydrocarbon reservoir simulation models 121 associated with the respective each of the plurality of hydrocarbon reservoirs. Calibration can particularly relate to a history-matching process, for example, as will be understood by those skilled in the art. As a result, the plurality of fluid flow simulation runs can thereby define a plurality of history-matching simulation runs. Each of the plurality of history-matching simulation runs also can be configured to operate for a respective preselected time period. In addition, each respective preselected time period can include, for example, one or more time steps. Further, each of the plurality of history-matching simulation runs can be configured to output a simulation data set responsive to operation of the respective history-matching simulation run after each of the one or more time steps. Each simulation data set, according to an embodiment, can include one or more simulation data values. In addition, the respective each of the plurality of hydrocarbon reservoirs can have a plurality of hydrocarbon wells, and the plurality of hydrocarbon wells can collectively define a hydrocarbon field within the respective each of the plurality of hydrocarbon reservoirs. Each of the one or more simulation data values can be configured to be associated with one of the plurality of hydrocarbon wells. Further, simulation data can include hydrocarbon well data such as production, injection, or pressure data.

The steps that the system performs when the computer-readable instructions 106 are executed can further include terminating, for each of the plurality of hydrocarbon reservoirs, each of a first set of one or more of the plurality of history-matching simulation runs earlier than the completion of the respective preselected time period, responsive to output after a time step, while continuing a second set of another one or more of the plurality of history-matching simulation runs.

For example, each of the first set of history-matching simulation runs can be terminated when each of the first set of history-matching simulation runs has a simulation error measurement for the hydrocarbon field exceeding a predetermined simulation run termination error tolerance. In that example, each of the second set of history-matching simulation runs—which the system continues—lacks a simulation error measurement for the hydrocarbon field that exceeds the predetermined simulation run termination error tolerance. The predetermined simulation run termination error tolerance can be related to preselected values of one or more threshold variables 119. Threshold variables can include different types of variables that can have different characteristics from one another. Threshold variables can also be associated with, for example, reservoir pressure, fluid production or injection rates, fluid cumulative production, and injection. A reservoir engineer, for instance, can select values of one or more threshold variables 119. For example, values of one or more threshold variables 119 can be directly or indirectly related to one or more goals (including, in some instances, one or more objective functions) of a hydrocarbon reservoir simulation study, as will be understood by those skilled in the art. A preselected value of one threshold variable can thereby serve as a threshold, in some circumstances, above which a simulation run is terminated.

In another embodiment, for example, each of the first set of history-matching simulation runs can be terminated earlier than the completion of the respective preselected time period when more than a predetermined number of hydrocarbon wells in each of the first set of history-matching simulation runs each has a simulation error measurement for the hydrocarbon well that exceeds a predetermined well termination error tolerance. In that example, each of the second set of history-matching simulation runs—which the system continues—has fewer than the predetermined number of hydrocarbon wells that each has a simulation error measurement for the hydrocarbon well that exceeds the predetermined well termination error tolerance. The predetermined number of hydrocarbon wells and the predetermined well error tolerance can be related, for example, to the preselected values of one or more threshold variables 119.

In both exemplary embodiments, the limited and predetermined combined computing capacity can be configured to have increased processing availability when the first set of history-matching simulation runs are terminated. Terminating the first set of simulation runs can thereby increase processing availability for fluid flow simulation runs within the limited and predetermined combined computing capacity to another one or more fluid flow simulation runs being run and reduce total hydrocarbon reservoir simulation run time.

Each of the second set of history-matching simulation runs can operate simultaneously with another one or more of the second set of history-matching simulation runs after termination of the first set of history-matching simulation runs. Further, the plurality of history-matching simulation runs for each of the plurality of hydrocarbon reservoirs can include a predetermined number of history-matching simulation runs, such as a finite number of history-matching simulation runs. A sum of the predetermined numbers of history-matching simulation runs of the plurality of hydrocarbon reservoirs can define a predetermined total number of history-matching simulation runs, for example. Completion of the predetermined total number of history-matching simulation runs can be scheduled to require a predetermined amount of time to thereby define a total expected completion time. But termination of the first set of history-matching simulation runs for each of the plurality of hydrocarbon reservoirs can advantageously cause operation of the predetermined total number of history-matching simulation runs to conclude earlier than the end of the total expected completion time.

The limited and predetermined combined computing capacity of the one or more processors 101 can restrict the rate at which a system can run a plurality of history-matching simulation runs, for example. In some systems according to an embodiment of the invention, therefore, the instructions 106 in the non-transitory memory medium 105, when executed, can further cause the system to perform additional steps to increase use efficiency of the limited and predetermined combined computing capacity. Additional steps consequently can include, for example, initiating another different history-matching simulation run responsive to termination of a history-matching simulation run. For example, one or more of the one or more processors 101 that have increased processing availability responsive to the termination of the history-matching simulation run can be used to initiate the other, different history-matching simulation run. This use of one or more processors 101 that have increased processing availability responsive to the termination of the history-matching simulation run can thereby enable earlier initiation of the other history-matching simulation run. Use efficiency of the limited combined computing capacity can therefore increase because the other history-matching simulation run takes advantage of the increased processing availability caused by termination of a simulation run.

Additionally, the plurality of history-matching simulation runs can be configured to calibrate the one or more hydrocarbon reservoir simulation models 121 associated with the respective each of the plurality of hydrocarbon reservoirs by comparison to a plurality of actual measured reservoir characteristic values 103 for the respective each of the plurality of hydrocarbon reservoirs. Actual measured reservoir characteristic values 103 can be actual measured data related to the hydrocarbon reservoir, i.e., measurements and observations collected during exploration of and production from the hydrocarbon reservoir. For instance, actual measured reservoir characteristics values 103 can include, e.g., reservoir pressure, hydrocarbon production rates, water cut, or injection data. Further, a simulation error measurement for the hydrocarbon field for a history-matching simulation run after a time step can be determined responsive to a comparison of (1) the one or more simulation data values of the simulation data set associated with the history-matching simulation run after the time step and (2) one or more of the plurality of actual measured reservoir characteristic values 103 for the respective each of the plurality of hydrocarbon reservoirs. Likewise, a simulation error measurement for the hydrocarbon well for a history-matching simulation run after a time step can be determined responsive to a comparison of (1) the one or more simulation data values of the simulation data set associated with the history-matching simulation run after the time step and (2) one or more of the plurality of actual measured reservoir characteristic values 103 for the respective each of the plurality of hydrocarbon reservoirs.

A system can further include, in some circumstances, one or more databases 102 in communication with the one or more processors 101. The one or more databases 102 can be configured to include, for example, the plurality of actual measured reservoir characteristic values 103 for each of the plurality of hydrocarbon reservoirs. The one or more databases 102 can further be configured to include, for example, the one or more hydrocarbon reservoir simulation models 121 associated with each of the plurality of hydrocarbon reservoirs. In addition, the instructions 106 in the non-transitory memory medium 105 can further cause the system to perform additional steps, for each of the plurality of hydrocarbon reservoirs, when executed. For example, the steps can further include calculating one or more well difference deltas for each of the plurality of simulation runs after a time step. The well difference deltas can be responsive to receipt of one or more of the plurality of actual measured reservoir characteristic values 103 for the respective each of the plurality of hydrocarbon reservoirs from the one or more databases 102. Further, the one or more well difference deltas can be deltas between each of the one or more simulation data values of the simulation data set associated with the time step and the one or more of the plurality of actual measured reservoir characteristic values 103 received from the one or more databases 102. In addition, calculating the one or more well difference deltas can be based on a function of: (1) each of the one or more simulation data values of the simulation data set associated with the time step, (2) each of the one or more of the plurality of actual measured reservoir characteristic values 103 received from the one or more databases 102, and (3) a predetermined well weighting factor. A well weighting factor for a hydrocarbon well can be set by a reservoir simulation engineer based on the engineer's knowledge of the hydrocarbon reservoir model and the uncertainty in the reservoir model. Further, the well weighting factors for all of the hydrocarbon wells in a hydrocarbon field can be normalized and can add up to one when they are summed. The steps can then further include summing, for each of the plurality of hydrocarbon wells, each of the one or more well difference deltas associated with the respective hydrocarbon well. Summing each of the one or more well difference deltas can consequently determine a well simulation discrepancy value. The steps can still further include, for example, determining—for each of the plurality of history-matching simulation runs—a simulation error measurement for the hydrocarbon field by use of the well simulation discrepancy values for each of the plurality of hydrocarbon wells of the hydrocarbon field. In another embodiment, for example, the steps can include determining—for each of the plurality of hydrocarbon wells in each of the plurality of history-matching simulation runs—a simulation error measurement for the hydrocarbon well by use of the well simulation discrepancy value.

In some instances, the one or more input and output units 104 can further be positioned to receive as input preselected values of one or more threshold variables 119 and to output simulation data 117. Further, initiating each of the plurality of history-matching simulation runs for each of the plurality of hydrocarbon reservoirs can be by use of one or more of the one or more processors 101. Initiating each of the plurality of history-matching simulation runs for each of the plurality of hydrocarbon reservoirs can also be responsive to input from the one or more input and output units 104.

In addition, in some instances, a system can also include a user terminal 115, as illustrated in FIG. 1, for instance. The user terminal 115 can be configured to display one or more of the plurality of actual measured reservoir characteristic values 103 to a user by use of a display 116, for example, as well as to define the preselected values of one or more threshold variables 119 responsive to user action through an input 118. The instructions 106 in the non-transitory memory medium 105, when executed, can also further cause the system to perform additional steps, such as, for example, receiving the preselected values of one or more threshold variables 119 by use of one or more of the one or more input and output units 104 from the user terminal 115. As depicted in FIG. 1, for example, the user terminal 115 can be configured to display simulation data 117 to a user by use of the display 116.

Further, in some systems according to an embodiment of the invention, each processor of the one or more processors 101 can have a limited and predetermined individual computing capacity. The limited and predetermined individual computing capacity of a processor can be, for example, a fractional portion of the limited and predetermined combined computing capacity of the one or more processors 101 that is defined by a mathematical function of the limited and predetermined combined computing capacity and number of the one or more processors 101.

In some systems according to an embodiment of the invention, the instructions 106 in the non-transitory memory medium 105, when executed, can further cause the system to perform other additional steps, such as, for example, restarting a terminated history-matching simulation run by use of one or more of the one or more processors 101 that have increased processing availability responsive to termination of a history-matching simulation run. This use of one or more processors 101 that have increased processing availability responsive to the termination of the history-matching simulation run can thereby enable earlier restarting of the terminated history-matching simulation run. In some circumstances, the steps can still further include storing data representative of a terminating state of a terminated history-matching simulation run, for each of the one or more terminated history-matching simulation runs. Storing data representative of a terminating state of a terminated history-matching simulation run can thereby allow restarting of the terminated history-matching simulation run when desired responsive to the terminating state of the terminated history-matching simulation run. A simulation run can be restarted, for example, when the simulation run fails because of a computer system issue, e.g., power failure.

Embodiments can also relate to prediction simulations. A system according to yet another embodiment, for example, can include one or more processors 101 collectively having a limited and predetermined combined computing capacity, as illustrated, for example, in FIG. 10. The limited and predetermined combined computing capacity can be available responsive to simulation run usage. A system can also include one or more input and output units 104 in communication with the one or more processors 101. A system can also include non-transitory memory medium 105 in communication with one or more of the one or more processors 101. The memory medium 105 can have computer-readable instructions 106 stored therein that when executed cause the system to perform a series of steps.

The steps can include, for example, initiating, for each of the plurality of hydrocarbon reservoirs, each of a plurality of fluid flow simulation runs. The plurality of fluid flow simulation runs can be configured to predict future behavior of the respective each of the plurality of hydrocarbon reservoirs. As a result, the plurality of fluid flow simulation runs can thereby define a plurality of prediction simulation runs. Each of the plurality of prediction simulation runs can be configured to operate for a respective preselected time period. In addition, each respective preselected time period can include one or more time steps. Each of the plurality of prediction simulation runs, consequently, also can be configured to output a simulation data set responsive to operation of the respective prediction simulation run after each of the one or more time steps. Each simulation data set can include one or more simulation data values, and the respective each of the plurality of hydrocarbon reservoirs can have a plurality of hydrocarbon wells. Each of the one or more simulation data values can be configured to be associated with one of the plurality of hydrocarbon wells.

The steps can also include terminating, for each of the plurality of hydrocarbon reservoirs, each of a first set of one or more of the plurality of prediction simulation runs earlier than the completion of the respective preselected time period, responsive to output after a time step, while continuing a second set of another one or more of the plurality of prediction simulation runs. The first set of prediction simulation runs can be terminated when one or more of the one or more simulation data values of the simulation data set associated with each of the first set of prediction simulation runs after the time step are outside of a simulation data values termination tolerance, for example. Conversely, each of the one or more simulation data values of the simulation data set associated with each of the second set of prediction simulation runs after the time step can be included within the simulation data values termination tolerance. The simulation data values termination tolerance can be related to the preselected values of one or more threshold variables 119. For example, two values of the same threshold variable can determine a simulation data values termination tolerance, in some circumstances. In some instances, two or more preselected values of one or more threshold variables 119 can determine a range of acceptable water-cut values, permeability, or relative permeability coefficient multipliers, for example. Consequently, the simulation data values termination tolerance can include a range of acceptable water cut values and a range of acceptable reservoir pressure values, for example. When the simulation data values termination tolerance includes a range of acceptable reservoir pressure values, one of the preselected values of one or more threshold variables 119 can also be a target reservoir pressure value, for example. A range of acceptable reservoir pressure values—an example of a simulation data values termination tolerance—can be related to a target reservoir pressure value, for example, by including reservoir pressure values close to the target reservoir pressure value. The limited and predetermined combined computing capacity can be configured to have increased processing availability when the first set of prediction simulation runs are terminated. Terminating the first set of prediction simulation runs while continuing the second set of prediction simulation runs can thereby increase processing availability for fluid flow simulation runs within the limited and predetermined combined computing capacity to another one or more fluid flow simulation runs being run and can reduce total hydrocarbon reservoir simulation run time.

In some circumstances, each of the second set of prediction simulation runs can operate simultaneously with another one or more of the second set of prediction simulation runs after termination of the first set of prediction simulation runs. Further, the plurality of prediction simulation runs for each of the plurality of hydrocarbon reservoirs can include a predetermined number of prediction simulation runs, such as a finite number of prediction simulation runs, and a sum of the predetermined numbers of prediction simulation runs of the plurality of hydrocarbon reservoirs can define a predetermined total number of prediction simulation runs. Completion of the predetermined total number of prediction simulation runs can be scheduled to require a predetermined amount of time to thereby define a total expected completion time. Termination of the first set of prediction simulation runs for each of the plurality of hydrocarbon reservoirs can advantageously cause operation of the predetermined total number of prediction simulation runs to conclude earlier than the end of the total expected completion time.

In addition, the plurality of prediction simulation runs can be configured to predict future behavior of the respective each of the plurality of hydrocarbon reservoirs by use of one or more hydrocarbon reservoir simulation models associated with the respective each of the plurality of hydrocarbon reservoirs. The one or more hydrocarbon reservoir models can have been calibrated by use of a plurality of actual measured reservoir characteristic values 103 to thereby define one or more calibrated hydrocarbon reservoir simulation models 122. In some circumstances, each of the plurality of prediction simulation runs can be associated with a future course of action to develop the respective each of the plurality of hydrocarbon reservoirs associated with the respective prediction simulation run. A future course of action to develop the respective each of the plurality of hydrocarbon reservoirs can thereby define a development strategy, for example. Development strategies can include, for instance, injection of fluids into a hydrocarbon reservoir to enhance hydrocarbon recovery. Other examples of development strategies can include, for instance: (1) drilling new wells with certain constraints, (2) changing constraints related to producers or injectors, (3) assessing intake of hydrocarbons, and (4) performing assessments of single or multiple hydrocarbon wells. Further, the preselected values of one or more threshold variables 119 and the simulation data values termination tolerance can be associated with one or more preselected strategic outcome values of one or more development strategies. The one or more preselected strategic outcome values can be associated with one or more goals related to development of a hydrocarbon reservoir, for instance. As a result, the one or more preselected strategic outcome values can include, for example, a fluid production rate higher than some predetermined minimum acceptable production rate.

A system can also include one or more databases 102 in communication with the one or more processors 101. The one or more databases 102, in turn, can be configured to include the plurality of actual measured reservoir characteristic values 103 for each of the plurality of hydrocarbon reservoirs and the one or more calibrated hydrocarbon reservoir simulation models 122 associated with each of the plurality of hydrocarbon reservoirs. In addition, the instructions 106 in the non-transitory memory medium 105, when executed, can further cause the system to perform the step of storing data representative of a terminating state of a terminated prediction simulation run for each of the one or more terminated prediction simulation runs. Storing such data can thereby allow investigation of the development strategy associated with the terminated prediction simulation run when desired responsive to the terminating state of the terminated prediction simulation run, for instance.

Sometimes, the one or more preselected strategic outcome values of one or more development strategies can include, for example, a preselected maximum water cut measurement for one or more of the plurality of hydrocarbon reservoirs, as will be understood by those skilled in the art. In that example, preselected values of one or more threshold variables 119 can relate to water cut. Further, a violation of a simulation data values termination tolerance can occur when water cut exceeds 30%, for instance, for each hydrocarbon well or a group of hydrocarbon wells. In this water cut example, a water cut value can be calculated at the end of each time step and compared to a water cut threshold—one of the preselected values of one or more threshold variables 119—as defined by an engineer at the beginning of the process, e.g., 30%. If the simulation water cut is below the 30% threshold, then the simulation run can be resumed and run to the next time step. Otherwise, the simulation run can be terminated. Consequently, a simulation run in which water cut exceeds 30% can be terminated, and results can then be reported. In this example, water cut greater than 30% can indicate that the development scenario being simulated is not a valid one. An engineer can have a choice between setting a simulation data values termination tolerance for all hydrocarbon wells and setting a simulation data values termination tolerance for a certain number of wells, for example. That is, a prediction simulation run can violate a simulation data values termination tolerance when water cut for a single well or for a group of wells exceeds 30%. When a simulation data values termination tolerance is set for all hydrocarbon wells, for instance, the simulation data values termination tolerance can be violated when any of the hydrocarbon wells of the reservoir has a water cut greater than 30%, and the simulation run can then be stopped. But a simulation data values termination tolerance can alternatively be set for a group of hydrocarbon wells or for an individual hydrocarbon well, e.g., by establishing that a simulation data values termination tolerance will be violated when any hydrocarbon well in a first set of wells exceeds 30% and that a simulation data values termination tolerance will be violated when any hydrocarbon well in a second set of wells exceeds 50%. In that example, violations of any of the established conditions can cause the simulation run to terminate. These established conditions can serve as simulation run termination criteria, for example.

Figure 10:
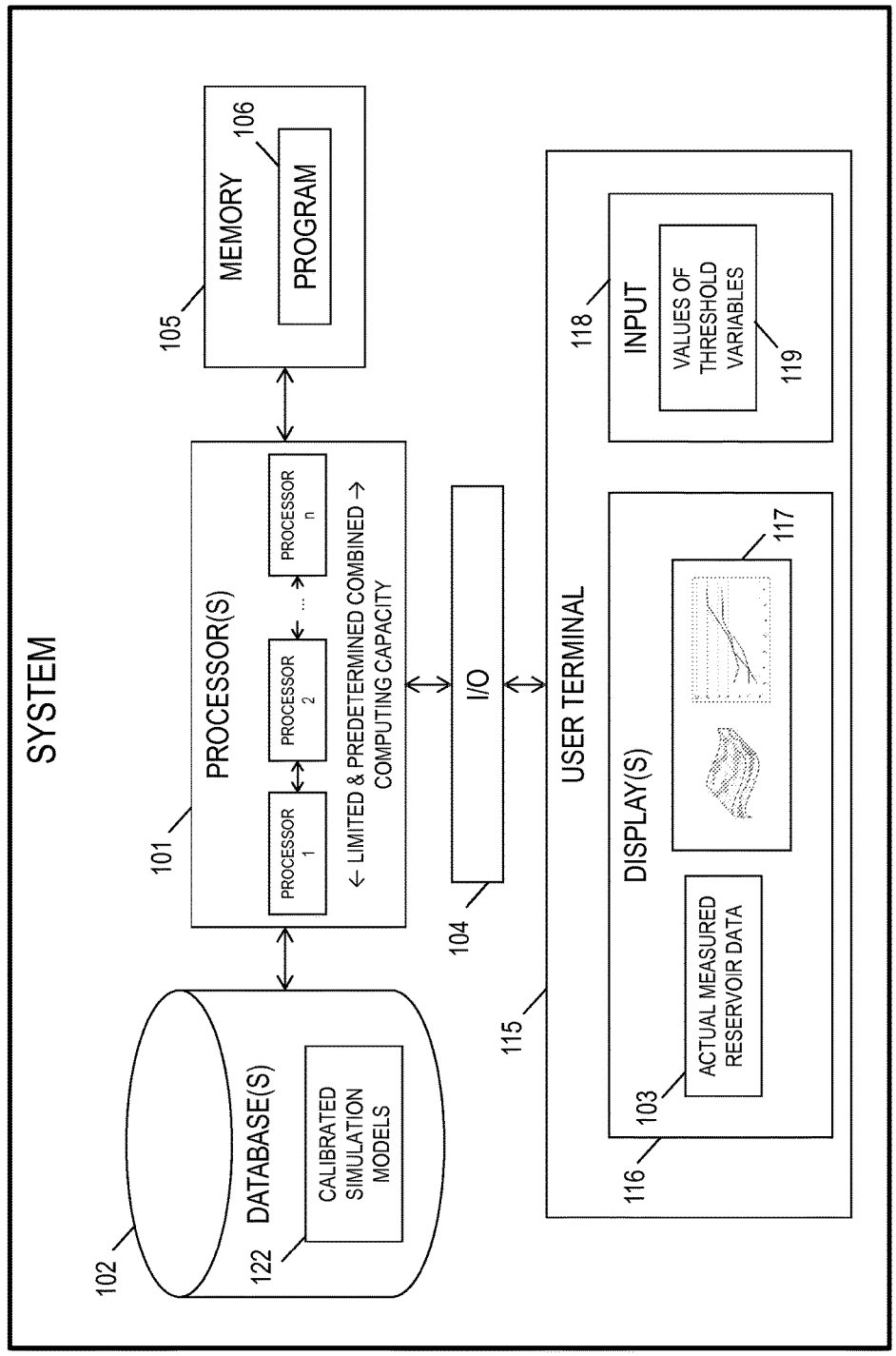
FIG. 10 is a schematic diagram of a system to enhance hydrocarbon reservoir simulation according to yet another embodiment of the invention.

The one or more input and output units 104 can further be positioned to receive as input the preselected values of one or more threshold variables 119 and to output simulation data 117. In addition, initiating each of the plurality of prediction simulation runs for each of the plurality of hydrocarbon reservoirs can be by use of one or more of the one or more processors 101 and can further be responsive to input from the one or more input and output units 104. In some circumstances, a system can also include a user terminal 115 configured to display one or more of the plurality of actual measured reservoir characteristic values 103 to a user and to define the preselected values of one or more threshold variables 119 responsive to user action through an input 118. Further, the instructions 106 in the non-transitory memory medium 105, when executed, can further cause the system to perform the step of receiving the preselected values of one or more threshold variables 119 by use of one or more of the one or more input and output units 104 from the user terminal 115. As depicted in FIG. 10, for example, the user terminal 115 can also be configured to display simulation data 117 to a user by use of the display 116.

In some systems, the instructions 106 in the non-transitory memory medium 105, when executed, can further cause the system to perform the step of initiating, responsive to termination of a prediction simulation run, another different prediction simulation run. Initiating another different prediction simulation run can be by use of one or more of the one or more processors 101 having increased processing availability responsive to the termination of the prediction simulation run, for example, to thereby enable earlier initiation of the other prediction simulation run. Additionally, each processor of the one or more processors 101 can have a limited and predetermined individual computing capacity, and the limited and predetermined individual computing capacity of a processor can be a fractional portion of the limited and predetermined combined computing capacity of the one or more processors 101 defined by a mathematical function of the limited and predetermined combined computing capacity and number of the one or more processors 101.

A simulator itself can have an error tolerance that is separate and distinct from a simulation run termination error tolerance, a well termination error tolerance, or a simulation data values termination tolerance, as will be understood by those skilled in the art. A simulator's error tolerance (i.e., a simulator tolerance) can be set to make sure that the simulator's numerical solutions are accurate and do not have excessive error. A simulator tolerance can depend on the solution algorithm of the simulator and the level of error that one can tolerate in the converged numerical solution. Conversely, a simulation run termination error tolerance, a well termination error tolerance, or a simulation data values termination tolerance can be used in conjunction with terminating one or more simulation runs; all valid, i.e, non-terminated, runs can still need to be within one or more set simulator tolerances. That is, simulator tolerance can relate to a numerical accuracy issue, whereas a simulation run termination error tolerance, a well termination error tolerance, or a simulation data values termination tolerance can relate to run termination criteria. For example, a simulation run termination error tolerance or a well termination error tolerance can be used to determine whether the numerical solution is within an acceptable error range of observed (historical) data. A simulator tolerance, on the other hand, can include, for example, numerical and material balance tolerances.

Figure 3:
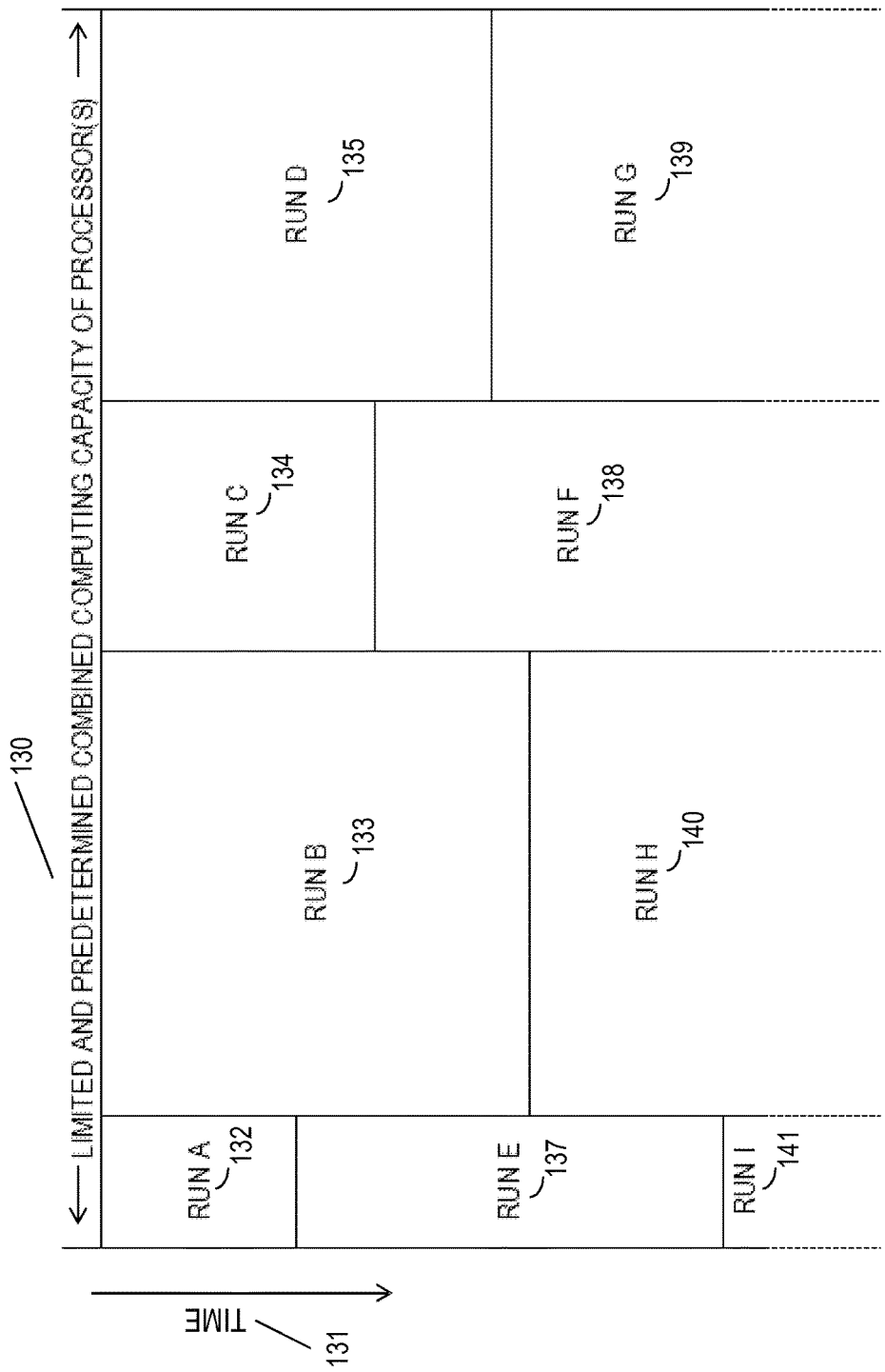
FIG. 3 is a schematic diagram of use of limited and predetermined combined computing capacity by hydrocarbon reservoir simulation runs over time according to an embodiment of the invention.

The limited and predetermined combined computing capacity of the one or more processors 101 can restrict the rate at which a system can run a plurality of fluid flow simulation runs, for example, including history-matching simulation runs, prediction simulation runs, or both. The use of limited and predetermined combined computing capacity 130 of one or more processors 101 over time 131 to run a plurality of simulation runs is illustrated, for example, in FIG. 3. As depicted in FIG. 3, for example, the illustrated system must run at least nine simulation runs, i.e., runs A-I. The limited and predetermined combined computing capacity 130 of the system's one or more processors 101, however, can restrict the first initiation of simulation runs to run A 132, run B 133, run C 134, and run D 135. The next simulation run queued to begin, run E 137, cannot start at the same time as run A 132, run B 133, run C 134, and run D 135 due to the limited and predetermined combined computing capacity 130. In the example illustrated in FIG. 3, Run E 137 begins after run A 132 has either completed or been terminated; the end of run A 132 causes increased processing availability within the limited and predetermined combined computing capacity 130 of the one or more processors 101. Similarly, run F 138 can begin after run C 134 ends, run G 139 can begin after run D 135 ends, run H 140 can begin after run B 133 ends, and run I 141 can being after run E 137 ends because processing availability has increased as a result of the termination of a simulation run. In another embodiment, one or more terminated runs can be restarted, and a restarted run can be queued to begin before new runs. As illustrated in FIG. 3, for example, some simulation runs can, in some cases, use more of the limited and predetermined combined computing capacity 130 of the one or more processors 101 than other simulation runs. Likewise, some simulation runs can require more time to run to completion than others. The time required for a simulation run can also be related to the computing capacity available to the simulation run. Because the rate at which a plurality of simulation runs can be completed depends on the limited and predetermined combined computing capacity 130 of the one or more processors 101, more efficient use of the limited and predetermined combined computing capacity 130 of the one or more processors 101 can allow a system to complete the plurality of simulation runs more quickly. That is, by reducing the number of simulation runs that run for their full-scheduled durations, the amount of time to accomplish one or more objectives of the simulation runs can be reduced. Although the number of simulation runs does not necessarily change, the number of simulation runs that are completed can be reduced. Early termination of non-useful simulation runs can thus save time required to complete a set of simulation runs.

A system in some circumstances can run solely history-matching simulation runs, and a system in other circumstances can run solely prediction simulation runs. But a system can also run both history-matching simulation runs and prediction simulation runs. For example, as illustrated in FIG. 3, run C 134 can be a history-matching simulation run while run D 135 is a prediction simulation run.

Embodiments of the invention that relate to both history-matching and prediction simulations can thus combine a smart algorithm and management rules to automatically cut down the number of simulation runs that run for their entire scheduled duration, i.e., their respective preselected time periods. For example, embodiments can reduce the number of history-matching simulation runs that run for their respective preselected time periods by stopping simulation runs that deviate from historical, observed data by more than a predetermined simulation run termination error tolerance, for example, in a history-matching simulation. Embodiments can also stop simulation runs that exceed or fall below some user-defined simulation data values termination tolerance in a typical prediction reservoir simulation study. For example, after a history-matching process or history-matching activities are completed, a history-matched hydrocarbon reservoir simulation model, such as one of the one or more calibrated hydrocarbon reservoir simulation models 122, can be used to develop prediction scenarios based on different development strategies. Embodiments of the invention can be used to assist reservoir engineers in eliminating development scenarios, i.e., development strategies, that do not meet objectives—as gauged by one or more preselected strategic outcome values—of a development strategy an early stage in the assessment. For instance, if a target, i.e., one of the one or more preselected strategic outcome values, has been set at 200,000 barrels per day of oil production plateau for N years, a simulation run can be terminated if field potential falls below the target early in the simulation run.

For both history-matching simulations and prediction simulations, increasing the level of confidence in tools used to evaluate field development plans can be of great importance, and embodiments of the invention can successfully increase that level of confidence. Embodiments of the invention can furthermore save considerable CPU time and computing resources (sometimes called "compute resources") when compared to conventional approaches, which rely on manual intervention by simulation engineers. Notably, embodiments can give simulation engineers the ability to efficiently manage their simulation cases by making decisions—based on certain predefined criteria (e.g., preselected values of one or more threshold variables) set by a user, such as a simulation engineer—whether to continue a simulation run or to instead stop it gracefully.

Advantageously, embodiments of the invention can thus reduce the number simulation runs—both history-matching and prediction—that run for their full-scheduled duration. Embodiments can consequently decrease the turnaround time to complete a study by shortening the time required to complete a large number of simulation runs. Moreover, embodiments of the invention can also offer up to a fifty percent (50%) CPU time saving, which in turn can allow better resource utilization among different studies. Embodiments of the invention can therefore enable petroleum engineers, for example, to complete their prediction and history-matching studies in a considerably shorter time frame, allowing the engineers to focus more on engineering work rather than worrying about managing the finite computing and storage resources that are available to them. Further, reservoir management rules can advantageously allow engineers to have control over the values of threshold variables that affect the performance of their numerical simulation models. Embodiments of the invention can automatically pick up rules, including those related to the preselected values of one or more threshold variables and termination criteria, established by an engineer and manage one or more simulation runs. Embodiments of the invention can also make decisions, on behalf the engineer, whether to continue a given simulation run.

In particular, for example, assisted history matching (AHM) in some instances can occupy approximately sixty percent (60%) of engineers' time and efforts. Moreover, continued use of conventional ways of submitting hundreds of simulation runs for a single assisted history-matching study can be impractical: model sizes and complexity are ever-increasing, and project timelines are growing relatively shorter than past timelines. Embodiments of the invention can enable engineers to kick off multiple, megascale assisted history-matching projects simultaneously, for example. Additionally, embodiments can advantageously reduce the number of simulation runs by thirty to fifty percent (30-50%), result in shorter turnaround times, and optimize the use of finite computing and storage resources. Embodiments can therefore potentially save an entity that performs hydrocarbon reservoir simulation runs millions of dollars per year in high-performance computing resources. AHM can also help with performing uncertainty-based prediction studies, for example, because the uncertainty that arises during AHM can be carried over to prediction studies. An engineer can then use the engineer's knowledge of the uncertainty in a hydrocarbon reservoir simulation model to select values of one or more threshold variables 119 for use in prediction simulations, for example.

In addition to systems, embodiments of the invention can also include computer-implemented methods. For example, an embodiment can include a computer-implemented method to enhance hydrocarbon reservoir simulation for a plurality of hydrocarbon reservoirs. A method related to history matching can include initiating 202, for each of the plurality of hydrocarbon reservoirs, each of a plurality of fluid flow simulation runs, as illustrated, for example, in FIG. 5 and FIG. 6. The plurality of fluid flow simulation runs can be configured to calibrate one or more hydrocarbon reservoir simulation models associated with the respective each of the plurality of hydrocarbon reservoirs. The plurality of fluid flow simulation runs can thereby define a plurality of history-matching simulation runs for the respective each of the plurality of hydrocarbon reservoirs. Each of the plurality of history-matching simulations run can be configured to operate for a respective preselected time period. Further, each respective preselected time period can include one or more time steps. Each of the plurality of history-matching simulation runs also can be configured to output 203 a simulation data set responsive to operation of the respective history-matching simulation run after each of the one or more time steps. Each simulation data set can include, for example, one or more simulation data values. The respective each of the plurality of hydrocarbon reservoirs can have a plurality of hydrocarbon wells, and the plurality of wells can collectively define a hydrocarbon field within the respective each of the plurality of hydrocarbon reservoirs. In addition, each of the one or more simulation data values can be configured to be associated with one of the plurality of hydrocarbon wells of the respective each of the plurality of hydrocarbon reservoirs.

Figure 5:
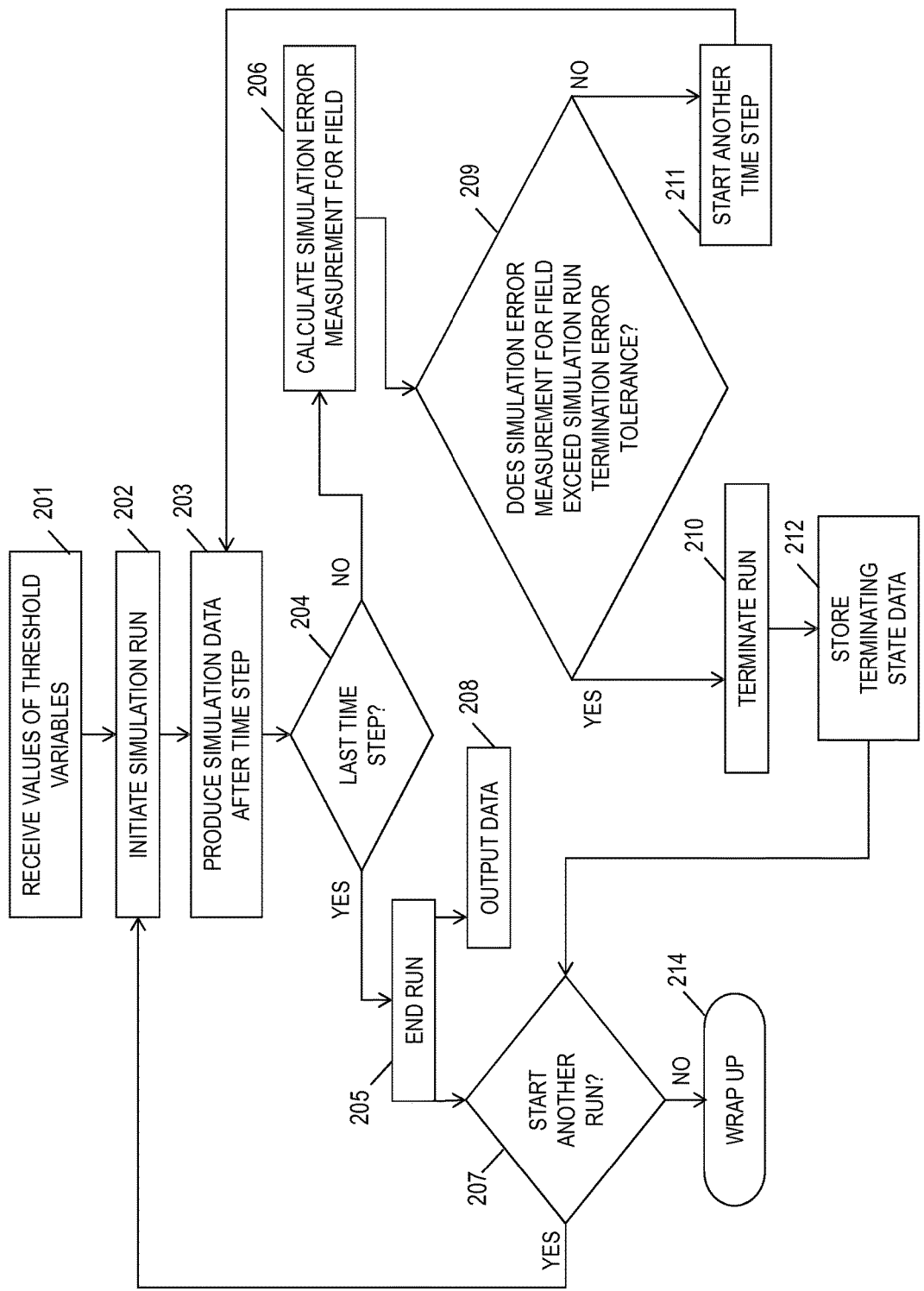
FIG. 5 is a schematic diagram of a method to enhance hydrocarbon reservoir simulation according to an embodiment of the invention.

A method can further include terminating 210—for each of the plurality of hydrocarbon reservoirs—each of a first set of one or more of the plurality of history-matching simulation runs earlier than the completion of the respective preselected time period responsive to output after a time step while continuing 211 a second set of another one or more of the plurality of history-matching simulation runs. For example, in some circumstances, a method can include terminating 210 the first set of history-matching simulation runs when each of the first set of history-matching simulation runs has a simulation error measurement for the hydrocarbon field that exceeds a predetermined simulation run termination error tolerance 209, as illustrated in FIG. 5, for example. In that example, each of the second set of history-matching simulation runs lacks a simulation error measurement for the hydrocarbon field that exceeds the predetermined simulation run termination error tolerance. The predetermined simulation run error tolerance can be related to preselected values of one or more threshold variables.

Figure 6:
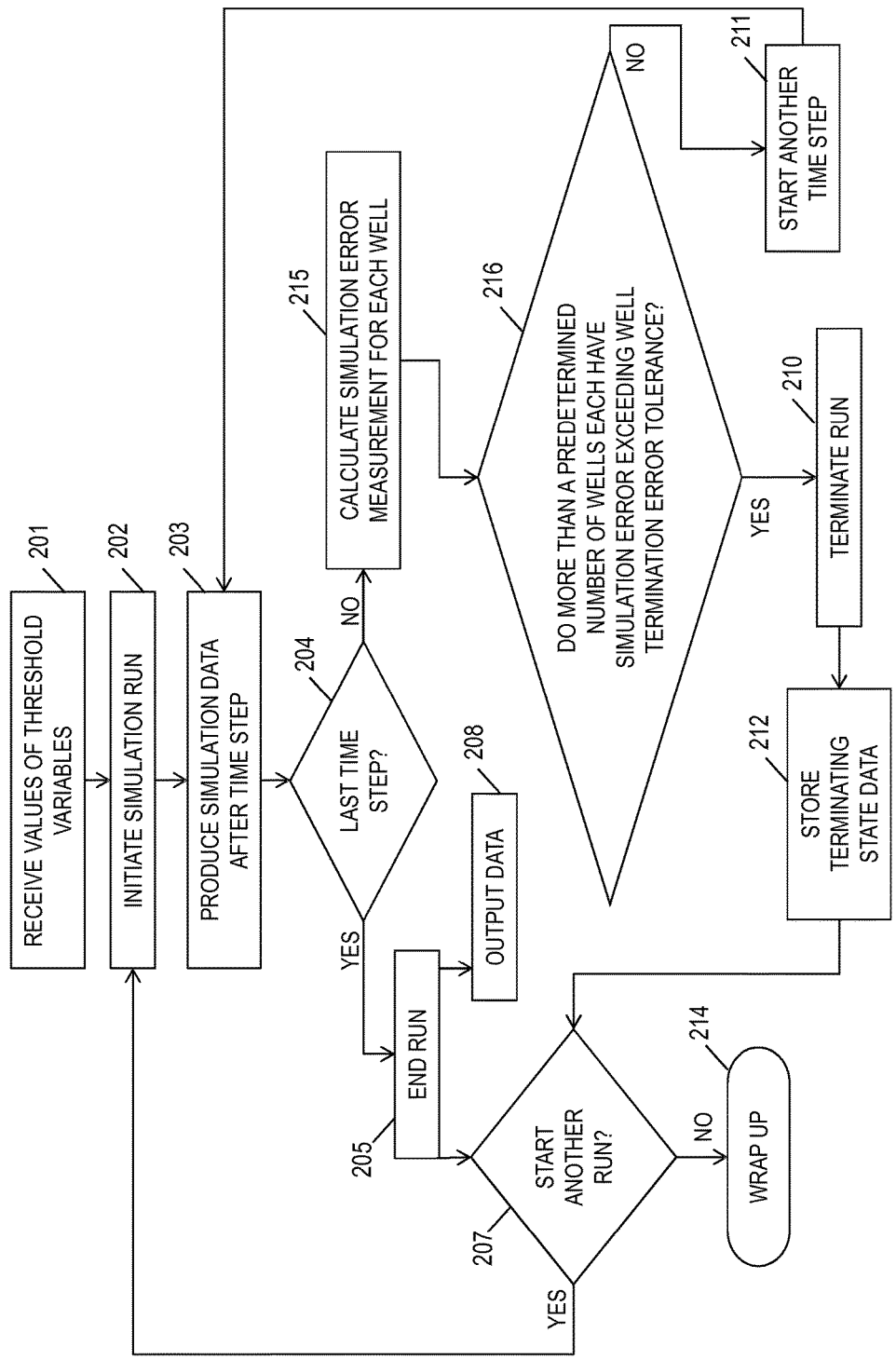
FIG. 6 is a schematic diagram of a method to enhance hydrocarbon reservoir simulation according to another embodiment of the invention.

In another embodiment, for example, a method can include terminating 210 the first set of history-matching simulation runs when more than a predetermined number of hydrocarbon wells in each of the first set of history-matching simulation runs each has a simulation error measurement for the hydrocarbon well that exceeds a predetermined well termination error tolerance 216, as illustrated in FIG. 6, for example. In that example, each of the second set of history-matching simulation runs has fewer than the predetermined number of hydrocarbon wells that each has a simulation error measurement for the hydrocarbon well exceeding the predetermined well termination error tolerance. The predetermined number of hydrocarbon wells and the predetermined well termination error tolerance can be related to preselected values of one or more threshold variables, for example.

A collective limited and predetermined combined computing capacity of one or more processors can be available responsive to simulation run usage and can be configured to have increased processing availability when the first set of history-matching simulation runs are terminated. Consequently, terminating 210 the first set of history-matching simulation runs can thereby increase processing availability for fluid flow simulation runs within the limited and predetermined combined computing capacity to another one or more fluid flow simulation runs being run and reduce total hydrocarbon reservoir simulation run time.

In some circumstances, each of the second set of history-matching simulation runs can operate simultaneously with another one or more of the second set of history-matching simulation runs after termination of the first set of history-matching simulation runs. Further, the plurality of history-matching simulation runs for each of the plurality of hydrocarbon reservoirs can include a predetermined number of history-matching simulation runs, and a sum of the predetermined numbers of history-matching simulation runs of the plurality of hydrocarbon reservoirs can define a predetermined total number of history-matching simulation runs. Completion of the predetermined total number of history-matching simulation runs can be scheduled to require a predetermined amount of time to thereby define a total expected completion time. Termination of the first set of history-matching simulation runs for each of the plurality of hydrocarbon reservoirs can advantageously cause operation of the predetermined total number of history-matching simulation runs to conclude earlier than the end of the total expected completion time.

A method, in some circumstances, can further include initiating another different history-matching simulation run, responsive to termination of a history-matching simulation run. One or more of the one or more processors that have increased processing availability responsive to the termination of the history-matching simulation run can be used to initiate the other, different history-matching simulation run. Use of the one or more of the one or more processors having increased processing availability responsive to the termination of the history-matching simulation run can thereby enable earlier initiation of the other history-matching simulation run.

The plurality of history-matching simulation runs can be configured, in some circumstances, to calibrate the one or more hydrocarbon reservoir simulation models associated with the respective each of the plurality of hydrocarbon reservoirs by comparison to a plurality of actual measured reservoir characteristic values for the respective each of the plurality of hydrocarbon reservoirs. Further, a simulation error measurement for the hydrocarbon field for a history-matching simulation run after a time step can be determined responsive to a comparison of (1) the one or more simulation data values of the simulation data set associated with the history-matching simulation run after the time step and (2) one or more of the plurality of actual measured reservoir characteristic values for the respective each of the plurality of hydrocarbon reservoirs. Additionally, a simulation error measurement for the hydrocarbon well for a history-matching simulation run after a time step can be determined responsive to a comparison of (1) the one or more simulation data values of the simulation data set associated with the history-matching simulation run after the time step and (2) one or more of the plurality of actual measured reservoir characteristic values for the respective each of the plurality of hydrocarbon reservoirs.

In some instances, a method can further include—for each of the plurality of hydrocarbon reservoirs—calculating one or more well difference deltas, for each of the plurality of history-matching simulation runs after a time step and responsive to receipt of one or more of the plurality of actual measured reservoir characteristic values for the respective each of the plurality of hydrocarbon reservoirs. The one or more well difference deltas can be deltas between each of the one or more simulation data values of the simulation data set associated with the time step and the one or more of the plurality of actual measured reservoir characteristic values. The well difference deltas can be based on a function of (1) each of the one or more simulation data values of the simulation data set associated with the time step, (2) each of the one or more of the plurality of actual measured reservoir characteristic values, and (3) a predetermined well weighting factor. A method can further include summing, for each of the plurality of hydrocarbon wells, each of the one or more well difference deltas associated with the respective hydrocarbon well. Summing each of the one or more well difference deltas associated with the respective hydrocarbon well can determine a well simulation discrepancy value. A method can also include, for example, determining a simulation error measurement for the hydrocarbon field, for each of the plurality of history-matching simulation runs. A simulation error measurement for the hydrocarbon field can be determined by use of the well simulation discrepancy values for each of the plurality of hydrocarbon wells of the hydrocarbon field. In another embodiment, a method can include determining a simulation error measurement for the hydrocarbon well, for each of the plurality of hydrocarbon wells in each of the plurality of history-matching simulation runs. A simulation error measurement for the hydrocarbon well can be determined by use of the well simulation discrepancy value, for example.

In some circumstances, a method can also include receiving 201 the preselected values of one or more threshold variables responsive to user input, as illustrated, for example, in FIG. 5 and FIG. 6. Further, in some instances, each processor of the one or more processors can have a limited and predetermined individual computing capacity. The limited and predetermined individual computing capacity of a processor, for example, can be a fractional portion of the limited and predetermined combined computing capacity of the one or more processors that is defined by a mathematical function of the limited and predetermined combined computing capacity and number of the one or more processors.

A method can further include, for example, restarting a terminated history-matching simulation run by use of one or more of the one or more processors having increased processing availability responsive to termination of a history-matching simulation run. Use of one or more of the one or more processors having increased processing availability responsive to termination of a history-matching simulation run can thereby enable earlier restarting of the terminated history-matching simulation run. In some instances, a method can still further include storing 212 data representative of a terminating state of a terminated history-matching simulation run, for each of the one or more terminated history-matching simulation runs. Terminating state data can be saved in a knowledge base for record keeping, for example. In addition, storing data representative of a terminating state of a terminated history-matching simulation run can, for example, thereby allow restarting of the terminated history-matching simulation run when desired responsive to the terminating state of the terminated history-matching simulation run. Further, terminating state data can also later be used for guidance to generate inputs of a new simulation run so as to avoid creating a new simulation run that is too close in the input data space to a previously terminated run.

Consequently, a method related to history matching can include, for example, receiving 201 preselected values of one or more threshold variables, initiating 202 a simulation run, and outputting 203 a simulation data set of a simulation run at a time step, as illustrated in FIG. 5 and FIG. 6. A method can then include determining 204 whether the time step was the last time step for the simulation run. If the time step was the last time step for the simulation run 204, a method can then include ending 205 the simulation run, outputting 208 data associated with the simulation run, and determining 207 whether to start another simulation run. If another simulation run is to be started 207, a method can include initiating 202 that simulation run. If no other simulation run is to be started 207, a method can include wrapping up 214 the simulation process. If the time step was not the last time step for the simulation run 204, a method can include calculating 206 a simulation error measurement for the hydrocarbon field at the time step then determining 209 whether the simulation error measurement for the hydrocarbon field exceeds a predetermined simulation run termination error tolerance, as illustrated, for example, in FIG. 5. If the simulation error measurement for the hydrocarbon field does not exceed a predetermined simulation run termination error tolerance 209, a method can include starting 211 another time step then outputting 203 a simulation data set of a simulation run at the time step. If the simulation error measurement for the hydrocarbon field exceeds a predetermined simulation run termination error tolerance 209, a method can include terminating 210 the simulation run. In another embodiment, a method can also include, if the time step was not the last time step for the simulation run 204, calculating 215 the simulation error measurement for the hydrocarbon well for each hydrocarbon well associated with the simulation run, as illustrated, for example, in FIG. 6. A method can then include determining 216 whether the number of hydrocarbon wells in the simulation that have a simulation error measurement for the hydrocarbon well exceeding a predetermined well termination error tolerance is greater than a predetermined number of hydrocarbon wells, as illustrated, for example, in FIG. 6. If the number of hydrocarbon wells exceeds the predetermined number of hydrocarbon wells 216, a method can include terminating 210 the simulation run. If the number of hydrocarbon wells does not exceed the predetermined number of hydrocarbon wells 216, a method can include starting 211 another time step then outputting a simulation data set of a simulation run at the time step 203. After terminating a simulation run 210, a method can then include storing 212 data representative of a terminating state of a terminated simulation run, as illustrated, for example, in FIG. 5 and FIG. 6. Further, a method can also include determining whether to restart the terminated simulation run. If the simulation run is not to be restarted, the simulation process can wrap up. If the simulation run is to be restarted, it is initiated.

Figure 11:
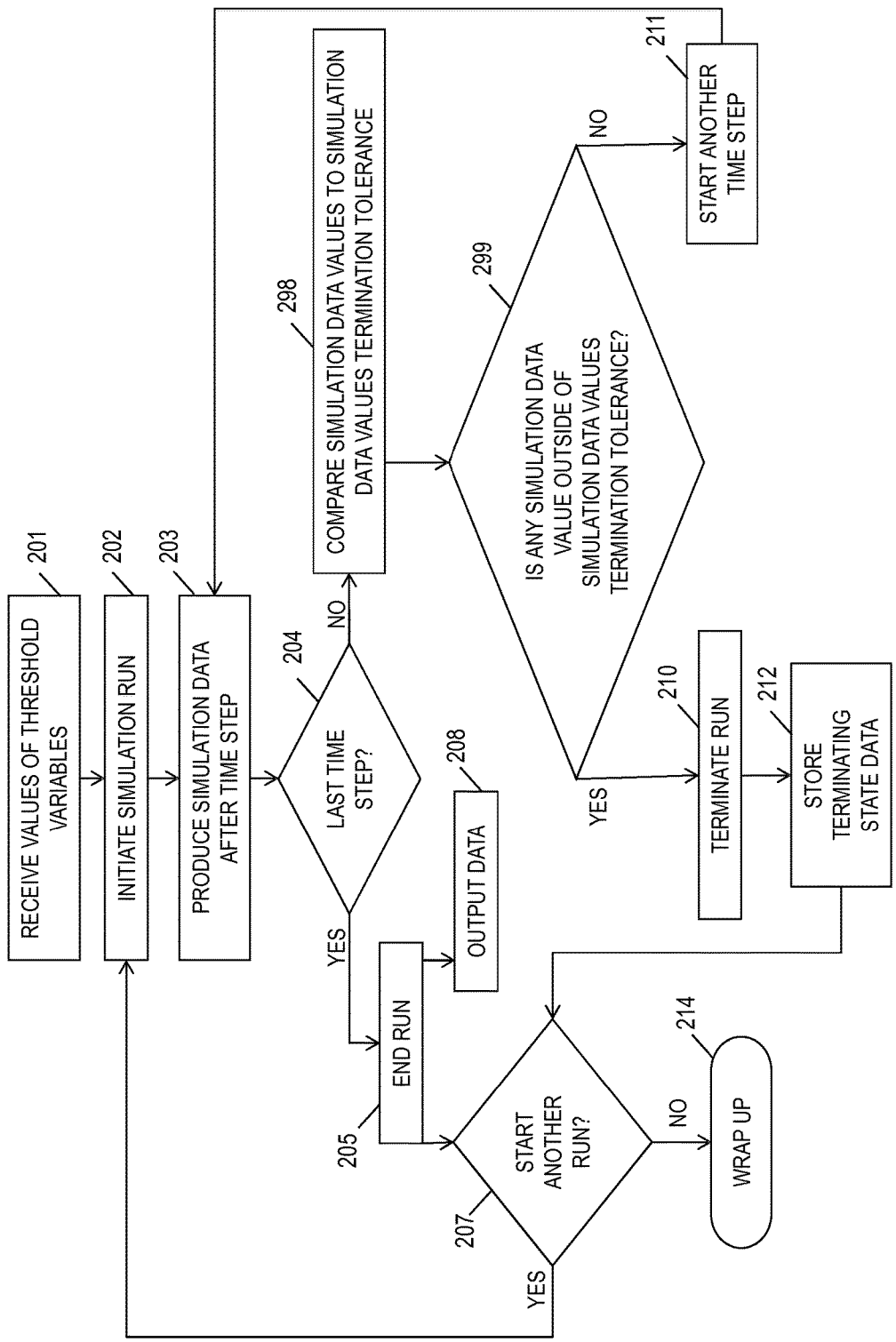
FIG. 11 is a schematic diagram of a method to enhance hydrocarbon reservoir simulation according to yet another embodiment of the invention.

A method according to yet another embodiment can include, for example, initiating 202, for each of the plurality of hydrocarbon reservoirs, each of a plurality of fluid flow simulation runs, as illustrated in FIG. 11, for example. The plurality of fluid flow simulation runs can be configured to predict future behavior of the respective each of the plurality of hydrocarbon reservoirs, and the plurality of fluid flow simulation runs can thereby define a plurality of prediction simulation runs. In addition, each of the plurality of prediction simulation runs can be configured to operate for a respective preselected time period, and each respective preselected time period can include one or more time steps. Further, each of the plurality of prediction simulation runs can be configured to output 203 a simulation data set responsive to operation of the respective prediction simulation run after each of the one or more time steps. Each simulation data set can include, for example, one or more simulation data values. Additionally, the respective each of the plurality of hydrocarbon reservoirs can have a plurality of wells. Each of the one or more simulation data values can be configured to be associated with one of the plurality of hydrocarbon wells.

A method can also include terminating 210, for each of the plurality of hydrocarbon reservoirs, each of a first set of one or more of the plurality of prediction simulation runs earlier than the completion of the respective preselected time period, responsive to output after a time step, while continuing a second set of another one or more of the plurality of prediction simulation runs. The first set of prediction simulation runs can be terminated when one or more of the one or more simulation data values of the simulation data set associated with each of the first set of prediction simulation runs after the time step are outside of a simulation data values termination tolerance 299. Each of the one or more simulation data values of the simulation data set associated with each of the second set of prediction simulation runs after the time step, however, can be included within the simulation data values termination tolerance. The simulation data values termination tolerance can be related to the preselected values of one or more threshold variables, for example. A collective limited and predetermined combined computing capacity of one or more processors can be configured to have increased processing availability when the first set of prediction simulation runs are terminated. The limited and predetermined combined computing capacity can be available responsive to simulation run usage, for instance. Consequently, terminating the first set of prediction simulation runs can thereby increase processing availability for fluid flow simulation runs within the limited and predetermined combined computing capacity to another one or more fluid flow simulation runs being run and reduce total hydrocarbon reservoir simulation run time.

In some circumstances, each of the second set of prediction simulation runs can operate simultaneously with another one or more of the second set of prediction simulation runs after termination of the first set of prediction simulation runs. Further, the plurality of prediction simulation runs for each of the plurality of hydrocarbon reservoirs can include a predetermined number of prediction simulation runs, and a sum of the predetermined numbers of prediction simulation runs of the plurality of hydrocarbon reservoirs can define a predetermined total number of prediction simulation runs. Completion of the predetermined total number of prediction simulation runs can be scheduled to require a predetermined amount of time to thereby define a total expected completion time. Termination of the first set of prediction simulation runs for each of the plurality of hydrocarbon reservoirs can advantageously cause operation of the predetermined total number of prediction simulation runs to conclude earlier than the end of the total expected completion time.

Additionally, the plurality of prediction simulation runs can be configured to predict future behavior of the respective each of the plurality of hydrocarbon reservoirs by use of one or more hydrocarbon reservoir simulation models associated with the respective each of the plurality of hydrocarbon reservoirs. The one or more hydrocarbon reservoir models can have been calibrated by use of a plurality of actual measured reservoir characteristic values to thereby define one or more calibrated hydrocarbon reservoir simulation models. In addition, each of the plurality of prediction simulation runs can be associated with a future course of action to develop the respective each of the plurality of hydrocarbon reservoirs associated with the respective prediction simulation run. Such a future course of action can thereby define a development strategy. Further, the preselected values of one or more threshold variables and the simulation data values termination tolerance can be associated with one or more preselected strategic outcome values of one or more development strategies. In some circumstances, a method can further include storing data representative of a terminating state of a terminated prediction simulation run, for each of the one or more terminated prediction simulation runs, to thereby allow investigation of the development strategy associated with the terminated prediction simulation run when desired responsive to the terminating state of the terminated prediction simulation run. Additionally, the one or more preselected strategic outcome values of one or more development strategies can include a preselected maximum water cut measurement for one or more of the plurality of hydrocarbon reservoirs, for example.

A method can also include receiving 201 the preselected values of one or more threshold variables responsive to user input. A method can further include initiating, responsive to termination of a prediction simulation run, another different prediction simulation run by use of one or more of the one or more processors having increased processing availability responsive to the termination of the prediction simulation run, which can thereby enable earlier initiation of the other prediction simulation run. In some instances, each processor of the one or more processors can have a limited and predetermined individual computing capacity, and the limited and predetermined individual computing capacity of a processor can be a fractional portion of the limited and predetermined combined computing capacity of the one or more processors defined by a mathematical function of the limited and predetermined combined computing capacity and number of the one or more processors.

Consequently, a method related to prediction simulations can include, for example, receiving 201 preselected values of one or more threshold variables, initiating a simulation run 202, and outputting 203 a simulation data set of a simulation run at a time step, as illustrated in FIG. 11, for instance. A method can then include determining 204 whether the time step was the last time step for the simulation run. If the time step was the last time step for the simulation run 204, a method can then include ending 205 the simulation run, outputting 208 data associated with the simulation run, and determining 207 whether to start another simulation run. If another simulation run is to be started 207, a method can include initiating 202 that simulation run. If no other simulation run is to be started 207, a method can include wrapping up 214 the simulation process. If the time step was not the last time step for the simulation run 204, a method can include comparing 298 simulation data values at the time step to a simulation data values termination tolerance then determining 299 whether any of the simulation data values is outside of the simulation data values termination tolerance, as illustrated, for example, in FIG. 11. If all of the simulation data values are within the simulation data values termination tolerance 299, a method can include starting 211 another time step then outputting 203 a simulation data set of a simulation run at the time step. If any of the simulation data values is outside of the simulation data values termination tolerance 299, though, a method can include terminating 210 the simulation run. After terminating 210 a simulation run, a method can then include storing 212 data representative of a terminating state of a terminated simulation run. Further, a method can also include determining whether to restart the terminated simulation run. If the simulation run is not to be restarted, the simulation process can wrap up. If the simulation run is to be restarted, it is initiated.

Figure 4:
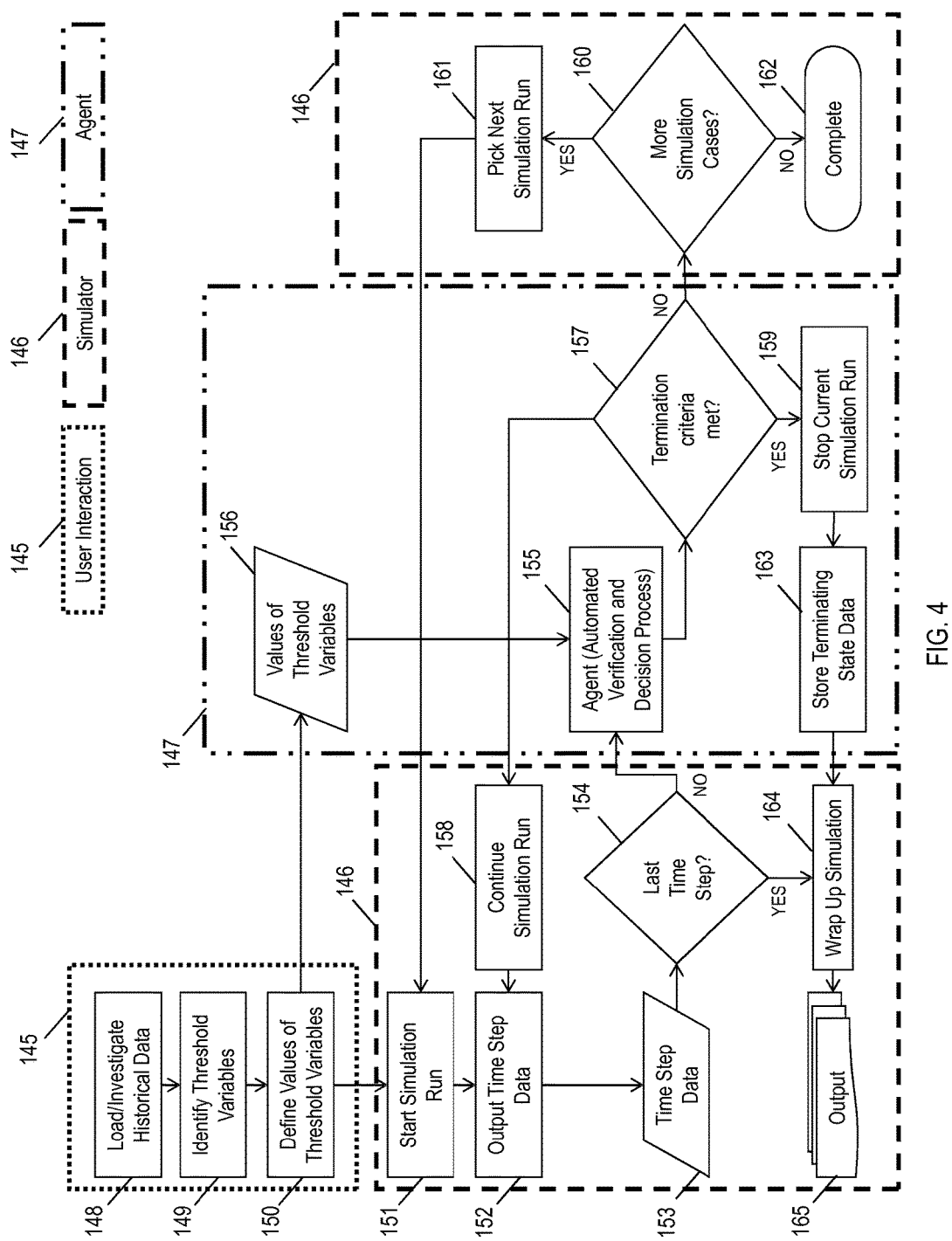
FIG. 4 is a schematic diagram of a method to enhance hydrocarbon reservoir simulation according to an embodiment of the invention.

An engineer, for example, can first investigate historical data associated with a hydrocarbon reservoir that the engineer intends to history match or for which the engineer intends to perform a prediction simulation. Using knowledge about the reservoir, the engineer can define values of one or more threshold variables to guide a smart algorithm agent in making the right decision of whether to keep a simulation run or to terminate the simulation run. Control can then be transferred to a simulator to launch simulation runs (sometimes called "simulation jobs" or "simulation cases"). Once a launched simulation run reaches a time step, other than the final time step, the smart algorithm agent can pick up and automatically commence a verification and decision-making process based on the values of one or more threshold variables as previously defined by the engineer. The algorithm can then decide whether to terminate the simulation run or, alternatively, to return control back to the simulator to continue the simulation run. The agent can then monitor simulation activities until the last time step of the last simulation run is reached and no more simulation runs to execute exist. For instance, a method according to an embodiment of the invention is illustrated, for example, in FIG. 4, which can also be applicable to other embodiments, as well. As depicted in FIG. 4, for example, a hydrocarbon reservoir simulation process can include user interaction 145, simulator action 146, and action by an agent 147 according to embodiments of the invention. An agent according to embodiments of the invention is sometimes described herein as a smart algorithm agent.

User interaction 145 can include, for example, loading and investigating historical data 148. That is, a user can load historical data from different sources, such as a database or flat files, into a line plot visualization package for investigation, for example. Historical data can include actual measured reservoir characteristic values, for example. User interaction 145 can also include identifying one or more threshold variables 149 and defining values of one or more threshold variables 150. For example, one or more threshold variables and values of the one or more threshold variables can be identified by visual investigation or by running sensitivity analysis. The user, such as an engineer, can define values of one or more threshold variables using the user's knowledge and observations, for example. Values of one or more threshold variables can be defined based on an objective of the reservoir study; consequently, a predetermined simulation run termination error tolerance, a predetermined well termination error tolerance, and a simulation data values termination tolerance can also be subject to the objectives of a reservoir study. Reservoir pressure, fluids production or injection rates, fluids cumulative production, and injection can be examples of threshold variables. The values of one or more threshold variables 156 can then be outputted to a file accessible to the agent. Simulator action 146 can then begin.

Simulator action 146 can include processes controlled by a simulator, as will be understood by those skilled in the art. For example, simulator action 146 can include starting a simulation run 151, outputting time step data 152 to produce time step data 153, and then determining whether the time step was the last time step to be performed by the simulator 154. If the time step was the last time step to be performed by the simulator 154, simulator action 146 can then include wrapping up the simulation run 164 to produce output 165. Output 165 and time step data 153 can both include, for example, simulated hydrocarbon well data such as production, injection, and pressure data. If the time step was not the last time step to be performed by the simulator 154, though, agent action 147 can begin. For example, the agent can perform an automated verification and decision process 155 using the values of one or more threshold variables 156. It can then determine whether any termination criteria has been met 157. Termination criteria can be met 157, in the context of a history-matching simulation run, for example, when a simulation error measurement for a hydrocarbon field exceeds a predetermined simulation run termination error tolerance or, alternatively, when more than a predetermined number of hydrocarbon wells each has a simulation error measurement for the hydrocarbon well exceeding a predetermined well termination error tolerance. In the context of a prediction simulation run, however, termination criteria can be met 157 when one or more of the one or more simulation data values of the simulation data set are outside of a simulation data values termination tolerance, for example. If no termination criteria has been met 157, simulator action 146 can resume by continuing the simulation run 158 then outputting time step data 152. If one of the termination criteria has been met 157, however, agent action 147 can include stopping the current simulation run 159. Agent action 147 can then include storing terminating state data 163 before simulator action 146 resumes to wrap up the simulation run 164. After stopping the current simulation run 159, simulator action 146 can further include determining whether more simulation runs to be performed exist 160. If more simulation runs to be performed exist 160, simulator actions can include picking a next simulation run to be performed 161 then starting the simulation run 151. If no additional simulation runs exist 160, the simulation process is complete 162.

In some embodiments, a key process within the smart algorithm agent, according to embodiments of the invention, can be the automated verification and decision process 155. For example, for history-matching simulations, an engineer-user can choose to control the simulation run using at least two options—i.e., according to one or more of at least two embodiments related to history matching—for the automated verification and decision process 155. For example, in at least a first option, the automated verification and decision process 155 can include first calculating the difference between historical and simulation data. For example, a calculation can include determining delta ($\Delta$), where:

$$\Delta = \left( \frac{(\text{history} - sim)}{(\text{history} + sim)/2} * 100 \right) * \text{well\_i}_{weight}$$

In the formula above, delta ($\Delta$) can be a well difference delta. Further, "history" can represent a historical, observed value (i.e., an actual measured reservoir characteristic value), such as, for example, one or more of the plurality of actual measured reservoir characteristic values for the hydrocarbon reservoir associated with the simulation run. Likewise, "sim" can represent one or more simulation data values of the simulation data set associated with the simulation run at the time step. Further, well\_$i_{weight}$ can represent a predetermined well weighting factor associated with a hydrocarbon well. One or more $\Delta$s can be determined for each of one or more hydrocarbon wells. The automated verification and decision process 155 can then include calculating an error from each hydrocarbon well from each point of interest to be accumulated in a global error measurement. For example, calculations for a plurality of hydrocarbon wells can include:

$\Delta_{well\_1} = \Delta_1 + \Delta_2 + \Delta_3$ $\Delta_{well\_2} = \Delta_1 + \Delta_2 + \Delta_3$ $\Delta_{well\_3} = \Delta_1 + \Delta_2 + \Delta_3$ $\Delta_{global} = \Delta_{well\_1} + \Delta_{well\_2} + \Delta_{well\_3} + \ldots$ In the formulas above, for example, $\Delta_{well\_i}$ can represent an error measurement for hydrocarbon well i, i.e., a well discrepancy value, and $\Delta_{global}$ can represent a global error measurement. The automated verification and decision process 155 can then include calculating an error percentage, or percent error, which can then allow the agent to make a decision to terminate or continue the simulation run. For example, calculations can include:

$$err = \left( \frac{\Delta_{well\_1}}{no.hist. \text{ points}} \right)^2 + \left( \frac{\Delta_{well\_2}}{no.hist. \text{ points}} \right)^2 + \left( \frac{\Delta_{well\_3}}{no.hist. \text{ points}} \right)^2 + \ldots$$

$\% \; err = \sqrt{err}$

In the formula above, % err can be a simulation error measurement for the hydrocarbon field. After a simulation error measurement for the hydrocarbon field (% err in the formula above) is calculated, the agent can make a decision to terminate or continue the simulation run based on a predetermined simulation run termination error tolerance. For example, if a simulation error measurement for the hydrocarbon field is greater than a predetermined simulation run termination error tolerance, the agent can decide to terminate the simulation run, whereas it can continue a simulation run for which a simulation error measurement for the hydrocarbon field is not greater than the predetermined simulation run termination error tolerance. An error measurement related to $\Delta_{global}$ can alternatively be used for comparison against a tolerance, such as the predetermined simulation run termination error tolerance.

In at least a second option, for example, an engineer-user can identify a number of key hydrocarbon wells to match at a defined point in time. Termination criteria, e.g., a predetermined well termination error tolerance, for a given well can then be defined, for example, by using calculations including:

$\Delta_{well\_1} = \Delta_1 + \Delta_2 + \Delta_3$ $err \left( \frac{\Delta_{well\_1}}{no.hist. \text{ points}} \right)^2$ $\% \; err = \sqrt{err}$ if ($\%\;err$ > tolerance) then #Failed Wells = #Failed Wells + 1

In the formula above, for example, "no. hist. points" can include the number of "history" values used to determine $\Delta$s. That is, it can include the number of actual measured reservoir characteristic values used to determine $\Delta$s, for example. Further, in the formulas above, "% err" can be a simulation error measurement for the hydrocarbon well, and "tolerance" can be a predetermined well termination error tolerance. A minimum number of wells that need to converge, within the predetermined well termination error tolerance, for an acceptable history match—i.e., a predetermined number of hydrocarbon wells—can then be defined. The automated verification and decision process 155 can then stop the simulation run if the minimum number of wells is not met at the defined point in time. For example, determinations can include:

if (#Failed Wells > #Min Converge Wells) then
    stop
else
    continue

Embodiments of the invention can also include non-transitory computer-readable medium having one or more computer programs stored therein operable by one or more processors to enhance hydrocarbon reservoir simulation for a plurality of hydrocarbon reservoirs, for example. The one or more computer programs can include a set of instructions that, when executed by the one or more processors, cause the one or more processors to perform a series of operations. Operations can include, for example, initiating—for each of the plurality of hydrocarbon reservoirs—each of a plurality of fluid flow simulation runs. The plurality of fluid flow simulation runs can be configured to calibrate one or more hydrocarbon reservoir simulation models associated with the respective each of the plurality of hydrocarbon reservoirs. The plurality of fluid flow simulation runs, consequently, can thereby define a plurality of history-matching simulation runs. Each of the plurality of history-matching simulation runs can be configured to operate for a respective preselected time period, and each respective preselected time period can include one or more time steps. Each of the plurality of history-matching simulation runs also can be configured to output a simulation data set responsive to operation of the respective history-matching simulation run after each of the one or more time steps. Each simulation data set, for example, can include one or more simulation data values. Further, the respective each of the plurality of hydrocarbon reservoirs can have a plurality of hydrocarbon wells, and the plurality of hydrocarbon wells can collectively define a hydrocarbon field within the respective each of the plurality of hydrocarbon reservoirs. Each of the one or more simulation data values can be configured to be associated with one of the plurality of hydrocarbon wells associated with the respective each of the plurality of hydrocarbon reservoirs.

Operations can further include terminating, for each of the plurality of hydrocarbon reservoirs, each of a first set of one or more of the plurality of history-matching simulation runs earlier than the completion of the respective preselected time period, responsive to output after a time step, while continuing a second set of another one or more of the plurality of history-matching simulation runs. For example, the first set of history-matching simulation runs can be terminated when each has a simulation error measurement for the hydrocarbon field that exceeds a predetermined simulation run termination error tolerance. In that example, each of the second set of history-matching simulation runs each lacks a simulation error measurement for the hydrocarbon field that exceeds the predetermined simulation run termination error tolerance. The predetermined simulation run termination error tolerance can be related to preselected values of one or more threshold variables.

In an example according to another embodiment, the first set of history-matching simulation runs can be terminated when more than a predetermined number of hydrocarbon wells in each of the first set of history-matching simulation runs each has a simulation error measurement for the hydrocarbon well that exceeds a predetermined well termination error tolerance. In that example, each of the second set of history-matching simulation runs has fewer than the predetermined number of hydrocarbon wells that each has a simulation error measurement for the hydrocarbon well that exceeds the predetermined well termination error tolerance. Further, the predetermined number of hydrocarbon wells and the predetermined well termination error tolerance can be related to preselected values of one or more threshold variables.

A collective limited and predetermined combined computing capacity of the one or more processors can be available responsive to simulation run usage and can be configured to have increased processing availability when the first set of history-matching simulation runs are terminated. Terminating the first set of history-matching simulation runs can thereby increase processing availability for fluid flow simulation runs within the limited and predetermined combined computing capacity to another one or more fluid flow simulation runs being run. Consequently, terminating the first set of history-matching simulation runs can reduce total hydrocarbon reservoir simulation run time.

For example, each of the second set of history-matching simulation runs can operate simultaneously with another one or more of the second set of history-matching simulation runs after termination of the first set of history-matching simulation runs. Further, the plurality of history-matching simulation runs for each of the plurality of hydrocarbon reservoirs can include a predetermined number of history-matching simulation runs, and a sum of the predetermined numbers of history-matching simulation runs of the plurality of hydrocarbon reservoirs can define a predetermined total number of history-matching simulation runs. Completion of the predetermined total number of history-matching simulation runs can be scheduled to require a predetermined amount of time to thereby define a total expected completion time. Termination of the first set of history-matching simulation runs for each of the plurality of hydrocarbon reservoirs can advantageously cause operation of the predetermined total number of history-matching simulation runs to conclude earlier than the end of the total expected completion time.

In some non-transitory computer-readable medium having one or more computer programs stored therein, according to an embodiment of the invention, the set of instructions, when executed by the one or more processors, can further cause the one or more processors to perform additional operations. For example, operations can further include initiating, responsive to termination of a history-matching simulation run, another different history-matching simulation run. One or more of the one or more processors that have increased processing availability responsive to the termination of the history-matching simulation run can be used to initiate the other, different history-matching simulation run. Use of one or more of the one or more processors that have increased processing availability responsive to termination of the history-matching simulation run can thereby enable earlier initiation of the other history-matching simulation run.

The plurality of history-matching simulation runs can be configured to calibrate the one or more hydrocarbon reservoir simulation models associated with the respective each of the plurality of hydrocarbon reservoirs by comparison to a plurality of actual measured reservoir characteristic values for the respective each of the plurality of hydrocarbon reservoirs. Further, a simulation error measurement for the hydrocarbon field for a history-matching simulation run after a time step can be determined responsive to a comparison of (1) the one or more simulation data values of the simulation data set associated with the history-matching simulation run after the time step and (2) one or more of the plurality of actual measured reservoir characteristic values for the respective each of the plurality of hydrocarbon reservoirs. Likewise, a simulation error measurement for the hydrocarbon well for a history-matching simulation run after a time step can be determined responsive to a comparison of (1) the one or more simulation data values of the simulation data set associated with the history-matching simulation run after the time step and (2) one or more of the plurality of actual measured reservoir characteristic values for the respective each of the plurality of hydrocarbon reservoirs.

In some non-transitory computer-readable medium having one or more computer programs stored therein, according to an embodiment of the invention, the set of instructions, when executed by the one or more processors, can further cause the one or more processors to perform other additional operations. Operations for each of the plurality of hydrocarbon reservoirs can further include, for example, calculating one or more well difference deltas for each of the plurality of history-matching simulation runs after a time step. The well difference deltas can be responsive to receipt of one or more of the plurality of actual measured reservoir characteristic values for the respective each of the plurality of hydrocarbon reservoirs. Further, the one or more well difference deltas can be deltas between each of the one or more simulation data values of the simulation data set associated with the time step and the one or more of the plurality of actual measured reservoir characteristic values. The well difference deltas can also be based on a function of (1) each of the one or more simulation data values of the simulation data set associated with the time step, (2) each of the one or more of the plurality of actual measured reservoir characteristic values, and (3) a predetermined well weighting factor. Operations can then include summing, for each of the plurality of hydrocarbon wells, each of the one or more well difference deltas associated with the respective hydrocarbon well. Summing each of the one or more well difference deltas can determine a well simulation discrepancy value. In some circumstances, for example, operations can still further include determining, for each of the plurality of history-matching simulation runs, a simulation error measurement for the hydrocarbon field by use of the well simulation discrepancy values for each of the plurality of hydrocarbon wells of the hydrocarbon field. In another embodiment, for example, operations can include determining, for each of the plurality of hydrocarbon wells in each of the plurality of history-matching simulation runs, a simulation error measurement for the hydrocarbon well by use of the well simulation discrepancy value.

In some non-transitory computer-readable medium having one or more computer programs stored therein, according to an embodiment of the invention, the set of instructions, when executed by the one or more processors, can further cause the one or more processors to perform additional operations, such as, for example, receiving the preselected values of one or more threshold variables responsive to user input. Additionally, each processor of the one or more processors can have a limited and predetermined individual computing capacity. The limited and predetermined individual computing capacity of a processor can be, for example, a fractional portion of the limited and predetermined combined computing capacity of the one or more processors that is defined by a mathematical function of the limited and predetermined combined computing capacity and number of the one or more processors.

In some non-transitory computer-readable medium having one or more computer programs stored therein, according to an embodiment of the invention, the set of instructions, when executed by the one or more processors, can further cause the one or more processors to perform other additional operations. For example, operations can further include restarting a terminated history-matching simulation run by use of one or more of the one or more processors having increased processing availability responsive to termination of a history-matching simulation run. Use of one or more of the one or more processors that have increased processing availability responsive to termination of the history-matching simulation run can thereby enable earlier restarting of the terminated history-matching simulation run. In some instances, operations can then further include storing data representative of a terminating state of a terminated history-matching simulation run, for each of the one or more terminated history-matching simulation runs. Storing data representative of a terminating state of a terminated simulation run can thereby allow restarting of the terminated history-matching simulation run when desired responsive to the terminating state of the terminated history-matching simulation run.

In some non-transitory computer-readable medium having one or more computer programs stored therein according to yet another embodiment, the one or more computer programs can include a set of instructions that, when executed by the one or more processors, cause the one or more processors to perform a series of operations. The operations can include, for example, initiating—for each of a plurality of hydrocarbon reservoirs—each of a plurality of fluid flow simulation runs. The plurality of fluid flow simulation runs can be configured to predict future behavior of the respective each of the plurality of hydrocarbon reservoirs. The plurality of fluid flow simulation runs can thereby define a plurality of prediction simulation runs. In addition, each of the plurality of prediction simulation runs can be configured to operate for a respective preselected time period, and each respective preselected time period can include one or more time steps. Each of the plurality of prediction simulation runs also can be configured to output a simulation data set responsive to operation of the respective prediction simulation run after each of the one or more time steps. Each simulation data set can include one or more simulation data values, and the respective each of the plurality of hydrocarbon reservoirs can have a plurality of hydrocarbon wells. Each of the one or more simulation data values can be configured to be associated with one of the plurality of hydrocarbon wells.

The operations can further include terminating, for each of the plurality of hydrocarbon reservoirs, each of a first set of one or more of the plurality of prediction simulation runs earlier than the completion of the respective preselected time period, responsive to output after a time step, while continuing a second set of another one or more of the plurality of prediction simulation runs. The first set of prediction simulation runs can be terminated when one or more of the one or more simulation data values of the simulation data set associated with each of the first set of prediction simulation runs after the time step are outside of a simulation data values termination tolerance. Each of the one or more simulation data values of the simulation data set associated with each of the second set of prediction simulation runs after the time step, on the other hand, can be included within the simulation data values termination tolerance. The simulation data values termination tolerance can be related to the preselected values of one or more threshold variables, for example. A collective limited and predetermined combined computing capacity of the one or more processors can be available responsive to simulation run usage and can be configured to have increased processing availability when the first set of prediction simulation runs are terminated. Terminating the first set of prediction simulation runs while continuing a second set of prediction simulation runs can thereby increase processing availability for fluid flow simulation runs within the limited and predetermined combined computing capacity to another one or more fluid flow simulation runs being run. Consequently, terminating the first set of prediction simulation runs while continuing the second set of prediction simulation runs can reduce total hydrocarbon reservoir simulation run time.

For example, each of the second set of prediction simulation runs can operate simultaneously with another one or more of the second set of prediction simulation runs after termination of the first set of prediction simulation runs. Further, the plurality of prediction simulation runs for each of the plurality of hydrocarbon reservoirs can include a predetermined number of prediction simulation runs, and a sum of the predetermined numbers of prediction simulation runs of the plurality of hydrocarbon reservoirs can define a predetermined total number of prediction simulation runs. In addition, completion of the predetermined total number of prediction simulation runs can be scheduled to require a predetermined amount of time to thereby define a total expected completion time. Termination of the first set of prediction simulation runs for each of the plurality of hydrocarbon reservoirs can advantageously cause operation of the predetermined total number of prediction simulation runs to conclude earlier than the end of the total expected completion time.

In some circumstances, the plurality of prediction simulation runs can be configured to predict future behavior of the respective each of the plurality of hydrocarbon reservoirs by use of one or more hydrocarbon reservoir simulation models associated with the respective each of the plurality of hydrocarbon reservoirs. The one or more hydrocarbon reservoir models can have been calibrated by use of a plurality of actual measured reservoir characteristic values to thereby define one or more calibrated hydrocarbon reservoir simulation models. Further, each of the plurality of prediction simulation runs can be associated with a future course of action to develop the respective each of the plurality of hydrocarbon reservoirs associated with the respective prediction simulation run to thereby define a development strategy. The preselected values of one or more threshold variables and the simulation data values termination tolerance can be associated with one or more preselected strategic outcome values of one or more development strategies. In addition, the set of instructions, when executed by the one or more processors, can further cause the one or more processors to perform the operation of storing data representative of a terminating state of a terminated prediction simulation run, for each of the one or more terminated prediction simulation runs. Storing such data can thereby allow investigation of the development strategy associated with the terminated prediction simulation run when desired responsive to the terminating state of the terminated prediction simulation run. Additionally, the one or more preselected strategic outcome values of one or more development strategies can include a preselected maximum water cut measurement for one or more of the plurality of hydrocarbon reservoirs, for example.

In some non-transitory computer-readable medium having one or more computer programs stored therein, the set of instructions, when executed by the one or more processors, can further cause the one or more processors to perform the operation of initiating, responsive to termination of a prediction simulation run, another different prediction simulation run. Initiating another different prediction simulation run can be by use of one or more of the one or more processors having increased processing availability responsive to the termination of the prediction simulation run and can thereby enable earlier initiation of the other prediction simulation run. Additionally, each processor of the one or more processors can have a limited and predetermined individual computing capacity. The limited and predetermined individual computing capacity of a processor can be a fractional portion of the limited and predetermined combined computing capacity of the one or more processors defined by a mathematical function of the limited and predetermined combined computing capacity and number of the one or more processors. Furthermore, the set of instructions, when executed by the one or more processors, can further cause the one or more processors to perform the operation of receiving the preselected values of one or more threshold variables responsive to user input.

Figure 9:
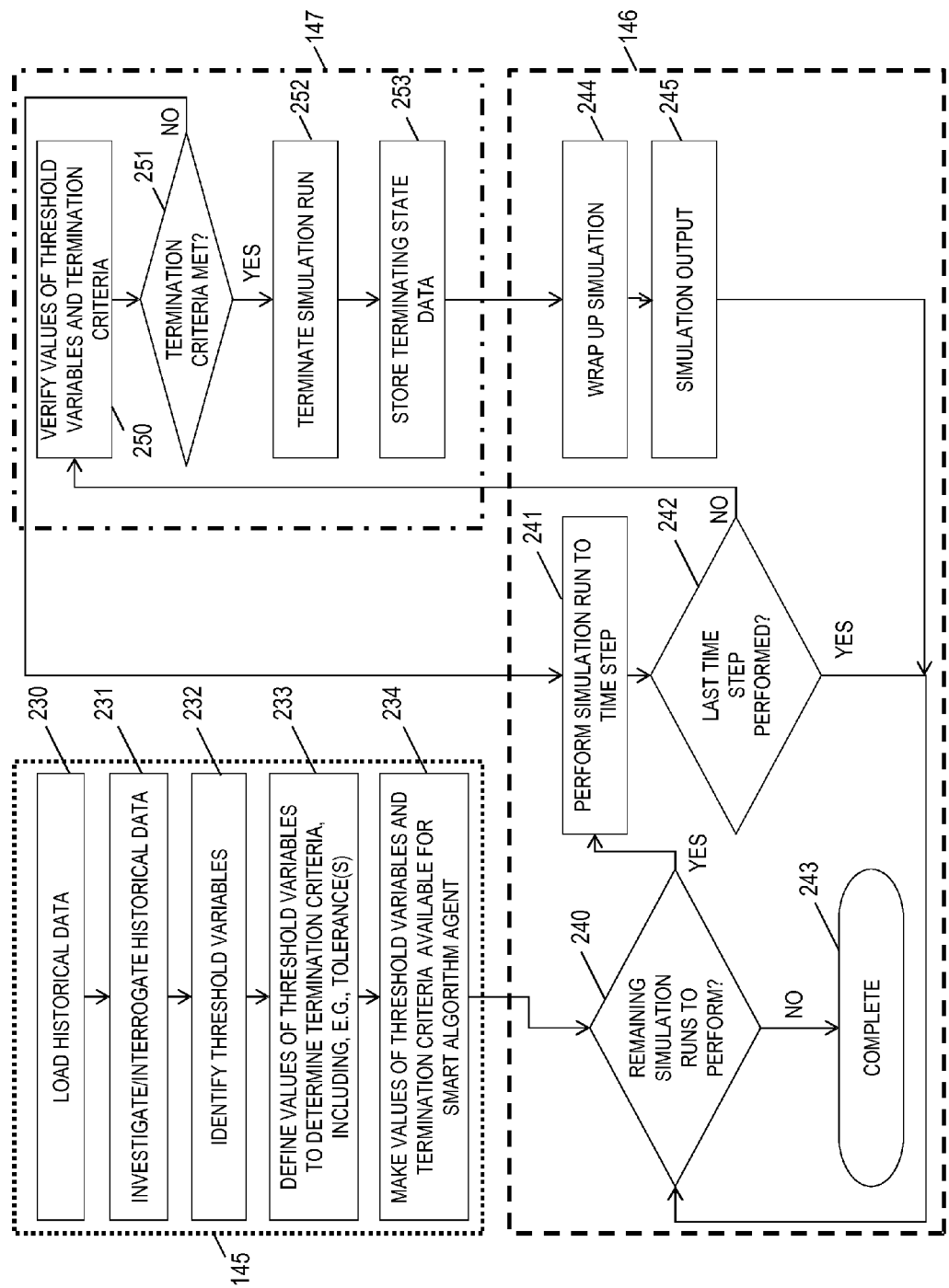
FIG. 9 is a schematic diagram of a method to enhance hydrocarbon reservoir simulation according to an embodiment of the invention.

For example, an algorithm, according to embodiments related to both history-matching and prediction simulations, can include the following steps, as illustrated in FIG. 9, for example. User interaction 145 can include loading historical data 230 and investigating or interrogating historical data 231. Historical data can include, for example, actual measured reservoir characteristic values. User interaction can further include identifying threshold variables 232, defining values of threshold variables to determine simulation run termination criteria 233, and making the defined values of threshold variables and termination criteria available for a smart algorithm agent 234. Termination criteria can include, for example, tolerances, such as a simulation run termination error tolerance, a well termination error tolerance, or a simulation data values termination tolerance. In some instances, such as in some embodiments related to history matching, termination criteria can also include a predetermined number of hydrocarbon wells. Simulator action 146 can then include determining whether additional simulation runs to be performed exist 240, and, if not, completing the simulation process 243. If additional simulation runs to be performed exist 240, simulator action 146 can also include performing a simulation run to a time step 241 and determining whether the time step was the last one to be performed 242. If the time step was the last one to be performed 242, simulator action 146 can then include determining whether additional simulation runs to be performed exist 240. If the time step was not the last one to be performed 242, the smart algorithm agent can take control of the simulation process. Agent action 147 can include verifying the preselected values of threshold variables and the predetermined simulation run termination criteria 250, determining whether one or more of the termination criteria have been met 251, and, if not, returning control to the simulator to perform the simulation run to another time step 241. Termination criteria can be met 251, in the context of a history-matching simulation run, for example, when a simulation error measurement for a hydrocarbon field exceeds a predetermined simulation run termination error tolerance or, alternatively, when more than a predetermined number of hydrocarbon wells each has a simulation error measurement for the hydrocarbon well exceeding a predetermined well termination error tolerance. In the context of a prediction simulation run, however, termination criteria can be met 251 when one or more of the one or more simulation data values of the simulation data set are outside of a simulation data values termination tolerance, for example. If one or more of the termination criteria are met 251, agent action 147 can then include terminating the simulation run 252 and writing restart output 253 before returning control to the simulator. Simulator action 146 can then include wrapping up the simulation run 244, producing simulation output 245, and determining whether additional simulation runs to be performed exist 240. The steps can include, for example:

Load historical data
Investigate/interrogate historical data
Identify threshold variables
Define values of threshold variables to determine termination criteria
Make values of threshold variables and termination criteria available
    for the smart algorithm agent
For each simulation run
    start simulation run
    For each time step
        output time step information
        If not last time step
            (Agent Control)
            verify values of threshold variables and termination criteria
            If termination criteria met
                terminate simulation run
                write Restart Output
                agent output -continued

```
            (Simulator Control)
                wrap-up simulation
                simulation output
            Else
                If not last simulation case
                    Goto start simulation run
                Else
                    complete
                endif
        Else
            continue simulation run
        Endif
    Endfor
Endfor
```

An entity could have as many as 100,000 requests to conduct conventional (i.e., prediction) and history-matching hydrocarbon reservoir simulation studies in a single year. The following is a simplified exercise to show the possible savings produced by embodiments of the invention. For example, an entity could have a total number of 100,000 simulation runs in a given year. If a forty-percent (40%) savings is realized, the foreseen savings will be 100,000 simulation runs*40%, i.e., 40,000 runs. Further, if the average node hours per simulation job is 600 node-hours, the total node-hours saved will be 40,000 runs*600 node-hours, i.e., 24,000,000 node-hours saved. Assuming that four (4) 512-nodes clusters provide 17,940,480 node-hours per year, the savings in node-hours will be 24,000,000 divided by 17,940,480, i.e., 1.3 512-cluster saved. Consequently, embodiments of the invention can be a major step towards an ultimate objective of reservoir simulation engineers: being able to automatically history match a reservoir model with an optimal use of computing and storage resources, for example.

Several simulation studies were conducted to pilot test an algorithm according to embodiments of the invention. The results show a savings of fifty percent (50%) in simulation runs that would have been wastes of resources if they had continued. Furthermore, study results and decisions related to embodiments of the invention can be compared to workflows in which engineers manually identify good and bad simulation runs as part of a history-matching process. Two examples are illustrative. The first example involves fifty scoping history-matching simulation runs, as illustrated in FIG. 8a. Scoping can be part of a history-matching simulation. More specifically, a history-matching process can usually go through stages searching the solution space of a problem to find a solution (a history match). In one aspect of the solutions space, scoping runs can be "coarse" runs in the sense that they can search a larger solution space and help limit or size the solution space for a next stage: refinement. Refinement runs, in a refinement stage, can relate to only searching a limited or sized solution space as found in the previous stage (scoping) looking for a solution or solutions to the problem. In a first illustrative example, when the simulation run termination error tolerance was ten percent (10%), forty-five runs were stopped. That is, when the maximum allowable error—which can be defined by a preselected value of a threshold variable—is tight (e.g., 10%), forty-five scoping simulation runs can be stopped. As the simulation run termination error tolerance is loosened, however, the number of simulation runs to be stopped by the agent can decrease. For example, when the simulation run termination error tolerance was twenty percent (20%), thirty-two runs were stopped. When the simulation run termination error tolerance was twenty-five percent (25%), twenty-seven runs were stopped. When the simulation run termination error tolerance was thirty percent (30%), twenty-one runs were stopped. The second example involves fifty refinement history-matching simulation runs, as illustrated in FIG. 8b. In the second example, when the simulation run termination error tolerance was ten percent (10%), twenty-one runs were stopped. Similarly, as the simulation run termination error tolerance is loosened during refinement, the number of simulation runs to be stopped by the agent can decrease. For example, when the simulation run termination error tolerance was twenty percent (20%), twenty-five percent (25%), or thirty percent (30%), one run was stopped. The simulation run termination error tolerances represented in FIG. 8a and FIG. 8b can be predefined maximum allowable global errors calculated from hydrocarbon wells associated with the hydrocarbon reservoir simulation model, for example. Rerunning the study has shown that that the agent can accurately and automatically match the simulation job criteria set by the engineer, i.e., a determination of whether the run is good or otherwise acceptable and should continue or, alternatively, bad or otherwise unacceptable and should be terminated. In addition, the rerun study has identified that controlling the simulation run termination error tolerance can improve the accuracy and aggressiveness of the agent.

Figure 7:
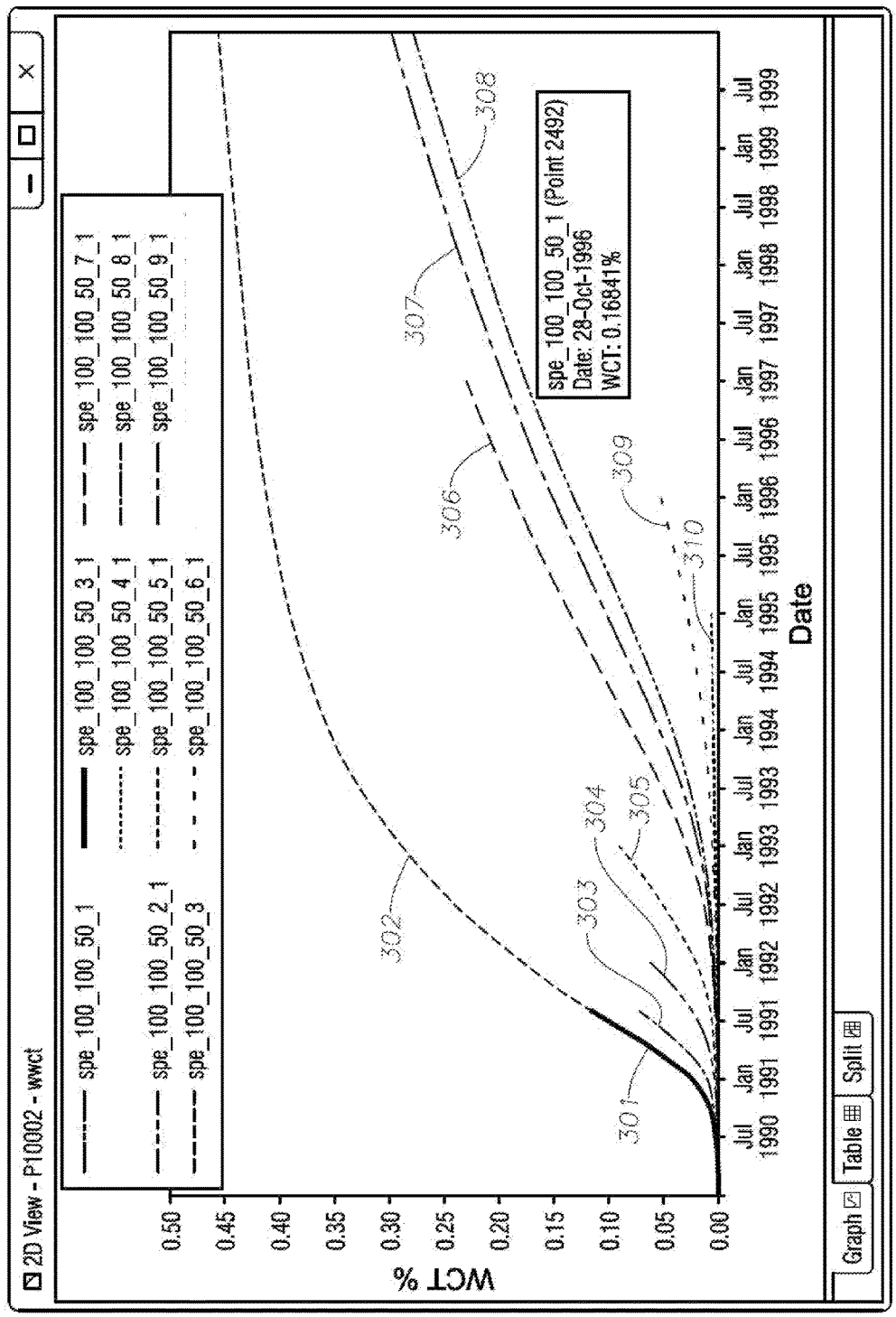
FIG. 7 is a graphical diagram of hydrocarbon reservoir simulation data according to an embodiment of the invention.

The accuracy of results produced by the agent is illustrated, for example, in FIG. 7. Water cut over time, for instance, is plotted in FIG. 7, to show how water cut results produced by a simulator can compare to historical water cut data. As illustrated, each plotted line represents output of a simulation run except line 308, which represents historical water cut data. The lines associated with the simulation runs, as illustrated, are named according to the following convention: the first three numbers represent the associated hydrocarbon reservoir simulation model size (e.g., the number of cells in the simulation model), the fourth number represents the associated simulation model configuration, and the last number (if present) represents any associated further refinements to history-matching parameters, e.g., actual measured reservoir characteristics. As depicted, the simulation runs associated with lines 303, 304, 305, 306, 309, and 310 were terminated ahead of schedule. The simulation run associated with line 307, however, was not terminated early because the simulation run associated with line 307 acceptably approximated the historical water cut data that is represented by line 308. As illustrated, line 307 is the closest line to—and closest approximation of—line 308. In addition, line 302 represents the output of a simulation run according to the prior art, and line 301 represents an example of the output of the same simulation run as line 302 according to an embodiment of the invention. That is, line 301 illustrates when the simulation run that was performed according to the prior art would have been terminated according to an embodiment of the invention. Notably, the simulation run—which was unacceptably divergent from the historical data—would have been terminated earlier according to an embodiment of the invention compared to the prior art. Moreover, terminating the simulation run earlier—as represented by line 301—would have advantageously produced a greater availability of the limited computing capacity and resources when compared to the prior art, as represented by line 302. Each of the simulation runs associated with lines 303, 304, 305, 306, 307, 309, and 310 is associated with a configuration of predefined reservoir properties—i.e., actual measured reservoir characteristics—such as permeability. In other words, each simulation run can be associated with a configuration of predefined actual measured reservoir characteristics that were previously identified and defined by a simulation engineer, for example.

Embodiments of the invention can help to better manage and optimize finite computing and storage resources. Embodiments can therefore help to reduce reservoir simulation yearly cluster growth and high-performance storage requirements for an entity. Embodiments can also improve turnaround times for multidisciplinary asset teams performing hydrocarbon reservoir studies. Embodiments can focus on identifying useful simulation runs by advantageously automatically identifying and eliminating runs very early which will be eventually be discarded by reservoir engineers.

In the various embodiments of the invention described herein, a person having ordinary skill in the art will recognize that various types of memory are readable by a computer such as the memory described herein in reference to the various computers and servers, e.g., computer, computer server, web server, or other computers with embodiments of the present invention. Examples of computer readable media include but are not limited to: nonvolatile, hard-coded type media such as read only memories (ROMs), CD-ROMs, and DVD-ROMs, or erasable, electrically programmable read only memories (EEPROMs), recordable type media such as floppy disks, hard disk drives, CD-R/RWs, DVD-RAMs, DVD-R/RWs, DVD+R/RWs, flash drives, memory sticks, and other newer types of memories, and transmission type media such as digital and analog communication links. For example, such media can include operating instructions, as well as instructions related to the systems and the method steps described above and can operate on a computer. It will be understood by those skilled in the art that such media can be at other locations instead of, or in addition to, the locations described to store computer program products, e.g., including software thereon. It will be understood by those skilled in the art that the variously the software modules or electronic components described above can be implemented and maintained by electronic hardware, software, or a combination of the two, and that such embodiments are contemplated by embodiments of the present invention.

In the drawings and specification, there have been disclosed embodiments of methods, systems, and non-transitory computer-readable medium having computer program stored therein of the present invention, and although specific terms are employed, the terms are used in a descriptive sense only and not for purposes of limitation. The embodiments of methods, systems, and non-transitory computer-readable medium having computer program stored therein of the present invention have been described in considerable detail with specific reference to these illustrated embodiments. It will be apparent, however, that various modifications and changes can be made within the spirit and scope of the embodiments of methods, systems, and non-transitory computer-readable medium having computer program stored therein of the present invention as described in the foregoing specification, and such modifications and changes are to be considered equivalents and part of this disclosure.

That claimed is:

1. A system to enhance hydrocarbon reservoir simulation for a plurality of hydrocarbon reservoirs, the system comprising:
   one or more processors collectively having a limited and predetermined combined computing capacity, the limited and predetermined combined computing capacity being available responsive to simulation run usage;
   one or more input and output units in communication with the one or more processors; and
   non-transitory memory medium in communication with one or more of the one or more processors, the memory medium having computer-readable instructions stored therein that when executed cause the system to perform the steps of:
      initiating, for each of the plurality of hydrocarbon reservoirs, each of a plurality of fluid flow simulation runs,
      calibrating, via the plurality of fluid flow simulation runs, one or more hydrocarbon reservoir simulation models associated with a respective each of the plurality of hydrocarbon reservoirs to define a plurality of history-matching simulation runs,
      operating each of the plurality of history-matching simulation runs for a respective preselected time period, each respective preselected time period including one or more time steps,
      outputting from each of the plurality of history-matching simulation runs a simulation data set responsive to operation of a respective history-matching simulation run after each of the one or more time steps, each simulation data set including one or more simulation data values, the respective each of the plurality of hydrocarbon reservoirs having a plurality of hydrocarbon wells, the plurality of hydrocarbon wells collectively defining a hydrocarbon field within the respective each of the plurality of hydrocarbon reservoirs, each of the one or more simulation data values associated with one of the plurality of hydrocarbon wells,
      terminating, for each of the plurality of hydrocarbon reservoirs, each of a first set of one or more of the plurality of history-matching simulation runs earlier than the completion of the respective preselected time period responsive to output after a time step when each of the first set of history-matching simulation runs has a simulation error measurement for the hydrocarbon field exceeding a predetermined simulation run termination error tolerance while continuing a second set of another one or more of the plurality of history-matching simulation runs each lacking a simulation error measurement for the hydrocarbon field that exceeds the predetermined simulation run termination error tolerance, the predetermined simulation run termination error tolerance comprising preselected values of one or more threshold variables, the limited and predetermined combined computing capacity having increased processing availability when the first set of history-matching simulation runs are terminated to increase processing availability for fluid flow simulation runs within the limited and predetermined combined computing capacity to another one or more fluid flow simulation runs being run and reduce total hydrocarbon reservoir simulation run time, the one or more threshold variables comprising reservoir pressure, fluids production rate, fluids injection rate, and fluids cumulative production,
      wherein the plurality of history-matching simulation runs calibrate the one or more hydrocarbon reservoir simulation models associated with the respective each of the plurality of hydrocarbon reservoirs by comparison to a plurality of actual measured reservoir characteristic values for the respective each of the plurality of hydrocarbon reservoirs, and wherein the simulation error measurement for the hydrocarbon field for a history-matching simulation run after the time step is determined responsive to a comparison of the one or more simulation data values of the simulation data set associated with the history-matching simulation run after the time step and one or more of the plurality of actual measured reservoir characteristic values for the respective each of the plurality of hydrocarbon reservoirs;

one or more databases in communication with the one or more processors, the one or more databases configured to include the plurality of actual measured reservoir characteristic values for each of the plurality of hydrocarbon reservoirs and the one or more hydrocarbon reservoir simulation models associated with each of the plurality of hydrocarbon reservoirs; the instructions in the non-transitory memory medium when executed further cause the system to perform the steps of, for each of the plurality of hydrocarbon reservoirs:

calculating, for each of the plurality of history-matching simulation runs after a time step and responsive to receipt of one or more of the plurality of actual measured reservoir characteristic values for the respective each of the plurality of hydrocarbon reservoirs from the one or more databases, one or more well difference deltas between each of the one or more simulation data values of the simulation data set associated with the time step and the one or more of the plurality of actual measured reservoir characteristic values received from the one or more databases based on a function of each of the one or more simulation data values of the simulation data set associated with the time step, each of the one or more of the plurality of actual measured reservoir characteristic values received from the one or more databases, and a predetermined well weighting factor;

summing, for each of the plurality of hydrocarbon wells, each of the one or more well difference deltas associated with the respective hydrocarbon well to determine a well simulation discrepancy value; and determining, for each of the plurality of history-matching simulation runs, a simulation error measurement for the hydrocarbon field by use of the well simulation discrepancy values for each of the plurality of hydrocarbon wells of the hydrocarbon field.

2. A system as defined in claim 1, wherein each of the second set of history-matching simulation runs operates simultaneously with another one or more of the second set of history-matching simulation runs after termination of the first set of history-matching simulation runs, wherein the plurality of history-matching simulation runs for each of the plurality of hydrocarbon reservoirs includes a predetermined number of history-matching simulation runs, wherein a sum of the predetermined numbers of history-matching simulation runs of the plurality of hydrocarbon reservoirs defines a predetermined total number of history-matching simulation runs, wherein completion of the predetermined total number of history-matching simulation runs is scheduled to require a predetermined amount of time to define a total expected completion time, and wherein termination of the first set of history-matching simulation runs for each of the plurality of hydrocarbon reservoirs causes operation of the predetermined total number of history-matching simulation runs to conclude earlier than the end of the total expected completion time.

3. A system as defined in claim 1, wherein the instructions in the non-transitory memory medium when executed further cause the system to perform the step of initiating, responsive to termination of a history-matching simulation run, another different history-matching simulation run by use of one or more of the one or more processors having increased processing availability responsive to the termination of the history-matching simulation run to enable earlier initiation of the other history-matching simulation run.

4. A system as defined in claim 1, wherein the one or more input and output units are positioned to receive as input the preselected values of one or more threshold variables and to output simulation data, wherein initiating each of the plurality of history-matching simulation runs for each of the plurality of hydrocarbon reservoirs is by use of one or more of the one or more processors and responsive to input from the one or more input and output units, wherein the system further comprises a user terminal configured to display one or more of the plurality of actual measured reservoir characteristic values to a user and to define the preselected values of one or more threshold variables responsive to user action, and wherein the instructions in the non-transitory memory medium when executed further cause the system to perform the step of receiving the preselected values of one or more threshold variables by use of one or more of the one or more input and output units from the user terminal.

5. A system as defined in claim 1, wherein each processor of the one or more processors has a limited and predetermined individual computing capacity, the limited and predetermined individual computing capacity of a processor being a fractional portion of the limited and predetermined combined computing capacity of the one or more processors defined by a mathematical function of the limited and predetermined combined computing capacity and number of the one or more processors.

6. A system to enhance hydrocarbon reservoir simulation for a plurality of hydrocarbon reservoirs, the system comprising:

one or more processors collectively having a limited and predetermined combined computing capacity, the limited and predetermined combined computing capacity being available responsive to simulation run usage;

one or more input and output units in communication with the one or more processors; and non-transitory memory medium in communication with one or more of the one or more processors, the memory medium having computer-readable instructions stored therein that when executed cause the system to perform the steps of:

initiating, for each of the plurality of hydrocarbon reservoirs, each of a plurality of fluid flow simulation runs, calibrating, via the plurality of fluid flow simulation runs, one or more hydrocarbon reservoir simulation models associated with a respective each of the plurality of hydrocarbon reservoirs to define a plurality of history-matching simulation runs, operating each of the plurality of history-matching simulation runs for a respective preselected time period, each respective preselected time period including one or more time steps, outputting from each of the plurality of history-matching simulation runs a simulation data set responsive to operation of a respective history-matching simulation run after each of the one or more time steps, each simulation data set including one or more simulation data values, the respective each of the plurality of hydrocarbon reservoirs having a plurality of hydrocarbon wells, each of the one or more simulation data values associated with one of the plurality of hydrocarbon wells, and terminating, for each of the plurality of hydrocarbon reservoirs, each of a first set of one or more of the plurality of history-matching simulation runs earlier than the completion of the respective preselected time period responsive to output after a time step when more than a predetermined number of hydrocarbon wells in each of the first set of history-matching simulation runs each has a simulation error measurement for the hydrocarbon well exceeding a predetermined well termination error tolerance while continuing a second set of another one or more of the plurality of history-matching simulation runs, each of the second set of history-matching simulation runs having fewer than the predetermined number of hydrocarbon wells that each has a simulation error measurement for the hydrocarbon well exceeding the predetermined well termination error tolerance, the predetermined number of hydrocarbon wells and the predetermined well termination error tolerance comprising preselected values of one or more threshold variables, the limited and predetermined combined computing capacity having increased processing availability when the first set of history-matching simulation runs are terminated to increase processing availability for fluid flow simulation runs within the limited and predetermined combined computing capacity to another one or more fluid flow simulation runs being run and reduce total hydrocarbon reservoir simulation run time, the one or more threshold variables comprising reservoir pressure, fluids production rate, fluids injection rate, and fluids cumulative production;

wherein the plurality of history-matching simulation runs calibrate the one or more hydrocarbon reservoir simulation models associated with the respective each of the plurality of hydrocarbon reservoirs by comparison to a plurality of actual measured reservoir characteristic values for the respective each of the plurality of hydrocarbon reservoirs, and wherein the simulation error measurement for the hydrocarbon well for a history-matching simulation run after a time step is determined responsive to a comparison of the one or more simulation data values of the simulation data set associated with the history-matching simulation run after the time step and one or more of the plurality of actual measured reservoir characteristic values for the respective each of the plurality of hydrocarbon reservoirs;

one or more databases in communication with the one or more processors, the one or more databases configured to include the plurality of actual measured reservoir characteristic values for each of the plurality of hydrocarbon reservoirs and the one or more hydrocarbon reservoir simulation models associated with each of the plurality of hydrocarbon reservoirs;

the instructions in the non-transitory memory medium when executed further cause the system to perform the steps of, for each of the plurality of hydrocarbon reservoirs:

calculating, for each of the plurality of history-matching simulation runs after a time step and responsive to receipt of one or more of the plurality of actual measured reservoir characteristic values for the respective each of the plurality of hydrocarbon reservoirs from the one or more databases, one or more well difference deltas between each of the one or more simulation data values of the simulation data set associated with the time step and the one or more of the plurality of actual measured reservoir characteristic values received from the one or more databases based on a function of each of the one or more simulation data values of the simulation data set associated with the time step, each of the one or more of the plurality of actual measured reservoir characteristic values received from the one or more databases, and a predetermined well weighting factor;

summing, for each of the plurality of hydrocarbon wells, each of the one or more well difference deltas associated with the respective hydrocarbon well to determine a well simulation discrepancy value; and determining, for each of the plurality of hydrocarbon wells in each of the plurality of history-matching simulation runs, a simulation error measurement for the hydrocarbon well by use of the well simulation discrepancy value.

7. A system as defined in claim 6, wherein each of the second set of history-matching simulation runs operates simultaneously with another one or more of the second set of history-matching simulation runs after termination of the first set of history-matching simulation runs, wherein the plurality of history-matching simulation runs for each of the plurality of hydrocarbon reservoirs includes a predetermined number of history-matching simulation runs, wherein a sum of the predetermined numbers of history-matching simulation runs of the plurality of hydrocarbon reservoirs defines a predetermined total number of history-matching simulation runs, wherein completion of the predetermined total number of history-matching simulation runs is scheduled to require a predetermined amount of time to define a total expected completion time, and wherein termination of the first set of history-matching simulation runs for each of the plurality of hydrocarbon reservoirs causes operation of the predetermined total number of history-matching simulation runs to conclude earlier than the end of the total expected completion time.

8. A system as defined in claim 6, wherein the instructions in the non-transitory memory medium when executed further cause the system to perform the step of initiating, responsive to termination of a history-matching simulation run, another different history-matching simulation run by use of one or more of the one or more processors having increased processing availability responsive to the termination of the history-matching simulation run to enable earlier initiation of the other history-matching simulation run.

9. A system as defined in claim 6, wherein the one or more input and output units are positioned to receive as input the preselected values of one or more threshold variables and to output simulation data, wherein initiating each of the plurality of history-matching simulation runs for each of the plurality of hydrocarbon reservoirs is by use of one or more of the one or more processors and responsive to input from the one or more input and output units, wherein the system further comprises a user terminal configured to display one or more of the plurality of actual measured reservoir characteristic values to a user and to define the preselected values of one or more threshold variables responsive to user action, and wherein the instructions in the non-transitory memory medium when executed further cause the system to perform the step of receiving the preselected values of one or more threshold variables by use of one or more of the one or more input and output units from the user terminal.

10. A system as defined in claim 6, wherein each processor of the one or more processors has a limited and predetermined individual computing capacity, the limited and predetermined individual computing capacity of a processor being a fractional portion of the limited and predetermined combined computing capacity of the one or more processors defined by a mathematical function of the limited and predetermined combined computing capacity and number of the one or more processors.

11. A system to enhance hydrocarbon reservoir simulation for a plurality of hydrocarbon reservoirs, the system comprising:
one or more processors collectively having a limited and predetermined combined computing capacity, the limited and predetermined combined computing capacity being available responsive to simulation run usage;
one or more input and output units in communication with the one or more processors; and
non-transitory memory medium in communication with one or more of the one or more processors, the memory medium having computer-readable instructions stored therein that when executed cause the system to perform the steps of:
initiating, for each of the plurality of hydrocarbon reservoirs, each of a plurality of fluid flow simulation runs,
predicting, via the plurality of fluid flow simulation runs, future behavior of a respective each of the plurality of hydrocarbon reservoirs to define a plurality of prediction simulation runs,
operating each of the plurality of prediction simulation runs for a respective preselected time period, each respective preselected time period including one or more time steps,
outputting each of the plurality of prediction simulation runs a simulation data set responsive to operation of a respective history-matching simulation run after each of the one or more time steps, each simulation data set including one or more simulation data values, the respective each of the plurality of hydrocarbon reservoirs having a plurality of hydrocarbon wells, each of the one or more simulation data values associated with one of the plurality of hydrocarbon wells, and
terminating, for each of the plurality of hydrocarbon reservoirs, each of a first set of one or more of the plurality of prediction simulation runs earlier than the completion of the respective preselected time period responsive to output after a time step when one or more of the one or more simulation data values of the simulation data set associated with each of the first set of prediction simulation runs after the time step are outside of a simulation data values termination tolerance while continuing a second set of another one or more of the plurality of prediction simulation runs, each of the one or more simulation data values of the simulation data set associated with each of the second set of prediction simulation runs after the time step being included within the simulation data values termination tolerance, the simulation data values termination tolerance comprising preselected values of one or more threshold variables, the limited and predetermined combined computing capacity having increased processing availability when the first set of prediction simulation runs are terminated to increase processing availability for fluid flow simulation runs within the limited and predetermined combined computing capacity to another one or more fluid flow simulation runs being run and reduce total hydrocarbon reservoir simulation run time, the one or more threshold variables comprising reservoir pressure, fluids production rate, fluids injection rate, and fluids cumulative production;
wherein the plurality of prediction simulation runs predict future behavior of the respective each of the plurality of hydrocarbon reservoirs by use of one or more hydrocarbon reservoir simulation models associated with the respective each of the plurality of hydrocarbon reservoirs, the one or more hydrocarbon reservoir models calibrated by use of a plurality of actual measured reservoir characteristic values to define one or more calibrated hydrocarbon reservoir simulation models, wherein each of the plurality of prediction simulation runs is associated with a future course of action to develop the respective each of the plurality of hydrocarbon reservoirs associated with the respective prediction simulation run to define a development strategy, and wherein the preselected values of one or more threshold variables and the simulation data values termination tolerance are associated with one or more preselected strategic outcome values of one or more development strategies;
one or more databases in communication with the one or more processors, the one or more databases configured to include the plurality of actual measured reservoir characteristic values for each of the plurality of hydrocarbon reservoirs and the one or more calibrated hydrocarbon reservoir simulation models associated with each of the plurality of hydrocarbon reservoirs;
the instructions in the non-transitory memory medium when executed further cause the system to perform the step of:
storing data representative of a terminating state of a terminated prediction simulation run, for each of the one or more terminated prediction simulation runs; and
restarting the terminated predicted simulation run responsive to the terminating state of the terminated history-matching simulation run.

12. A system as defined in claim 11, wherein each of the second set of prediction simulation runs operates simultaneously with another one or more of the second set of prediction simulation runs after termination of the first set of prediction simulation runs, wherein the plurality of prediction simulation runs for each of the plurality of hydrocarbon reservoirs includes a predetermined number of prediction simulation runs, wherein a sum of the predetermined numbers of prediction simulation runs of the plurality of hydrocarbon reservoirs defines a predetermined total number of prediction simulation runs, wherein completion of the predetermined total number of prediction simulation runs is scheduled to require a predetermined amount of time to define a total expected completion time, and wherein termination of the first set of prediction simulation runs for each of the plurality of hydrocarbon reservoirs causes operation of the predetermined total number of prediction simulation runs to conclude earlier than the end of the total expected completion time.

13. A system as defined in claim 11, wherein the one or more preselected strategic outcome values of one or more development strategies include a preselected maximum water cut measurement for one or more of the plurality of hydrocarbon reservoirs.

14. A system as defined in claim 11, wherein the one or more input and output units are positioned to receive as input the preselected values of one or more threshold variables and to output simulation data, wherein initiating each of the plurality of prediction simulation runs for each of the plurality of hydrocarbon reservoirs is by use of one or more of the one or more processors and responsive to input from the one or more input and output units, wherein the system further comprises a user terminal configured to display one or more of the plurality of actual measured reservoir characteristic values to a user and to define the preselected values of one or more threshold variables responsive to user action, and wherein the instructions in the non-transitory memory medium when executed further cause the system to perform the step of receiving the preselected values of one or more threshold variables by use of one or more of the one or more input and output units from the user terminal.

15. A system as defined in claim 11, wherein the instructions in the non-transitory memory medium when executed further cause the system to perform the step of initiating, responsive to termination of a prediction simulation run, another different prediction simulation run by use of one or more of the one or more processors having increased processing availability responsive to the termination of the prediction simulation run to enable earlier initiation of the other prediction simulation run.

16. A system as defined in claim 15, wherein each processor of the one or more processors has a limited and predetermined individual computing capacity, the limited and predetermined individual computing capacity of a processor being a fractional portion of the limited and predetermined combined computing capacity of the one or more processors defined by a mathematical function of the limited and predetermined combined computing capacity and number of the one or more processors.

17. Non-transitory computer-readable medium having one or more computer programs stored therein operable by one or more processors to enhance hydrocarbon reservoir simulation for a plurality of hydrocarbon reservoirs, the one or more computer programs comprising a set of instructions that, when executed by the one or more processors, cause the one or more processors to perform the operations of:

initiating, for each of the plurality of hydrocarbon reservoirs, each of a plurality of fluid flow simulation runs, calibrating, via the plurality of fluid flow simulation runs, one or more hydrocarbon reservoir simulation models associated with a respective each of the plurality of hydrocarbon reservoirs to define a plurality of history-matching simulation runs, operating each of the plurality of history-matching simulation runs for a respective preselected time period, each respective preselected time period including one or more time steps, outputting from each of the plurality of history-matching simulation runs a simulation data set responsive to operation of a respective history-matching simulation run after each of the one or more time steps, each simulation data set including one or more simulation data values, the respective each of the plurality of hydrocarbon reservoirs having a plurality of hydrocarbon wells, the plurality of hydrocarbon wells collectively defining a hydrocarbon field within the respective each of the plurality of hydrocarbon reservoirs, each of the one or more simulation data values associated with one of the plurality of hydrocarbon wells; and terminating, for each of the plurality of hydrocarbon reservoirs, each of a first set of one or more of the plurality of history-matching simulation runs earlier than the completion of the respective preselected time period responsive to output after a time step when each of the first set of history-matching simulation runs has a simulation error measurement for the hydrocarbon field exceeding a predetermined simulation run termination error tolerance while continuing a second set of another one or more of the plurality of history-matching simulation runs each lacking a simulation error measurement for the hydrocarbon field that exceeds the predetermined simulation run termination error tolerance, the predetermined simulation run termination error tolerance comprising preselected values of one or more threshold variables, a collective limited and predetermined combined computing capacity of the one or more processors having increased processing availability when the first set of history-matching simulation runs are terminated to increase processing availability for fluid flow simulation runs within the limited and predetermined combined computing capacity to another one or more fluid flow simulation runs being run and reduce total hydrocarbon reservoir simulation run time, the limited and predetermined combined computing capacity being available responsive to simulation run usage, the one or more threshold variables comprising reservoir pressure, fluids production rate, fluids injection rate, and fluids cumulative production, wherein the plurality of history-matching simulation runs calibrate the one or more hydrocarbon reservoir simulation models associated with the respective each of the plurality of hydrocarbon reservoirs by comparison to a plurality of actual measured reservoir characteristic values for the respective each of the plurality of hydrocarbon reservoirs, and wherein the simulation error measurement for the hydrocarbon field for a history-matching simulation run after the time step is determined responsive to a comparison of the one or more simulation data values of the simulation data set associated with the history-matching simulation run after the time step and one or more of the plurality of actual measured reservoir characteristic values for the respective each of the plurality of hydrocarbon reservoirs;

calculating, for each of the plurality of history-matching simulation runs after a time step and responsive to receipt of one or more of the plurality of actual measured reservoir characteristic values for the respective each of the plurality of hydrocarbon reservoirs, one or more well difference deltas between each of the one or more simulation data values of the simulation data set associated with the time step and the one or more of the plurality of actual measured reservoir characteristic values based on a function of each of the one or more simulation data values of the simulation data set associated with the time step, each of the one or more of the plurality of actual measured reservoir characteristic values, and a predetermined well weighting factor;

summing, for each of the plurality of hydrocarbon wells, each of the one or more well difference deltas associated with the respective hydrocarbon well to determine a well simulation discrepancy value; and determining, for each of the plurality of history-matching simulation runs, a simulation error measurement for the hydrocarbon field by use of the well simulation discrepancy values for each of the plurality of hydrocarbon wells of the hydrocarbon field.

18. Non-transitory computer-readable medium having one or more computer programs stored therein as defined in claim 17, wherein each of the second set of history-matching simulation runs operates simultaneously with another one or more of the second set of history-matching simulation runs after termination of the first set of history-matching simulation runs, wherein the plurality of history-matching simulation runs for each of the plurality of hydrocarbon reservoirs includes a predetermined number of history-matching simulation runs, wherein a sum of the predetermined numbers of history-matching simulation runs of the plurality of hydrocarbon reservoirs defines a predetermined total number of history-matching simulation runs, wherein completion of the predetermined total number of history-matching simulation runs is scheduled to require a predetermined amount of time to define a total expected completion time, and wherein termination of the first set of history-matching simulation runs for each of the plurality of hydrocarbon reservoirs causes operation of the predetermined total number of history-matching simulation runs to conclude earlier than the end of the total expected completion time.

19. Non-transitory computer-readable medium having one or more computer programs stored therein as defined in claim 17, wherein the set of instructions, when executed by the one or more processors, further cause the one or more processors to perform the operation of initiating, responsive to termination of a history-matching simulation run, another different history-matching simulation run by use of one or more of the one or more processors having increased processing availability responsive to the termination of the history-matching simulation run to enable earlier initiation of the other history-matching simulation run.

20. Non-transitory computer-readable medium having one or more computer programs stored therein as defined in claim 17, wherein the set of instructions, when executed by the one or more processors, further cause the one or more processors to perform the operation of receiving the preselected values of one or more threshold variables responsive to user input.

21. Non-transitory computer-readable medium having one or more computer programs stored therein as defined in claim 17, wherein each processor of the one or more processors has a limited and predetermined individual computing capacity, the limited and predetermined individual computing capacity of a processor being a fractional portion of the limited and predetermined combined computing capacity of the one or more processors defined by a mathematical function of the limited and predetermined combined computing capacity and number of the one or more processors.

22. Non-transitory computer-readable medium having one or more computer programs stored therein operable by one or more processors to enhance hydrocarbon reservoir simulation for a plurality of hydrocarbon reservoirs, the one or more computer programs comprising a set of instructions that, when executed by the one or more processors, cause the one or more processors to perform the operations of:

initiating, for each of the plurality of hydrocarbon reservoirs, each of a plurality of fluid flow simulation runs, calibrating, via the plurality of fluid flow simulation runs, one or more hydrocarbon reservoir simulation models associated with a respective each of the plurality of hydrocarbon reservoirs to define a plurality of history-matching simulation runs, operating each of the plurality of history-matching simulation runs for a respective preselected time period, each respective preselected time period including one or more time steps, outputting from each of the plurality of history-matching simulation runs a simulation data set responsive to operation of a respective history-matching simulation run after each of the one or more time steps, each simulation data set including one or more simulation data values, the respective each of the plurality of hydrocarbon reservoirs having a plurality of hydrocarbon wells, each of the one or more simulation data values associated with one of the plurality of hydrocarbon wells; and terminating, for each of the plurality of hydrocarbon reservoirs, each of a first set of one or more of the plurality of history-matching simulation runs earlier than the completion of the respective preselected time period responsive to output after a time step when more than a predetermined number of hydrocarbon wells in each of the first set of history-matching simulation runs each has a simulation error measurement for the hydrocarbon well exceeding a predetermined well termination error tolerance while continuing a second set of another one or more of the plurality of history-matching simulation runs, each of the second set of history-matching simulation runs having fewer than the predetermined number of hydrocarbon wells that each has a simulation error measurement for the hydrocarbon well exceeding the predetermined well termination error tolerance, the predetermined number of hydrocarbon wells and the predetermined well termination error tolerance comprising preselected values of one or more threshold variables, a collective limited and predetermined combined computing capacity of the one or more processors having increased processing availability when the first set of history-matching simulation runs are terminated to increase processing availability for fluid flow simulation runs within the limited and predetermined combined computing capacity to another one or more fluid flow simulation runs being run and reduce total hydrocarbon reservoir simulation run time, the limited and predetermined combined computing capacity being available responsive to simulation run usage, the one or more threshold variables comprising reservoir pressure, fluids production rate, fluids injection rate, and fluids cumulative production, wherein the plurality of history-matching simulation runs calibrate the one or more hydrocarbon reservoir simulation models associated with the respective each of the plurality of hydrocarbon reservoirs by comparison to a plurality of actual measured reservoir characteristic values for the respective each of the plurality of hydrocarbon reservoirs, and wherein the simulation error measurement for the hydrocarbon well for a history-matching simulation run after a time step is determined responsive to a comparison of the one or more simulation data values of the simulation data set associated with the history-matching simulation run after the time step and one or more of the plurality of actual measured reservoir characteristic values for the respective each of the plurality of hydrocarbon reservoirs;

calculating, for each of the plurality of history-matching simulation runs after a time step and responsive to receipt of one or more of the plurality of actual measured reservoir characteristic values for the respective each of the plurality of hydrocarbon reservoirs, one or more well difference deltas between each of the one or more simulation data values of the simulation data set associated with the time step and the one or more of the plurality of actual measured reservoir characteristic values based on a function of each of the one or more simulation data values of the simulation data set associated with the time step, each of the one or more of the plurality of actual measured reservoir characteristic values, and a predetermined well weighting factor;

summing, for each of the plurality of hydrocarbon wells, each of the one or more well difference deltas associated with the respective hydrocarbon well to determine a well simulation discrepancy value; and determining, for each of the plurality of hydrocarbon wells in each of the plurality of history-matching simulation runs, a simulation error measurement for the hydrocarbon well by use of the well simulation discrepancy value.

23. Non-transitory computer-readable medium having one or more computer programs stored therein as defined in claim 22, wherein each of the second set of history-matching simulation runs operates simultaneously with another one or more of the second set of history-matching simulation runs after termination of the first set of history-matching simulation runs, wherein the plurality of history-matching simulation runs for each of the plurality of hydrocarbon reservoirs includes a predetermined number of history-matching simulation runs, wherein a sum of the predetermined numbers of history-matching simulation runs of the plurality of hydrocarbon reservoirs defines a predetermined total number of history-matching simulation runs, wherein completion of the predetermined total number of history-matching simulation runs is scheduled to require a predetermined amount of time to define a total expected completion time, and wherein termination of the first set of history-matching simulation runs for each of the plurality of hydrocarbon reservoirs causes operation of the predetermined total number of history-matching simulation runs to conclude earlier than the end of the total expected completion time.

24. Non-transitory computer-readable medium having one or more computer programs stored therein as defined in claim 22, wherein the set of instructions, when executed by the one or more processors, further cause the one or more processors to perform the operation of initiating, responsive to termination of a history-matching simulation run, another different history-matching simulation run by use of one or more of the one or more processors having increased processing availability responsive to the termination of the history-matching simulation run to enable earlier initiation of the other history-matching simulation run.

25. Non-transitory computer-readable medium having one or more computer programs stored therein as defined in claim 22, wherein the set of instructions, when executed by the one or more processors, further cause the one or more processors to perform the operation of receiving the preselected values of one or more threshold variables responsive to user input.

26. Non-transitory computer-readable medium having one or more computer programs stored therein as defined in claim 22, wherein each processor of the one or more processors has a limited and predetermined individual computing capacity, the limited and predetermined individual computing capacity of a processor being a fractional portion of the limited and predetermined combined computing capacity of the one or more processors defined by a mathematical function of the limited and predetermined combined computing capacity and number of the one or more processors.

27. Non-transitory computer-readable medium having one or more computer programs stored therein operable by one or more processors to enhance hydrocarbon reservoir simulation for a plurality of hydrocarbon reservoirs, the one or more computer programs comprising a set of instructions that, when executed by the one or more processors, cause the one or more processors to perform the operations of:

initiating, for each of the plurality of hydrocarbon reservoirs, each of a plurality of fluid flow simulation runs, predicting, via the plurality of fluid flow simulation runs, future behavior of a respective each of the plurality of hydrocarbon reservoirs to define a plurality of prediction simulation runs, operating each of the plurality of prediction simulation runs for a respective preselected time period, each respective preselected time period including one or more time steps, outputting from each of the plurality of prediction simulation runs a simulation data set responsive to operation of a respective history-matching simulation run after each of the one or more time steps, each simulation data set including one or more simulation data values, the respective each of the plurality of hydrocarbon reservoirs having a plurality of hydrocarbon wells, each of the one or more simulation data values associated with one of the plurality of hydrocarbon wells; and terminating, for each of the plurality of hydrocarbon reservoirs, each of a first set of one or more of the plurality of prediction simulation runs earlier than the completion of the respective preselected time period responsive to output after a time step when one or more of the one or more simulation data values of the simulation data set associated with each of the first set of prediction simulation runs after the time step are outside of a simulation data values termination tolerance while continuing a second set of another one or more of the plurality of prediction simulation runs, each of the one or more simulation data values of the simulation data set associated with each of the second set of prediction simulation runs after the time step being included within the simulation data values termination tolerance, the simulation data values termination tolerance comprising preselected values of one or more threshold variables, a collective limited and predetermined combined computing capacity of the one or more processors having increased processing availability when the first set of prediction simulation runs are terminated to increase processing availability for fluid flow simulation runs within the limited and predetermined combined computing capacity to another one or more fluid flow simulation runs being run and reduce total hydrocarbon reservoir simulation run time, the limited and predetermined combined computing capacity being available responsive to simulation run usage, the one or more threshold variables comprising reservoir pressure, fluids production rate, fluids injection rate, and fluids cumulative production, wherein the plurality of prediction simulation runs predict future behavior of the respective each of the plurality of hydrocarbon reservoirs by use of one or more hydrocarbon reservoir simulation models associated with the respective each of the plurality of hydrocarbon reservoirs, the one or more hydrocarbon reservoir models calibrated by use of a plurality of actual measured reservoir characteristic values to define one or more calibrated hydrocarbon reservoir simulation models, wherein each of the plurality of prediction simulation runs is associated with a future course of action to develop the respective each of the plurality of hydrocarbon reservoirs associated with the respective prediction simulation run to define a development strategy, and wherein the preselected values of one or more threshold variables and the simulation data values termination tolerance are associated with one or more preselected strategic outcome values of one or more development strategies;

storing data representative of a terminating state of a terminated prediction simulation run, for each of the one or more terminated prediction simulation runs; and restarting the terminated predicted simulation run responsive to the terminating state of the terminated history-matching simulation run.

28. Non-transitory computer-readable medium having one or more computer programs stored therein as defined in claim 27, wherein each of the second set of prediction simulation runs operates simultaneously with another one or more of the second set of prediction simulation runs after termination of the first set of prediction simulation runs, wherein the plurality of prediction simulation runs for each of the plurality of hydrocarbon reservoirs includes a predetermined number of prediction simulation runs, wherein a sum of the predetermined numbers of prediction simulation runs of the plurality of hydrocarbon reservoirs defines a predetermined total number of prediction simulation runs, wherein completion of the predetermined total number of prediction simulation runs is scheduled to require a predetermined amount of time to define a total expected completion time, and wherein termination of the first set of prediction simulation runs for each of the plurality of hydrocarbon reservoirs causes operation of the predetermined total number of prediction simulation runs to conclude earlier than the end of the total expected completion time.

29. Non-transitory computer-readable medium having one or more computer programs stored therein as defined in claim 27, wherein the one or more preselected strategic outcome values of one or more development strategies include a preselected maximum water cut measurement for one or more of the plurality of hydrocarbon reservoirs.

30. Non-transitory computer-readable medium having one or more computer programs stored therein as defined in claim 27, wherein the set of instructions, when executed by the one or more processors, further cause the one or more processors to perform the operation of receiving the preselected values of one or more threshold variables responsive to user input.

31. Non-transitory computer-readable medium having one or more computer programs stored therein as defined in claim 27, wherein the set of instructions, when executed by the one or more processors, further cause the one or more processors to perform the operation of initiating, responsive to termination of a prediction simulation run, another different prediction simulation run by use of one or more of the one or more processors having increased processing availability responsive to the termination of the prediction simulation run to enable earlier initiation of the other prediction simulation run.

32. Non-transitory computer-readable medium having one or more computer programs stored therein as defined in claim 31, wherein each processor of the one or more processors has a limited and predetermined individual computing capacity, the limited and predetermined individual computing capacity of a processor being a fractional portion of the limited and predetermined combined computing capacity of the one or more processors defined by a mathematical function of the limited and predetermined combined computing capacity and number of the one or more processors.

33. A computer-implemented method to enhance hydrocarbon reservoir simulation for a plurality of hydrocarbon reservoirs, the method comprising:

initiating, for each of the plurality of hydrocarbon reservoirs, each of a plurality of fluid flow simulation runs, calibrating, via the plurality of fluid flow simulation runs, one or more hydrocarbon reservoir simulation models associated with a respective each of the plurality of hydrocarbon reservoirs to define a plurality of history-matching simulation runs, operating each of the plurality of history-matching simulation runs for a respective preselected time period, each respective preselected time period including one or more time steps, outputting from each of the plurality of history-matching simulation runs a simulation data set responsive to operation of a respective history-matching simulation run after each of the one or more time steps, each simulation data set including one or more simulation data values, the respective each of the plurality of hydrocarbon reservoirs having a plurality of hydrocarbon wells, the plurality of hydrocarbon wells collectively defining a hydrocarbon field within the respective each of the plurality of hydrocarbon reservoirs, each of the one or more simulation data values associated with one of the plurality of hydrocarbon wells; and terminating, for each of the plurality of hydrocarbon reservoirs, each of a first set of one or more of the plurality of history-matching simulation runs earlier than the completion of the respective preselected time period responsive to output after a time step when each of the first set of history-matching simulation runs has a simulation error measurement for the hydrocarbon field exceeding a predetermined simulation run termination error tolerance while continuing a second set of another one or more of the plurality of history-matching simulation runs each lacking a simulation error measurement for the hydrocarbon field that exceeds the predetermined simulation run termination error tolerance, the predetermined simulation run termination error tolerance comprising preselected values of one or more threshold variables, a collective limited and predetermined combined computing capacity of one or more processors having increased processing availability when the first set of history-matching simulation runs are terminated to increase processing availability for fluid flow simulation runs within the limited and predetermined combined computing capacity to another one or more fluid flow simulation runs being run and reduce total hydrocarbon reservoir simulation run time, the limited and predetermined combined computing capacity being available responsive to simulation run usage, the one or more threshold variables comprising reservoir pressure, fluids production rate, fluids injection rate, and fluids cumulative production, wherein the plurality of history-matching simulation runs calibrate the one or more hydrocarbon reservoir simulation models associated with the respective each of the plurality of hydrocarbon reservoirs by comparison to a plurality of actual measured reservoir characteristic values for the respective each of the plurality of hydrocarbon reservoirs, and wherein the simulation error measurement for the hydrocarbon field for a history-matching simulation run after the time step is determined responsive to a comparison of the one or more simulation data values of the simulation data set associated with the history-matching simulation run after the time step and one or more of the plurality of actual measured reservoir characteristic values for the respective each of the plurality of hydrocarbon reservoirs;

calculating, for each of the plurality of history-matching simulation runs after a time step and responsive to receipt of one or more of the plurality of actual measured reservoir characteristic values for the respective each of the plurality of hydrocarbon reservoirs, one or more well difference deltas between each of the one or more simulation data values of the simulation data set associated with the time step and the one or more of the plurality of actual measured reservoir characteristic values based on a function of each of the one or more simulation data values of the simulation data set associated with the time step, each of the one or more of the plurality of actual measured reservoir characteristic values, and a predetermined well weighting factor;

summing, for each of the plurality of hydrocarbon wells, each of the one or more well difference deltas associated with the respective hydrocarbon well to determine a well simulation discrepancy value; and determining, for each of the plurality of history-matching simulation runs, a simulation error measurement for the hydrocarbon field by use of the well simulation discrepancy values for each of the plurality of hydrocarbon wells of the hydrocarbon field.

34. A computer-implemented method as defined in claim 33, wherein each of the second set of history-matching simulation runs operates simultaneously with another one or more of the second set of history-matching simulation runs after termination of the first set of history-matching simulation runs, wherein the plurality of history-matching simulation runs for each of the plurality of hydrocarbon reservoirs includes a predetermined number of history-matching simulation runs, wherein a sum of the predetermined numbers of history-matching simulation runs of the plurality of hydrocarbon reservoirs defines a predetermined total number of history-matching simulation runs, wherein completion of the predetermined total number of history-matching simulation runs is scheduled to require a predetermined amount of time to define a total expected completion time, and wherein termination of the first set of history-matching simulation runs for each of the plurality of hydrocarbon reservoirs causes operation of the predetermined total number of history-matching simulation runs to conclude earlier than the end of the total expected completion time.

35. A computer-implemented method as defined in claim 33, wherein the method further comprises initiating, responsive to termination of a history-matching simulation run, another different history-matching simulation run by use of one or more of the one or more processors having increased processing availability responsive to the termination of the history-matching simulation run to enable earlier initiation of the other history-matching simulation run.

36. A computer-implemented method as defined in claim 33, wherein the method further comprises receiving the preselected values of one or more threshold variables responsive to user input.

37. A computer-implemented method as defined in claim 33, wherein each processor of the one or more processors has a limited and predetermined individual computing capacity, the limited and predetermined individual computing capacity of a processor being a fractional portion of the limited and predetermined combined computing capacity of the one or more processors defined by a mathematical function of the limited and predetermined combined computing capacity and number of the one or more processors.

38. A computer-implemented method to enhance hydrocarbon reservoir simulation for a plurality of hydrocarbon reservoirs, the method comprising:

initiating, for each of the plurality of hydrocarbon reservoirs, each of a plurality of fluid flow simulation runs, calibrating, via the plurality of fluid flow simulation runs, one or more hydrocarbon reservoir simulation models associated with a respective each of the plurality of hydrocarbon reservoirs to define a plurality of history-matching simulation runs, operating each of the plurality of history-matching simulation runs for a respective preselected time period, each respective preselected time period including one or more time steps, outputting from each of the plurality of history-matching simulation runs a simulation data set responsive to operation of a respective history-matching simulation run after each of the one or more time steps, each simulation data set including one or more simulation data values, the respective each of the plurality of hydrocarbon reservoirs having a plurality of hydrocarbon wells, each of the one or more simulation data values associated with one of the plurality of hydrocarbon wells; and terminating, for each of the plurality of hydrocarbon reservoirs, each of a first set of one or more of the plurality of history-matching simulation runs earlier than the completion of the respective preselected time period responsive to output after a time step when more than a predetermined number of hydrocarbon wells in each of the first set of history-matching simulation runs each has a simulation error measurement for the hydrocarbon well exceeding a predetermined well termination error tolerance while continuing a second set of another one or more of the plurality of history-matching simulation runs, each of the second set of history-matching simulation runs having fewer than the predetermined number of hydrocarbon wells that each has a simulation error measurement for the hydrocarbon well exceeding the predetermined well termination error tolerance, the predetermined number of hydrocarbon wells and the predetermined well termination error tolerance comprising preselected values of one or more threshold variables, a collective limited and predetermined combined computing capacity of one or more processors having increased processing availability when the first set of history-matching simulation runs are terminated to increase processing availability for fluid flow simulation runs within the limited and predetermined combined computing capacity to another one or more fluid flow simulation runs being run and reduce total hydrocarbon reservoir simulation run time, the limited and predetermined combined computing capacity being available responsive to simulation run usage, the one or more threshold variables comprising reservoir pressure, fluids production rate, fluids injection rate, and fluids cumulative production, wherein the plurality of history-matching simulation runs calibrate the one or more hydrocarbon reservoir simulation models associated with the respective each of the plurality of hydrocarbon reservoirs by comparison to a plurality of actual measured reservoir characteristic values for the respective each of the plurality of hydrocarbon reservoirs, and wherein the simulation error measurement for the hydrocarbon well for a history-matching simulation run after a time step is determined responsive to a comparison of the one or more simulation data values of the simulation data set associated with the history-matching simulation run after the time step and one or more of the plurality of actual measured reservoir characteristic values for the respective each of the plurality of hydrocarbon reservoirs;

calculating, for each of the plurality of history-matching simulation runs after a time step and responsive to receipt of one or more of the plurality of actual measured reservoir characteristic values for the respective each of the plurality of hydrocarbon reservoirs, one or more well difference deltas between each of the one or more simulation data values of the simulation data set associated with the time step and the one or more of the plurality of actual measured reservoir characteristic values based on a function of each of the one or more simulation data values of the simulation data set associated with the time step, each of the one or more of the plurality of actual measured reservoir characteristic values, and a predetermined well weighting factor;

summing, for each of the plurality of hydrocarbon wells, each of the one or more well difference deltas associated with the respective hydrocarbon well to determine a well simulation discrepancy value; and determining, for each of the plurality of hydrocarbon wells, a simulation error measurement for the hydrocarbon well by use of the well simulation discrepancy value.

39. A computer-implemented method as defined in claim 38, wherein each of the second set of history-matching simulation runs operates simultaneously with another one or more of the second set of history-matching simulation runs after termination of the first set of history-matching simulation runs, wherein the plurality of history-matching simulation runs for each of the plurality of hydrocarbon reservoirs includes a predetermined number of history-matching simulation runs, wherein a sum of the predetermined numbers of history-matching simulation runs of the plurality of hydrocarbon reservoirs defines a predetermined total number of history-matching simulation runs, wherein completion of the predetermined total number of history-matching simulation runs is scheduled to require a predetermined amount of time to define a total expected completion time, and wherein termination of the first set of history-matching simulation runs for each of the plurality of hydrocarbon reservoirs causes operation of the predetermined total number of history-matching simulation runs to conclude earlier than the end of the total expected completion time.

40. A computer-implemented method as defined in claim 38, wherein the method further comprises initiating, responsive to termination of a history-matching simulation run, another different history-matching simulation run by use of one or more of the one or more processors having increased processing availability responsive to the termination of the history-matching simulation run to enable earlier initiation of the other history-matching simulation run.

41. A computer-implemented method as defined in claim 38, wherein the method further comprises receiving the preselected values of one or more threshold variables responsive to user input.

42. A computer-implemented method as defined in claim 38, wherein each processor of the one or more processors has a limited and predetermined individual computing capacity, the limited and predetermined individual computing capacity of a processor being a fractional portion of the limited and predetermined combined computing capacity of the one or more processors defined by a mathematical function of the limited and predetermined combined computing capacity and number of the one or more processors.

43. A computer-implemented method to enhance hydrocarbon reservoir simulation for a plurality of hydrocarbon reservoirs, the method comprising:

initiating, for each of the plurality of hydrocarbon reservoirs, each of a plurality of fluid flow simulation runs, predicting, via the plurality of fluid flow simulation runs, future behavior of a respective each of the plurality of hydrocarbon reservoirs to define a plurality of prediction simulation runs, operating each of the plurality of prediction simulation runs for a respective preselected time period, each respective preselected time period including one or more time steps, outputting from each of the plurality of prediction simulation runs also a simulation data set responsive to operation of a respective history-matching simulation run after each of the one or more time steps, each simulation data set including one or more simulation data values, the respective each of the plurality of hydrocarbon reservoirs having a plurality of hydrocarbon wells, each of the one or more simulation data values associated with one of the plurality of hydrocarbon wells; and terminating, for each of the plurality of hydrocarbon reservoirs, each of a first set of one or more of the plurality of prediction simulation runs earlier than the completion of the respective preselected time period responsive to output after a time step when one or more of the one or more simulation data values of the simulation data set associated with each of the first set of prediction simulation runs after the time step are outside of a simulation data values termination tolerance while continuing a second set of another one or more of the plurality of prediction simulation runs, each of the one or more simulation data values of the simulation data set associated with each of the second set of prediction simulation runs after the time step being included within the simulation data values termination tolerance, the simulation data values termination tolerance comprising preselected values of one or more threshold variables, a collective limited and predetermined combined computing capacity of one or more processors having increased processing availability when the first set of prediction simulation runs are terminated to increase processing availability for fluid flow simulation runs within the limited and predetermined combined computing capacity to another one or more fluid flow simulation runs being run and reduce total hydrocarbon reservoir simulation run time, the limited and predetermined combined computing capacity being available responsive to simulation run usage, the one or more threshold variables comprising reservoir pressure, fluids production rate, fluids injection rate, and fluids cumulative production, wherein the plurality of prediction simulation runs predict future behavior of the respective each of the plurality of hydrocarbon reservoirs by use of one or more hydrocarbon reservoir simulation models associated with the respective each of the plurality of hydrocarbon reservoirs, the one or more hydrocarbon reservoir models calibrated by use of a plurality of actual measured reservoir characteristic values to thereby define one or more calibrated hydrocarbon reservoir simulation models, wherein each of the plurality of prediction simulation runs is associated with a future course of action to develop the respective each of the plurality of hydrocarbon reservoirs associated with the respective prediction simulation run to define a development strategy, and wherein the preselected values of one or more threshold variables and the simulation data values termination tolerance are associated with one or more preselected strategic outcome values of one or more development strategies;

storing data representative of a terminating state of a terminated prediction simulation run, for each of the one or more terminated prediction simulation runs; and restarting the terminated predicted simulation run responsive to the terminating state of the terminated history-matching simulation run.

44. A computer-implemented method as defined in claim 43, wherein each of the second set of prediction simulation runs operates simultaneously with another one or more of the second set of prediction simulation runs after termination of the first set of prediction simulation runs, wherein the plurality of prediction simulation runs for each of the plurality of hydrocarbon reservoirs includes a predetermined number of prediction simulation runs, wherein a sum of the predetermined numbers of prediction simulation runs of the plurality of hydrocarbon reservoirs defines a predetermined total number of prediction simulation runs, wherein completion of the predetermined total number of prediction simulation runs is scheduled to require a predetermined amount of time to define a total expected completion time, and wherein termination of the first set of prediction simulation runs for each of the plurality of hydrocarbon reservoirs causes operation of the predetermined total number of prediction simulation runs to conclude earlier than the end of the total expected completion time.

45. A computer-implemented method as defined in claim 43, wherein the one or more preselected strategic outcome values of one or more development strategies include a preselected maximum water cut measurement for one or more of the plurality of hydrocarbon reservoirs.

46. A computer-implemented method as defined in claim 43, wherein the method further comprises receiving the preselected values of one or more threshold variables responsive to user input.

47. A computer-implemented method as defined in claim 43, wherein the method further comprises initiating, responsive to termination of a prediction simulation run, another different prediction simulation run by use of one or more of the one or more processors having increased processing availability responsive to the termination of the prediction simulation run to enable earlier initiation of the other prediction simulation run.

48. A computer-implemented method as defined in claim 47, wherein each processor of the one or more processors has a limited and predetermined individual computing capacity, the limited and predetermined individual computing capacity of a processor being a fractional portion of the limited and predetermined combined computing capacity of the one or more processors defined by a mathematical function of the limited and predetermined combined computing capacity and number of the one or more processors.

* * * * *